(12) United States Patent
Ode et al.

(10) Patent No.: US 7,551,687 B2
(45) Date of Patent: *Jun. 23, 2009

(54) DISTORTION COMPENSATING APPARATUS

(75) Inventors: Takayoshi Ode, Kawasaki (JP);
Yasuyuki Oishi, Kawasaki (JP); Tokuro Kubo, Kawasaki (JP); Kazuo Nagatani, Kawasaki (JP); Hajime Hamada, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 422 days.

This patent is subject to a terminal disclaimer.

(21) Appl. No.: 11/149,730

(22) Filed: Jun. 10, 2005

(65) Prior Publication Data

US 2005/0226346 A1 Oct. 13, 2005

Related U.S. Application Data

(63) Continuation of application No. 09/737,196, filed on Dec. 14, 2000, now Pat. No. 7,012,969.

(30) Foreign Application Priority Data

Dec. 28, 1999 (JP) .................................. 11-372885
Mar. 31, 2000 (JP) .............................. 2000-097092

(51) Int. Cl.
*H04K 1/02* (2006.01)
(52) U.S. Cl. ........................ 375/296; 375/295; 375/285; 375/297; 455/450; 455/126; 330/149; 330/151
(58) Field of Classification Search ................. 375/296, 375/295, 219, 297, 285; 455/234, 126, 450; 330/149, 151
See application file for complete search history.

(56) References Cited

U.S. PATENT DOCUMENTS 5,699,383 A 12/1997 Ichiyoshi (Continued)

FOREIGN PATENT DOCUMENTS

JP 8242263 9/1996

(Continued)

OTHER PUBLICATIONS

Notification of Reason(s) for Refusal dated Dec. 11, 2007, for corresponding Japanese Patent Application JP 2000-097092.

*Primary Examiner*—Chieh M Fan
*Assistant Examiner*—Eva Puente
(74) *Attorney, Agent, or Firm*—Katten Muchin Rosenman LLP

(57) ABSTRACT

A distortion compensating apparatus for correcting the size of a distortion compensation coefficient in such a manner that a transmit signal that has undergone distortion compensation will not exceed the dynamic range of a DA converter. Specifically, before a distortion compensation coefficient $h_{n+1}(p)$ that has been calculated by a calculation unit is stored in a coefficient memory, an assumption is made that distortion compensation will be performed using the distortion compensation coefficient $h_{n+1}(p)$. Then it is determined beforehand whether a signal $x(t)*h_{n+1}(p)$ that will be obtained by this distortion compensation will exceed the limit of a DA converter. If the limit will be exceeded, the size of the distortion compensation coefficient is reduced by a correction unit, the corrected distortion compensation coefficient is stored in the memory and the transmit signal is corrected using the stored distortion compensation coefficient.

9 Claims, 44 Drawing Sheets

U.S. PATENT DOCUMENTS

| | | |
|---|---|---|
| 6,167,273 A | 12/2000 | Mandyam |
| 6,201,490 B1 | 3/2001 | Kawano et al. |
| 6,212,378 B1 | 4/2001 | Wismer |
| 6,230,031 B1 | 5/2001 | Barber |
| 6,400,774 B1 | 6/2002 | Matsuoka et al. |

FOREIGN PATENT DOCUMENTS

| | | |
|---|---|---|
| JP | 9064780 | 3/1997 |
| JP | 10322137 | 12/1998 |

FIG. 14
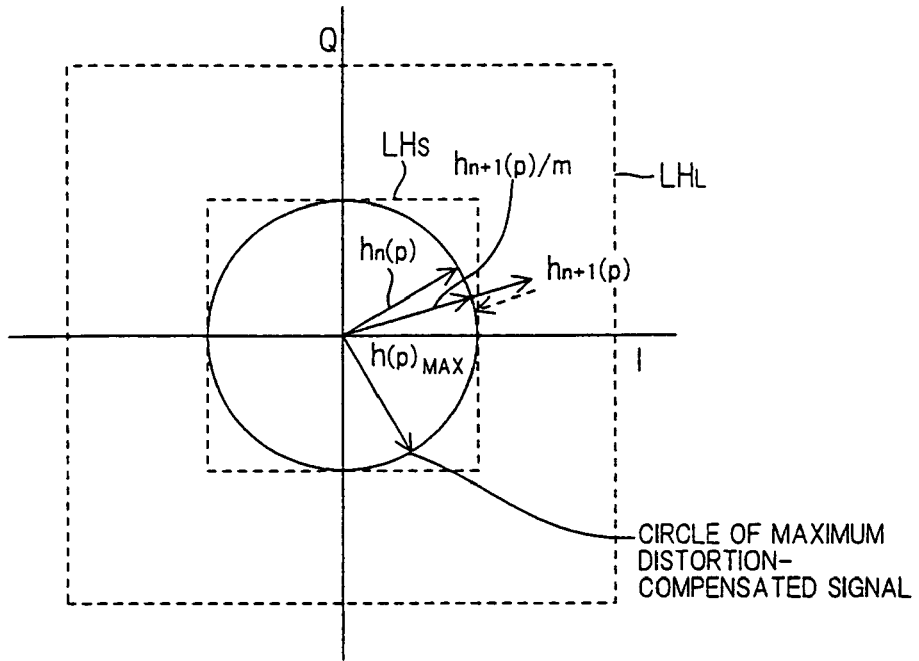
FIG. 19
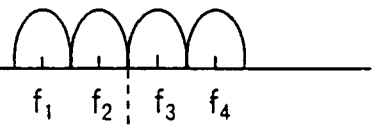
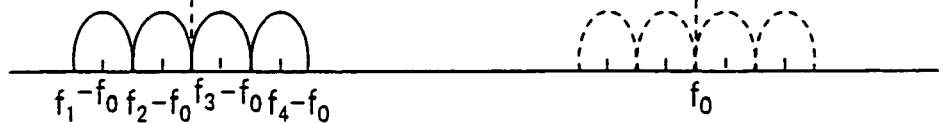

DISTORTION COMPENSATING APPARATUS

CROSS-REFERENCE TO RELATED APPLICATIONS

This application is a continuation of U.S. application Ser. No. 09/737,196 filed on Dec. 14, 2000 now U.S. Pat. No. 7,012,969, and claims priority under 35 USC 119 from Japanese Patent Applications 2000-097092 filed Mar. 31, 2000 and 11-372885 filed Dec. 28, 1999, the contents of which are herein wholly incorporated by reference.

BACKGROUND OF THE INVENTION

This invention relates to a distortion compensating apparatus and, more particularly, to (1) a distortion compensating apparatus capable of limiting amplitude when it appears that control which exceeds output limits will be carried out and capable also of exercising a phase tracking operation even when amplitude has been limited, and (2) a distortion compensating apparatus so adapted that the amplitude of a signal fed back from a transmission power amplifier is controlled so that a limit value will not be exceeded, and so adapted that distortion can be compensated for in stable fashion.

Frequency resources have become tight in recent years and in wireless communications there is growing use of high-efficiency transmission using digital techniques. In instances where multilevel amplitude modulation is applied to wireless communications, a vital technique is one which can suppress non-linear distortion by linearizing the amplitude characteristic of the power amplifier on the transmitting side and reduce the leakage of power between adjacent channels. Also essential is a technique which compensates for the occurrence of distortion that arises when a attempt is made to improve power efficiency by using an amplifier that exhibits poor linearity.

FIG. 45 is a block diagram illustrating an example of a transmitting apparatus in a radio according to the prior art. Here a transmit-signal generator 1 transmits a serial digital data sequence and a serial/parallel (S/P) converter 2 divides the digital data sequence alternately one bit at a time to convert the data to two sequences, namely an in-phase component signal (also referred to as an "I signal") and a quadrature component signal (also referred to as a "Q signal"). A DA converter 3 converts the I and Q signals to respective analog baseband signals and inputs these to a quadrature modulator 4. The latter multiplies the input I and Q signals (the transmit baseband signals) by a reference carrier wave and a signal that has been phase-shifted relative to the reference carrier by 90° and sums the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into the atmosphere from an antenna 7.

In mobile communications based upon W-CDMA and PDC (Personal Digital Cellular) techniques, etc., the transmission power of the transmitting apparatus is a high 10 mW to several watts, and the input/output characteristic [distortion function f(p)] of the transmission power amplifier is non-linear, as indicated by the dotted line in FIG. 46A. Non-linear distortion arises as a result of non-linear characteristics, and the frequency spectrum in the vicinity of a transmission frequency $f_0$ develops side lobes, as shown in FIG. 46B, leakage into the adjacent channel occurs and this causes interference between adjacent channels. More specifically, owing to non-linear distortion, there is an excessive increase in power that causes transmitted waves to leak into the adjacent frequency channel, as shown in FIG. 46B. The leakage power is described on the basis of ACPR (Adjacent Channel Power Ratio). ACPR is the ratio between the power of the channel of interest, which is the area of the spectrum between the one-dot chain lines A and A' in FIG. 46B, and the adjacent leakage power, which is the area of the spectrum between the two-dot chain lines B and B', that flows into the adjacent channel. Such leakage power constitutes noise in other channels and degrades the quality of communication of these channels. Such leakage must be limited to the utmost degree.

Leakage power is small in the linear region (see FIG. 46A) of the power amplifier and large in the non-linear region. Accordingly, it is necessary to broaden the linear region in order to obtain a transmission power amplifier having a high output. However, this necessitates an amplifier having a performance higher than that actually needed and therefore is inconvenient in terms of cost and apparatus size.

With an ordinary amplifier, power added efficiency in the linear region is low, as indicated by FIG. 47. Power load efficiency, which is the percentage (%) of the difference (Pout−Pin) between output power Pout and input power Pin with respect to the rated power of the amplifier, is the portion given off as heat. To obtain the necessary transmission power, therefore, it is required that a large amount of power be consumed. This is inconvenient in terms of power efficiency. Thus it is essential to use the amplifier in the non-linear region in order to hold down the amount of power consumed. As mentioned above, however, distortion increases and degrades the ACPR. A device that compensates for distortion of transmission power and enables use of an amplifier in a region of excellent power added efficiency is a wireless apparatus (linearizer) having a distortion compensating function. The Cartesian loop method and polar loop method, etc., have been proposed as techniques for effecting distortion compensation by feedback and these methods succeed in suppressing the distortion of power amplifiers.

FIG. 48 is a block diagram of a transmitting apparatus having a digital non-linear distortion compensating function that employs a DSP. Here digital data (a transmit signal) sent from the transmit-signal generator 1 is converted to I and Q signals by the S/P converter 2. These signals enter a distortion compensator 8 constituted by a DSP. As illustrated in FIG. 49, the distortion compensator 8 functionally comprises a distortion compensation coefficient memory 8*a* for storing distortion compensation coefficients h(pi) (i=0~1023) conforming to power levels 0~1023 of a transmit signal x(t); a predistortion unit 8*b* for subjecting the transmit signal to distortion compensation processing (predistortion) using a distortion compensation coefficient h(pi) that is in conformity with the level of the transmit signal; and a distortion compensation coefficient calculation unit 8*c* for comparing the transmit signal x(t) with a demodulated signal (feedback signal) y(t), which has been obtained by demodulation in a quadrature detector described later, and for calculating and updating the distortion compensation coefficient h(pi) in such a manner that the difference between the compared signals will approach zero.

The distortion compensator 8 subjects the transmit signal x(t) to predistortion processing using the distortion compensation coefficient h(pi) that conforms to the power level of the transmit signal x(t), and inputs the processed signal to the DA converter 3. The latter converts the input I and Q signals to analog baseband signals and applies the baseband signals to the quadrature modulator 4. The latter multiplies the input I and Q signals by a reference carrier wave and a signal that has been phase-shifted relative to the reference carrier by 90° and sums the results of multiplication to thereby perform quadrature modulation and output the modulated signal. The frequency converter 5 mixes the quadrature-modulated signal and a local oscillation signal to thereby effect a frequency conversion, and a transmission power amplifier 6 power-amplifies the carrier output from the frequency converter 5. The amplified signal is released into the atmosphere from an antenna 7.

Part of the transmit signal is input to a frequency converter 10 via a directional coupler 9 so as to undergo a frequency conversion and then be input to a quadrature detector 11. The latter multiplies the input signal by a reference carrier wave and a signal that has been phase-shifted relative to the reference carrier by 90°, reproduces the I, Q signals of the baseband on the transmitting side and applies these signals to an AD converter 12. The latter converts the applied I and Q signals to digital data and inputs the digital data to a distortion compensator 8. By way of adaptive signal processing using the LMS (Least Mean Square) algorithm, the distortion compensator 8 compares the transmit signal before the distortion compensation thereof with the feedback signal modulated by the quadrature detector 11 and proceeds to calculate and update the distortion compensation coefficient h(pi) in such a manner that the difference between the compared signals will become zero. The transmit signal to be transmitted next is then subjected to predistortion processing using the updated distortion compensation coefficient and the processed signal is output. By repeating this operation, non-linear distortion of the transmission power amplifier 6 is suppressed to reduce the leakage of power between adjacent channels.

FIG. 50 is a diagram useful in describing distortion compensation processing by an adaptive LMS. A multiplier (which corresponds to the predistortion unit 8b in FIG. 49) 15a multiplies the transmit signal (the quadrature-modulated signal) x(t) by a distortion compensation coefficient $h_{n-1}(p)$ and applies its output to a transmission power amplifier 15b having a distortion function f(p). A feedback loop 15c feeds back the output signal y(t) from the transmission power amplifier 15b and an arithmetic unit (amplitude-to-power converter) 15d calculates the power p[=x(t)$^2$] of the transmit signal x(t). A distortion compensation coefficient memory (which corresponds to the distortion compensation coefficient memory 8a of FIG. 49) 15e stores the distortion compensation coefficients that conform to the power levels of the transmit signal x(t). The memory 15e outputs the distortion compensation coefficient $h_{n-1}(p)$ conforming to the power p of the transmit signal x(t) and updates the distortion compensation coefficient $h_{n-1}(p)$ by a distortion compensation coefficient $h_n(p)$ found by the LMS algorithm.

A complex-conjugate signal output unit 15f has the output of the feedback system 15c applied thereto. A subtractor 15g outputs the difference e(t) between the transmit signal x(t) and the feedback (demodulated) signal y(t), a multiplier 15h performs multiplication between e(t) and u*(t), a multiplier 15i performs multiplication between $h_{n-1}(p)$ and y*(t), a multiplier 15j multiplies the output of the multiplier 15h by a step-size parameter μ, and an adder 15k adds $h_{n-1}(p)$ and μe(t)u*(t). Delay units 15m, 15n, 15p add a delay time to the input signal. The delay time is equivalent to the length of time from the moment the transmit signal x(t) enters to the moment the feedback (demodulated) signal y(t) is input to the subtractor 15g. The complex-conjugate signal output unit 15f and the multipliers 15h, 15i and 15j construct a rotation calculation unit 16. A signal that has sustained distortion is indicated at u(t). The arithmetic operations performed by the arrangement set forth above are as follows:

$$h_n(p) = h_{n-1}(p) + \mu e(t) u^*(t)$$

$$e(t) = x(t) - y(t)$$

$$y(t) = h_{n-1}(p) x(t) f(p)$$

$$u(t) = x(t) f(p) = h^*_{n-1}(p) y(t)$$

$$P = |x(t)|^2$$

where x, y, f, h, u, e represent complex numbers and * signifies a complex conjugate. By executing the processing set forth above, the distortion compensation coefficient h(p) is updated so as to minimize the difference e(t) between the transmit signal x(t) and the feedback (demodulated) signal y(t), and the coefficient eventually converges to the optimum distortion compensation coefficient h(p) so that compensation is made for the distortion in the transmission power amplifier.

FIG. 51 is a diagram showing the overall construction of a transmitting apparatus expressed by x(t)=I(t)+jQ(t). Components in FIG. 51 identical with those shown in FIGS. 48 and 50 are designated by like reference characters.

As mentioned above, the principle of digital non-linear distortion compensation is to feed back and detect a carrier obtained by quadrature modulation of a transmit signal, digitally convert and compare the amplitudes of the transmit signal and feedback signal, and update the distortion compensation coefficient based upon the comparison. In accordance with this method of digital non-linear distortion compensation, distortion can be reduced. As a result, the ACPR requirement is satisfied (i.e., leakage power can be held low) with a high output and even with operation in the non-linear region, and the power added efficiency can be improved, thus making it possible to reduce power consumption. Further, the amount of heat evolved can be reduced by the improvement in power added efficiency, thereby mitigating the need for measures to deal with such heating. The end result is an apparatus of smaller size.

When distortion occurs, the signal undergoes amplitude distortion and phase distortion simultaneously. The reason for this is that when a transmit signal that has been compensated for distortion exceeds the compensation amplitude limits of the distortion compensating circuit, the signal has its amplitude limited to the threshold value of the distortion compensating apparatus, the amplitude value becomes stuck at the upper-limit value of the distortion compensating apparatus and phase control becomes impossible.

Though a transmission power amplifier has a non-linear characteristic owing to saturation, the amplifier is used in a state as close to saturation as possible in view of transmission efficiency, as mentioned above. On the other hand, since the distortion compensating apparatus controls distortion compensation in such a manner that the characteristic is made linear, the distortion compensation coefficient $h_n(p)$ becomes gradually larger when the apparatus is used in a state near saturation. As a consequence, there is a rise in the level of the transmit signal x(t)*h(p) (where * signifies complex multiplication) after the distortion compensation thereof, the dynamic range of the DA converter is exceeded and the amplitude of the output of the DA converter becomes distorted. As a result, the transmit signal comes to contain harmonic components, phase becomes distorted as well as amplitude and leakage between adjacent channels occurs. This means that the spectrum characteristic will be out of specs.

FIG. 52 is a diagram useful in describing problems encountered with the conventional phase compensating apparatus. The dashed line LM in FIG. 52 indicates the dynamic range of the DA converter 3 (i.e., the DA converter limit). Distortion will not occur if the level of the transmit signal $x(t)*h_n(p)$ output from the predistortion unit of the distortion compensating apparatus is within the DA converter limit LM. However, if the distortion compensation coefficient $h_{n+1}(p)$ for the transmit signal x(t) increases owing to distortion compensation processing, then $x(t)*h_{n+1}(p)$ will exceed the DA converter limit LM, the amplitude will be clamped to the DA converter limit LM, harmonic components will be produced and phase will become distorted, as mentioned above.

More specifically, in the region where the power amplifier has a high degree of non-linearity, the amplitude difference e(t) between the transmit signal x(t) prior to correction and the feedback signal increases without an increase in the amplitude of the feedback signal y(t) regardless of the fact that it is being attempted to enlarge the amplitude by distortion compensation. If the amplitude difference takes on a large value, the distortion compensator 8 judges that distortion compensation is not being carried out as desired and enlarges the distortion compensation coefficient $h_{n+1}(p)$ in such a manner that the difference signal e(t) becomes smaller. As a result, the signal amplitude after distortion compensation thereof is caused to increase and, consequently, the signal amplitude exceeds the limit value (the limit DM of the DA converter limit 3). This means that the amplitude of a signal whose amplitude has exceeded the limit value takes on a constant amplitude value, resulting in loss of significant components (amplitude and phase) of the signal. As a consequence, not only compensation of the amplitude component but also compensation of the phase component can no longer be carried out. In other words, an obstacle which arises is that distortion compensation does not operate normally.

As a result of the foregoing, when amplitude exceeds the DA converter limit LM, it becomes impossible to control both amplitude and phase and the distortion characteristic becomes worse than that when no distortion compensation is applied.

SUMMARY OF THE INVENTION

Accordingly, an object of the present invention is to correct beforehand the size of a distortion compensation coefficient, while maintaining phase, in such a manner that the input amplitude of a DA converter will not exceed the limit of the DA converter, thereby making it possible to follow up phase by assuring that distortion will not occur even if amplitude is limited.

Another object of the present invention is to correct beforehand the size of a distortion compensation coefficient, while maintaining phase, in such a manner that the power of a transmit signal after its distortion compensation will not exceed an allowed upper-limit power, thereby making it possible to follow up phase even if amplitude is limited.

Another object of the present invention is to so arrange it that the corrected value of a distortion compensation coefficient can be calculated in a simple manner.

A further object of the present invention is to reduce the difference between transmission power and a feedback signal by controlling the amplitude of the feedback signal, thereby preventing an increase in the distortion compensation coefficient and assuring that the transmit signal after its distortion compensation will not exceed a limit value.

Yet another object of the present invention is to make possible application to (1) a distortion compensation method of multiplying a transmit signal by a distortion compensation coefficient and inputting the product to a distortion device, and (2) a distortion compensation method of generating, as an error signal, the difference between a transmit signal and a signal obtained by multiplying a referential signal (transmit signal) by a distortion compensation coefficient, DA-converting the error signal and a main signal (transmit signal) separately, combining the converted signals and inputting the result to a distortion device.

Still another object of the present invention is to provide a distortion compensating apparatus that can be applied to a single-carrier transmitter and to a multicarrier transmitter.

In accordance with the present invention, the foregoing objects are attained by providing a distortion compensating apparatus in which a distortion compensation coefficient is corrected in advance and stored in a distortion compensation coefficient memory in such a manner that a transmit signal that has undergone distortion compensation processing will not exceed the dynamic range of a DA converter. Specifically, before a distortion compensation coefficient $h_{n+1}(p)$ is stored in a distortion compensation coefficient memory following the calculation of this coefficient, an assumption is made that distortion compensation will be performed using the distortion compensation coefficient $h_{n+1}(p)$. Then it is determined beforehand whether a signal that will be obtained by this distortion compensation will exceed the limit of the DA converter. If the limit will be exceeded, the size of the distortion compensation coefficient is reduced by a correction while the phase thereof is maintained, and the corrected distortion compensation coefficient is stored in memory.

Further, in accordance with the present invention, the foregoing objects are attained by determining, before a distortion compensation coefficient $h_{n+1}(p)$ is stored in a distortion compensation coefficient memory following the calculation thereof, whether the power $|x(t)*h_{n+1}(p)|^2$ of a distortion-compensated signal $x(t)*h_{n+1}(p)$ is greater than a set upper-limit power Pmax of a DA converter and, if the upper-limit power is exceeded, reducing the size of the distortion-compensated coefficient by a correction while the phase thereof is maintained and storing the corrected distortion-compensated coefficient in memory.

Further, in accordance with the present invention, the foregoing objects are attained by determining, before a distortion compensation coefficient $h_{n+1}(p)$ is stored in a distortion compensation coefficient memory following the calculation thereof, whether the square of the distortion compensation coefficient $h_{n+1}(p)$ is greater than the square of a set maximum distortion compensation coefficient $h(p)_{MAX}$ and, if such is the case, reducing the size of the distortion compensation coefficient by a correction while the phase thereof is maintained and storing the corrected distortion compensation coefficient in memory. More specifically, if the arrangement described above is adopted, the distortion-compensated signal (the DA converter input) will no longer exceed the DA converter limit (dynamic range) and neither amplitude nor phase distortion will occur in the DA converter. Moreover, since the size of the distortion compensation coefficient $h_{n+1}(p)$ is reduced while the phase of this coefficient is maintained, it is possible to follow up phase.

Further, in accordance with the present invention, the foregoing objects are attained by controlling the amplitude of a feedback signal from the output of an amplifier when it is sensed that the amplitude of a signal after distortion compensation has exceeded a certain limit. By exercising control so as to enlarge the amplitude of the feedback signal when the limit is exceeded, the difference between a transmit signal and the feedback signal is diminished, the distortion compensation coefficient is reduced and it is possible to prevent the limit from being exceeded by the amplitude of a signal that has undergone distortion compensation.

Further, in accordance with the present invention, the foregoing objects are attained by putting the correspondence between the amplitude of a transmit signal or the power of the transmit signal and gain into the form of a table, obtaining from the table a gain that conforms to an actual transmit-signal amplitude or transmit-signal power, and controlling the amplitude of a feedback signal based upon this gain. If this arrangement is adopted, the amplitude of a signal that has undergone distortion compensation can be prevented from exceeding a limit value without sensing whether the amplitude of this signal has exceeded the limit value.

It should be noted that the present invention is applicable to (1) a first distortion compensation method of multiplying a transmit signal by a distortion compensation coefficient and inputting the product to a distortion device, and (2) a second distortion compensation method of generating, as an error signal, the difference between a transmit signal and a signal obtained by multiplying a referential signal (the transmit signal) by a distortion compensation coefficient, DA converting the error signal and a main signal (transmit signal) separately, combining the converted signals and inputting the result to a distortion device. Furthermore, the present invention is applicable to a single-carrier transmitter and to a multicarrier transmitter.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 14 is a diagram useful in describing the principles of the present invention;

FIG. 19 is a diagram useful in describing a frequency conversion;

DESCRIPTION OF THE PREFERRED EMBODIMENTS (A) Principles of the Present Invention (a) Overview FIG. 1 is a block diagram illustrating an overview of the present invention. The apparatus includes a device (a transmission power amplifier) 21 which produces non-linear distortion of a function f(p); a distortion compensation coefficient memory 22 for storing a distortion compensation coefficient h(p), which corrects the distortion of the transmission power amplifier 21, in association with power $p (=|x(t)|^2)$ of a transmit signal x(t); a predistortion unit 23 for reading a distortion compensation coefficient $h_n(p)$ conforming to the power p of the transmit signal x(t) out of the memory 22 and applying distortion compensation processing to the transmit signal using this distortion compensation coefficient; a DA converter 24 for converting a digital transmit signal $x(t)*h_n(p)$, which is the result of the applied distortion compensation processing, to an analog signal; a feedback loop 25 for feeding back the output signal y(t) of the transmission power amplifier 21; an AD converter 26 for converting the feedback signal to digital data; a distortion compensation coefficient calculation unit 27 for calculating a distortion compensation coefficient $h_{n+1}(p)$ based upon the transmit signal x(t) before the distortion compensation thereof and the feedback signal; a distortion compensation coefficient updating unit 28 for updating the distortion compensation coefficient by storing the calculated distortion compensation coefficient $h_{n+1}(p)$ or a corrected distortion compensation coefficient $h_{n+1}(p)'$ in association with the power $|x(t)|^2$ of the transmit signal x(t); and a comparison unit 29. Before the distortion compensation coefficient $h_{n+1}(p)$ calculated by the distortion compensation coefficient calculation unit 27 is stored in the memory 22, the comparison unit 29 compares power $Pa[=|x(t)*h_{n+1}(p)|^2]$ of a transmit signal that would be output from the predistortion unit 23 owing to distortion compensation coefficient processing that is based upon the distortion compensation coefficient $h_{n+1}(p)$, with maximum power Pmax stipulated by the dynamic range of the DA converter 24. The apparatus further includes a distortion compensation coefficient correction unit 30 and a transmit-signal power calculation unit 31 for generating read/write addresses of the distortion compensation coefficient memory 22.

(b) Principles of the Present Invention

Figure 2:
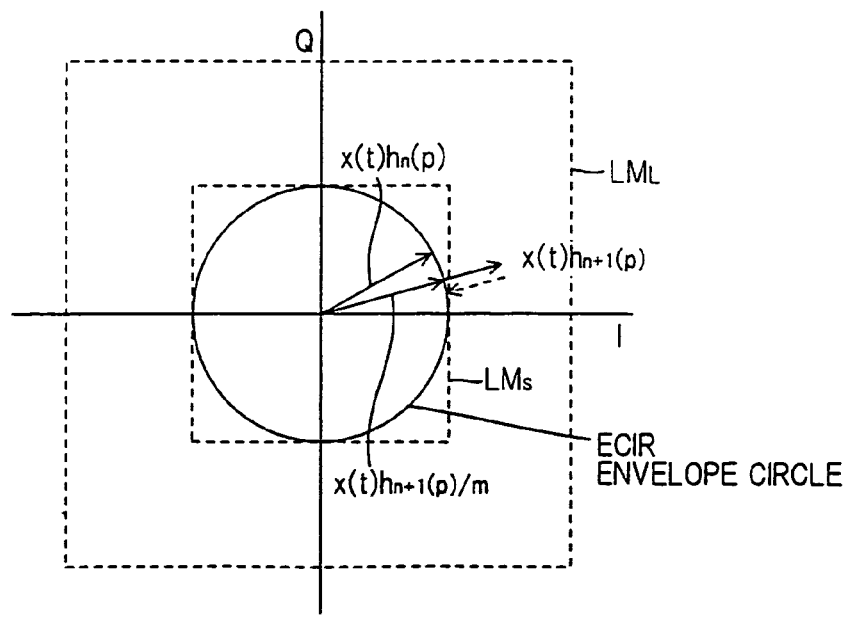
FIG. 2 is a diagram useful in describing the principles of the present invention.

FIG. 2 is a diagram useful in describing the principles of the present invention.

Figure 1:
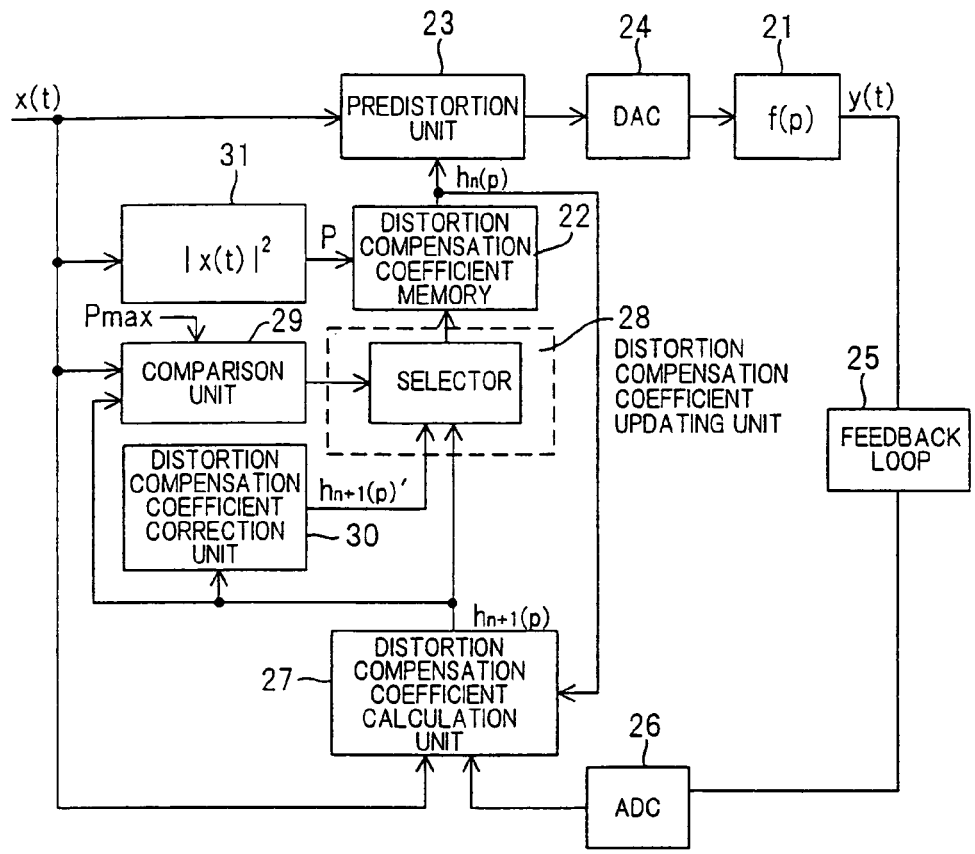
FIG. 1 is a block diagram illustrating the construction of a single-carrier-type distortion compensating apparatus according to the present invention.

In the digitally implemented distortion compensating apparatus of FIG. 1, the upper limit of the distortion-compensated signal is stipulated by the number of bits in the digital data or the number of bits (the dynamic range) of the DA converter 24. It will be assumed below that the upper limit is decided by the dynamic range of the DA converter 24. In FIG. 2, a small square $LM_S$ indicated by the dashed line is the DA converter limit decided by the dynamic range of the DA converter, and a large square $LM_L$ indicated by the dashed line is a calculation limit decided by the number of bits in the digital data. Let x(t) represent a transmit signal before it is subjected to distortion compensation processing, and let $h_n(p)$ represent a distortion compensation coefficient that conforms to the power of this transmit signal. The distortion-compensated signal output from the predistortion unit 23 is $x(t)*h_n p$. If the distortion-compensated signal $x(t)*h_n p$ falls within a circle tangent to the DA converter limit $LM_S$, the transmit signal x(t) will not exceed the DA converter limit $LM_L$ regardless of the phase and neither amplitude nor phase will be distorted in the DA converter 24.

However, when the output amplitude of the transmission power amplifier 21 rises owing to the action of the distortion function f(p), the difference between the transmit signal x(t) before the distortion compensation thereof and the feedback signal increases and the distortion compensation coefficient $h_{n+1}(p)$ output from the distortion compensation coefficient calculation unit 27 grows larger. If in such case the distortion compensation coefficient $h_{n+1}(p)$ is stored in the distortion compensation coefficient memory 22 as is without being corrected, this distortion compensation coefficient will be read out of the memory 22 and a distortion-compensated signal $x(t)*h_{n+1}(p)$ will be output from the predistortion unit 23. If the distortion-compensated signal $x(t)*h_{n+1}(p)$ exceeds the DA converter limit $LM_S$, amplitude distortion and phase distortion will occur in the DA converter.

Accordingly, before the distortion compensation coefficient $h_{n+1}(p)$ is stored in the memory 22 following the calculation of this coefficient, an assumption is made that distortion compensation will be performed using the distortion compensation coefficient $h_{n+1}(p)$. Then it is determined beforehand whether a signal that will be obtained by this distortion compensation will exceed the limit of the DA converter. If it is judged that the limit will be exceeded, this distortion compensation coefficient is corrected so as to be reduced in size while the phase thereof is maintained as is. If this arrangement is adopted, the input to the DA converter will be limited, the DA converter limit $LM_s$ will not be exceeded and neither amplitude nor phase distortion will occur in the DA converter. Moreover, phase follow-up becomes possible because the size of the distortion compensation coefficient $h_{n+1}(p)$ is reduced while the phase thereof is maintained.

(c) Amplitude Limitation by Amplitude Control

It will be understood from the foregoing that when the distortion compensation coefficient $h_{n+1}(p)$ has been found, the comparison unit 29 compares the distortion-compensated signal $x(t)*h_{n+1}(p)$ that would be output from the predistortion unit 23 owing to distortion compensation coefficient processing that is based upon the distortion compensation coefficient $h_{n+1}(p)$, with the DA converter limit $LM_s$ before the distortion compensation coefficient $h_{n+1}(p)$ is stored in the memory 22. Further, the distortion compensation coefficient correction unit 30 corrects the distortion compensation coefficient $h_{n+1}(p)$ to $h_{n+1}(p)/m$ so that $x(t)*h_{n+1}(p)$ will become smaller than the DA converter limit $LM_s$. If the distortion-compensated signal $x(t)*h_{n+1}(p)$ is greater than the DA converter limit $LM_s$, then the distortion compensation coefficient updating unit 28 stores the corrected distortion compensation coefficient $h_{n+1}(p)/m$ in the distortion compensation coefficient memory 22. If the distortion-compensated signal $x(t)*h_{n+1}(p)$ is less than the DA converter limit $LM_s$, then the distortion compensation coefficient updating unit 28 stores the uncorrected distortion compensation coefficient $h_{n+1}(p)$ in the distortion compensation coefficient memory 22 as is. It should be noted that $x(t)*h_{n+1}(p)$ is a complex number. In general, therefore, amplitude control usually is carried out based upon power in the manner described in (d) below.

(d) Amplitude Limitation by Power Control

In (c) above, the amplitude of the input signal to the DA converter is controlled directly and control is exercised in such a manner that the amplitude will converge to the DA converter limit $LM_s$. However, control can be carried out in such a manner that the power $|x(t)*h_{n+1}(p)|^2$ of the distortion-compensated signal $x(t)*h_{n+1}(p)$ will fall below the upper-limit power Pmax of the DA converter, whereby the amplitude will fall within an envelope circle ECIR that is tangent to the DA converter limit $LM_s$. In this case, when the distortion compensation coefficient $h_{n+1}(p)$ has been found, the comparison unit 29 compares the power $Pa[=|x(t)*h_{n+1}(p)|^2]$ of the distortion compensation coefficient that would be output from the predistortion unit 23 owing to distortion compensation coefficient processing that is based upon the distortion compensation coefficient $h_{n+1}(p)$, with the upper-limit power Pmax of the DA converter 24 before the distortion compensation coefficient $h_{n+1}(p)$ is stored in the memory 22. Further, when $|x(t)*h_{n+1}(p)|^2$ is greater than the upper-limit power Pmax, the distortion compensation coefficient correction unit 30 corrects the distortion compensation coefficient $h_{n+1}(p)$ to $h_{n+1}(p)/m$ so that the upper-limit power will not be exceeded. When the power Pa of the distortion-compensated signal is greater than the upper-limit power Pmax, the distortion compensation coefficient updating unit 28 stores the corrected distortion compensation coefficient $h_{n+1}(p)'(=h_{n+1}(p)/m)$ in the distortion compensation coefficient memory 22. When the power Pa is less than the upper-limit power Pmax, the distortion compensation coefficient $h_{n+1}(p)$ is not corrected and is stored in the distortion compensation coefficient memory 22 as is.

As a result of the foregoing, a distortion-compensated signal $x(t)*h_{n+1}(p)/m$ that has been distortion-compensated by the distortion compensation coefficient $h_{n+1}(p)'$ falls within the envelope circle ECIR and neither amplitude distortion nor phase distortion occur in the DA converter 24. In other words, though compensation for amplitude distortion is not perfect, phase is followed up. This means that the distortion characteristic will not be worse than the distortion characteristic that would be obtained without application of the distortion compensating apparatus.

(e) Alternative Amplitude Limitation by Power Control

If we let Pmax represent the allowable upper-limit power set for the DA converter and let $h(p)_{MAX}$ represent the maximum distortion compensation coefficient for the transmit signal $x(t)$, then the following relation will hold:

$$P\max = |x(t)*h(p)_{MAX}|^2$$

Since Pmax is constant, the transmit signal $x(t)$ and the maximum distortion compensation coefficient $h(p)_{MAX}$ have a 1:1 relationship. If the transmit signal $x(t)$ has been determined, then the maximum distortion compensation coefficient $h(p)_{MAX}$ will be uniquely decided. Accordingly, if the square of the distortion compensation coefficient $h_{n+1}(p)$ is greater than the square of the maximum distortion compensation coefficient $h(p)_{MAX}$, the distortion-compensated signal $x(t)*h_{n+1}(p)$ that will be obtained using the distortion compensation coefficient $h_{n+1}(p)$ will exceed the envelope circle ECIR.

It will be understood from the foregoing that when the distortion compensation coefficient $h_{n+1}(p)$ has been calculated, the comparison unit 29 compares the square of the distortion compensation coefficient (namely $|h_{n+1}(p)|^2$) and the square of the maximum distortion compensation coefficient $h(p)_{MAX}$ (namely $|h(p)_{MAX}|^2$). The distortion compensation coefficient correction unit 30 corrects the distortion compensation coefficient $h_{n+1}(p)$ to $h_{n+1}(p)/m$ so that $|h_{n+1}(p)|^2$ will become smaller than $|h(p)_{MAX}|^2$. When $|h_{n+1}(p)|^2 > |h(p)_{MAX}|^2$ holds, the distortion compensation coefficient updating unit 28 stores the corrected distortion compensation coefficient $h_{n+1}(p)'[=h_{n+1}(p)/m]$ in the distortion compensation coefficient memory 22. When $|h_{n+1}(p)|^2 < |h(p)_{MAX}|^2$ holds, the distortion compensation coefficient updating unit 28 does not correct the distortion compensation coefficient $h_{n+1}(p)$ and stores it in the distortion compensation coefficient memory 22 as is. As a result, a signal $x(t)*h_{n+1}(p)/m$ that has been distortion-compensated by the distortion compensation coefficient $h_{n+1}(p)'$ falls within the envelope circle ECIR and neither amplitude distortion nor phase distortion occur in the DA converter 24.

(f) Implementation not Requiring Calculation for Correcting Distortion Compensation Coefficients If corrected values of distortion compensation coefficients are stored in association with combinations of $|x(t)|^2$ and $h_{n+1}(p)$, it will not be necessary to execute processing such as calculation for correcting distortion compensation coefficients and comparison of the power Pa of the distortion-compensated signal and the upper-limit power Pmax. Hence, (1) the distortion compensation coefficient $h_{n+1}(p)$ is corrected in such a manner that the power Pa of the transmit signal when distortion compensation processing is applied to the transmit signal $x(t)$ using the distortion compensation coefficient $h_{n+1}(p)$ calculated by the distortion compensation coefficient calculation unit will fall below the upper-limit power Pmax, and (2) the corrected distortion compensation coefficient $h_{n+1}(p)'$ is put in a table in association with the combination of $|x(t)|^2$ and $h_{n+1}(p)$. (3) When the power Pa of the distortion-compensated transmit signal is less than the upper-limit power Pmax, the distortion compensation coefficient $h_{n+1}(p)$ is put in a table as is in association with the combination of $|x(t)|^2$ and $h_{n+1}(p)$.

If the distortion compensation coefficient $h_{n+1}(p)$ is calculated by the distortion compensation coefficient calculation unit 27 under these conditions, the distortion compensation coefficient updating unit 28 obtains from the table the corrected value of the distortion compensation coefficient that conforms to the combination of the distortion compensation coefficient $h_{n+1}(p)$ and the power $|x(t)|^2$ of the transmit signal $x(t)$ and stores this corrected value in the distortion compensation coefficient memory 22. When distortion compensation processing for the next transmit signal $x(t)$ is subsequently executed, the predistortion unit 23 reads the corrected distortion compensation coefficient out of the memory 22, executes distortion compensation processing and outputs the result.

The foregoing is an example in which a distortion compensation coefficient is corrected using a table before a coefficient is written to the memory 22. However, an arrangement in which a coefficient is read out of the memory 22 and is corrected using the above-mentioned table can be adopted. Specifically, when the distortion compensation coefficient $h_{n+1}(p)$ has been calculated by the distortion compensation coefficient calculation unit 27, the distortion compensation coefficient updating unit 28 stores the distortion compensation coefficient $h_{n+1}(p)$ in the distortion compensation coefficient memory 22 as is. Then, when the transmit signal $x(t)$ is to be subjected to distortion compensation processing, the distortion compensation coefficient $h_n(p)$ is read out of the memory 22. At this time the predistortion unit 23 obtains from the table the corrected value of the distortion compensation coefficient conforming to the combination of the distortion compensation coefficient $h_n(p)$ and power $|x(t)|^2$ of the transmit signal $x(t)$, executes distortion compensation processing and outputs the result.

(g) Amplitude Limitation by Amplitude Control of Feedback Signal

When it has been sensed that the amplitude of a signal following the distortion compensation thereof is over the limit, the amplitude of the feedback signal from the output of the amplifier is raised. By raising the amplitude of the feedback signal when the limit has been exceeded, the difference between the transmit signal and the feedback signal is reduced and the distortion compensation coefficient decreases so that it is possible to prevent the amplitude of the compensation-limited signal from subsequently surpassing the limit.

Further, correspondence between the amplitude or power of the transmit signal and gain is put into table form, gain that conforms to the amplitude or power of an actual transmit signal is found from the table, and the amplitude of the feedback signal is controlled based upon the gain found. If this arrangement is adopted, the amplitude of a signal that has undergone distortion compensation can be prevented from exceeding a limit value without sensing whether the amplitude of this signal has exceeded the limit value.

Figure 3:
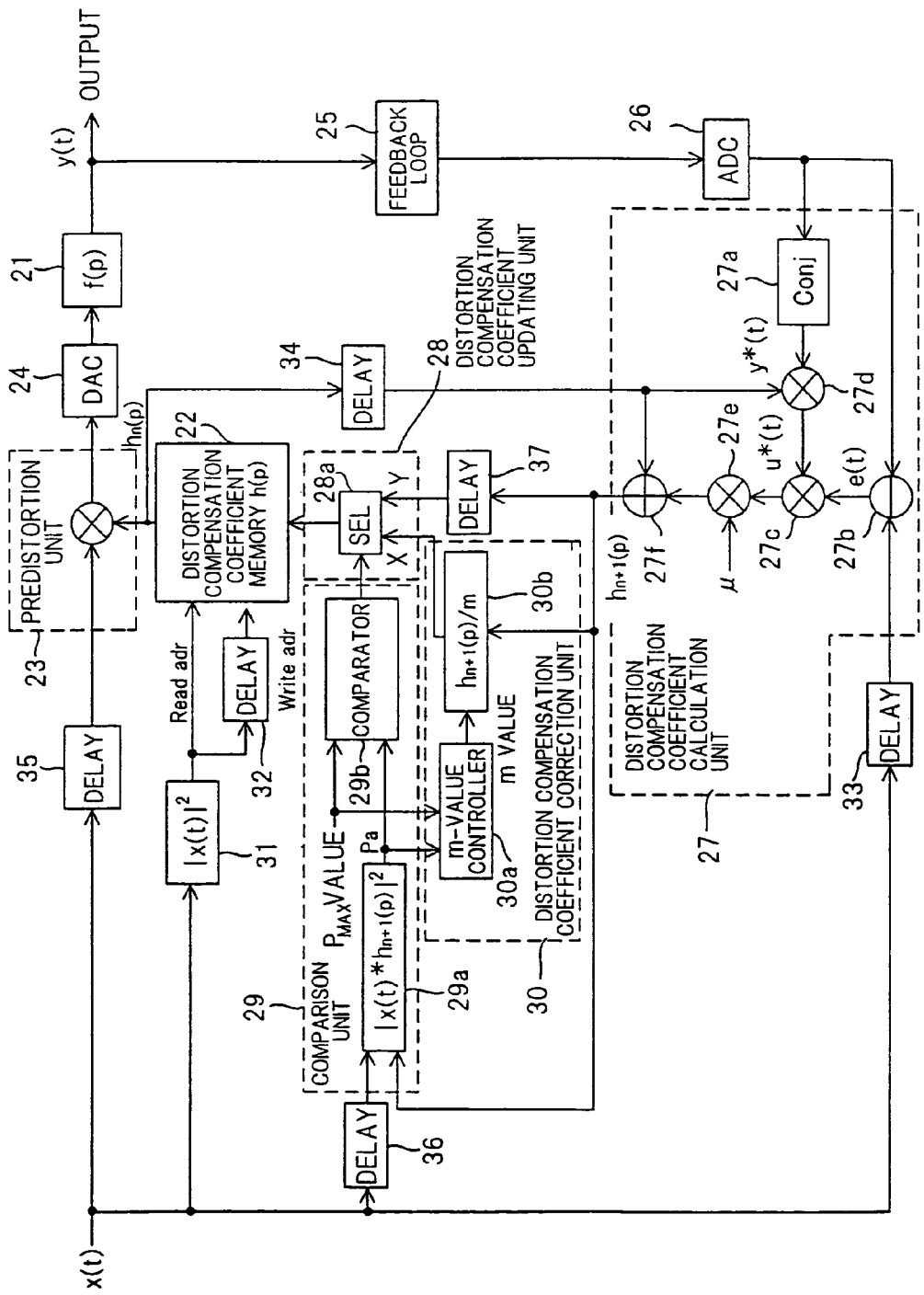
FIG. 3 is a diagram showing the construction of a first embodiment of the present invention.

(B) Embodiments of Distortion Compensating Apparatus for Outputting a Distortion Compensation Signal by Multiplying a Transmit Signal by a Distortion Compensation Coefficient (a) First Embodiment FIG. 3 illustrates a first embodiment of the present invention applied to a distortion compensating apparatus for outputting a distortion-compensated signal by multiplying a transmit signal by a distortion compensation coefficient. Components in FIG. 3 identical with those illustrated in FIG. 1 are designated by like reference characters. Numerals 32 to 37 denote delay circuits for adjusting timing.

Figure 34:
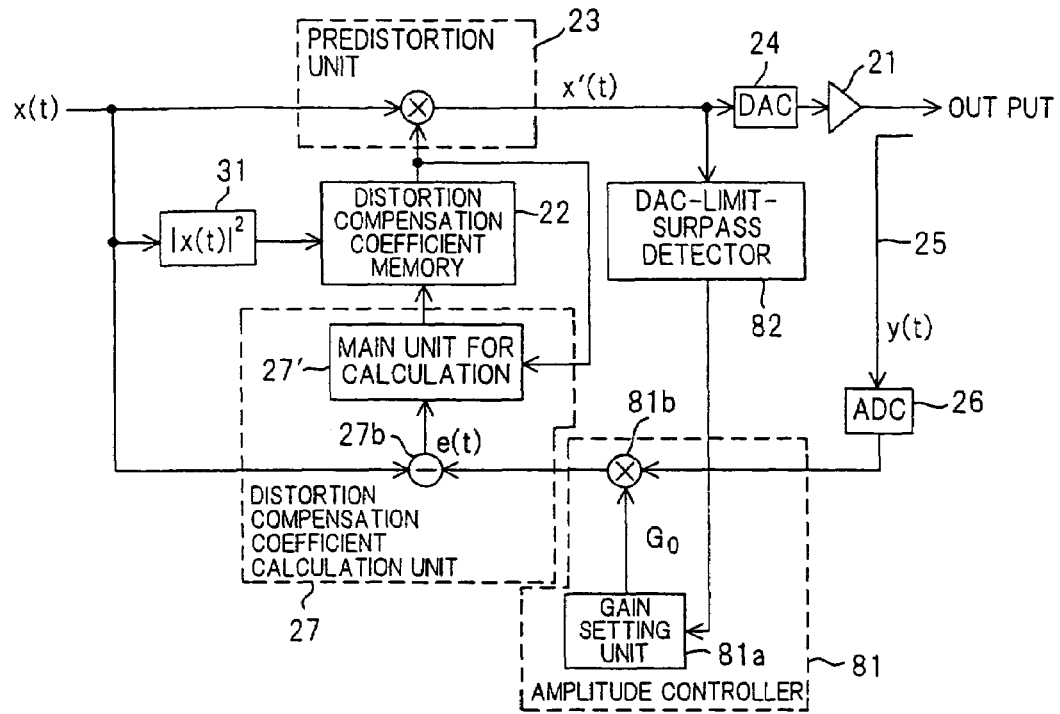
FIG. 34 illustrates a second embodiment of a distortion compensating apparatus having a function for controlling the amplitude of a feedback signal.

The distortion compensation coefficient calculation unit 27 calculates a distortion compensation coefficient $h_{n+1}(n)$ by an LMS algorithm in a manner similar to that of the example of the prior art shown in FIG. 34. The distortion compensation coefficient calculation unit 27 includes a complex-conjugate signal output unit 27a; a subtractor 27b for outputting the difference $e(t)$ between the transmit signal $x(t)$ prior to its distortion compensation processing and a feedback (demodulated) signal $y(t)$; a multiplier 27c for multiplying $e(t)$ and $u^*(t)$; a multiplier 27d for multiplying $h_n(p)$ and $y^*(t)$ a multiplier 27e for multiplying the output of the multiplier 27c by a step-size parameter $\mu$; and an adder 27f for adding $h_n(p)$ and $\mu e(t)u^*(t)$.

The distortion compensation coefficient updating unit 28 updates the distortion compensation coefficient stored in the distortion compensation coefficient memory 22 and has a selector 28a. The latter stores a distortion compensation coefficient $X[=h_{n+1}(p)/m]$ in the distortion compensation coefficient memory 22 when the power $Pa[=|x(t)*h_{n+1}(p)|^2]$ of the distortion-compensated signal is larger than the upper-limit power Pmax set beforehand in dependence upon the dynamic range of the DA converter 24, and sets an uncorrected distortion compensation coefficient $Y[=h_{n+1}(p)]$ in the distortion compensation coefficient memory 22 when the power Pa is less than Pmax.

The comparison unit 29 compares the power $Pa[=|x(t)*h_{n+1}(p)|^2]$ of the distortion-compensated signal with the set upper-limit power Pmax and includes a power calculation unit 29a and a comparator 29b. The power calculation unit 29a calculates the power Pa of the distortion-compensated signal $x(t)*h_{n+1}(p)$ output from the predistortion unit 23 by distortion compensation processing using the distortion compensation coefficient $h_{n+1}(p)$ obtained by the distortion compensation coefficient calculation unit 27, and the comparator 29b compares the power $Pa[=|x(t)*h_{n+1}(p)|^2]$ and the upper-limit power Pmax and inputs the result to the selector 28a. It should be noted that * signifies complex multiplication.

When the power $Pa[=|x(t)*h_{n+1}(p)|^2]$ of the transmit signal is greater than the upper-limit power Pmax, the distortion compensation coefficient correction unit 30 corrects the distortion compensation coefficient $h_{n+1}(p)$ to $h_{n+1}(p)/m$ so that Pa will fall below the upper-limit power Pmax. The distortion compensation coefficient correction unit 30 has an m-value controller 30a and a corrected-value calculation unit 30b. Here m represents a coefficient attenuation ratio and $m^2$ is the ratio of the power $Pa[=|x(t)*h_{n+1}(p)|^2]$ of the distortion-compensated signal to the upper-limit power Pmax. Accordingly, the following relation holds:

$$m^2 = |x(t)*h_{n+1}(p)|^2/P\text{max}$$

and m is found from $$m = \{|x(t)*h_{n+1}(p)|^2/P\text{max}\}^{1/2} \quad (1)$$

The m-value controller 30a performs the calculation of Equation (1) to calculate the coefficient attenuation ratio m, and the corrected-value calculation unit 30b outputs the corrected value X of the distortion compensation coefficient upon calculating the same in accordance with the following equation:

$$X = h_{n+1}(p)/m \quad (2)$$

The delay circuit 32 delays the output signal from the transmit-signal power calculation unit 31 in such a manner that a write address (Write adr) is generated at the timing at which the distortion compensation coefficient is output from the selector 28a. The delay circuit 33 matches the timing of the transmit signal $x(t)$ before the distortion compensation thereof to the timing of the feedback signal y(t). The transmit signal is delayed until the feedback signal arrives at the subtractor 27b. The delay circuit 34 adjusts the timing of the input signal to the adder 27f. Specifically, the delay circuit 34 delays the distortion compensation coefficient $h_n(p)$, which is output from the distortion compensation coefficient memory 22, until $\mu e(t)u^*(t)$ is output from the multiplier 27e. The delay circuit 35 adjusts the timing of the input signal to the predistortion unit 23. Specifically, the delay circuit 35 delays the transmit signal x(t) for a length of time from the moment the distortion compensation coefficient is read out of the distortion compensation coefficient memory 22 to the moment this distortion compensation coefficient enters the predistortion unit 23. The delay circuit 36 adjusts the timing of the input signal to the power calculation unit 29a. That is, the delay circuit 36 delays the transmit signal x(t) until the distortion compensation coefficient $h_{n+1}$ is output from the distortion compensation coefficient calculation unit 27. The delay circuit 37 matches the output timings of the selector inputs X and Y, i.e., delays the output timing of the distortion compensation coefficient $h_{n+1}$ until the corrected value X is generated.

When the distortion compensation coefficient $h_{n+1}(p)$ has been found, the comparison unit 29 compares the power $|x(t)^*h_{n+1}(p)|^2$ of the distortion compensation coefficient that would be output from the predistortion unit 23 owing to distortion compensation coefficient processing that is based upon the distortion compensation coefficient $h_{n+1}(p)$, with the upper-limit power Pmax of the DA converter 24. Further, the distortion compensation coefficient correction unit 30 corrects the distortion compensation coefficient $h_{n+1}(p)$ to $h_{n+1}(p)/m$ in such a manner that the power $|x(t)^*h_{n+1}(p)|^2$ will fall below the upper-limit power Pmax. When the power Pa of the distortion-compensated signal is greater than the upper-limit power Pmax, the distortion compensation coefficient updating unit 28 stores the corrected value X $(=h_{n+1}(p)/m)$ of the distortion compensation coefficient in the distortion compensation coefficient memory 22. When the power Pa is less than the upper-limit power Pmax, the uncorrected distortion compensation coefficient $Y[=h_{n+1}(p)]$ is stored in the distortion compensation coefficient memory 22. When distortion compensation processing for the next transmit signal x(t) is subsequently executed, the predistortion unit 23 reads the corrected distortion compensation coefficient out of the memory 22, executes distortion compensation processing and outputs the result. Now the distortion-compensated signal will fall within the envelope circle ECIR (see FIG. 2) and neither amplitude nor phase distortion will occur in the DA converter.

(b) Second Embodiment

Figure 4:
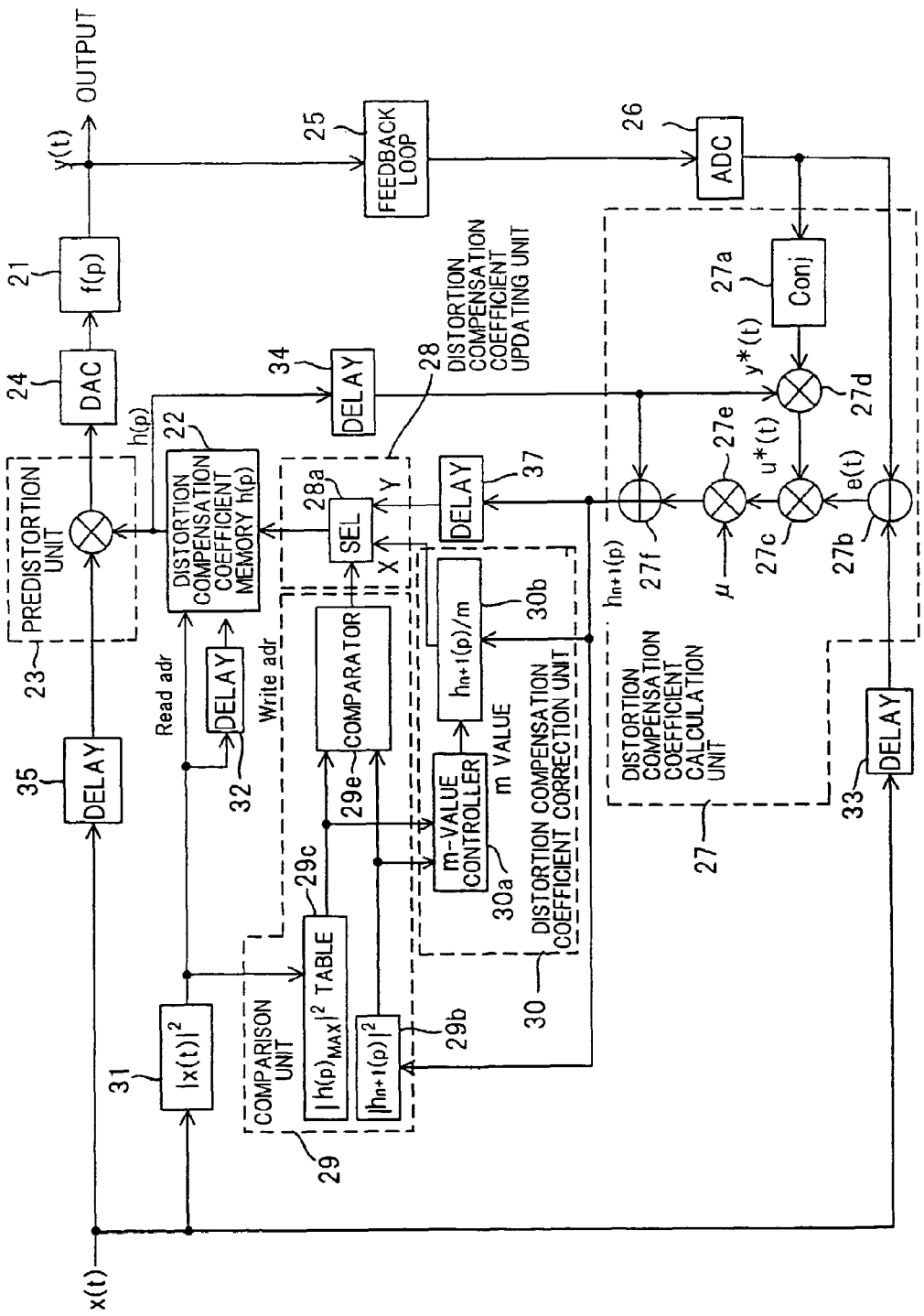
FIG. 4 is a diagram showing the construction of a second embodiment of the present invention.

FIG. 4 illustrates a second embodiment of the present invention applied to a distortion compensating apparatus for outputting a distortion-compensated signal by multiplying a transmit signal by a distortion compensation coefficient. Components in FIG. 4 identical with those illustrated in FIG. 3 are designated by like reference characters. This embodiment differs in terms of the construction of the comparison unit 29, which here includes a table 29c, an arithmetic unit 29d and a comparator 29e. The table 29c stores the square $|h(p)_{MAX}|^2$ of the maximum distortion compensation coefficient $h(p)_{MAX}$ that conforms to the power $|x(t)|^2$ of the transmit signal x(t), the arithmetic unit 29d calculates the square $|h_{n+1}(p)|^2$ of the distortion compensation coefficient $h_{n+1}(p)$, and the comparator 29e compares $|h(p)_{MAX}|^2$ and $|h_{n+1}(p)|^2$.

If we let Pmax represent the allowable upper-limit power set for the DA converter and let $h(p)_{MAX}$ represent the maximum distortion compensation coefficient for the transmit signal x(t), then the following relation will hold:

$$P\text{max} = |x(t)^*h(p)_{MAX}|^2 \quad (3)$$

Since Pmax is constant, the transmit signal x(t) and the maximum distortion compensation coefficient $h(p)_{MAX}$ have a 1:1 relationship. If the transmit signal x(t) has been determined, then the maximum distortion compensation coefficient $h(p)_{MAX}$ will be uniquely decided. Accordingly, the size relationship between $P\text{max}[=|x(t)^*h(p)_{MAX}|^2]$ and the power $Pa[=|x(t)^*h_{n+1}(p)|^2]$ of the distortion-compensated signal agrees with the size relationship between $|h(p)_{MAX}|^2$ and $|h_{n+1}(p)|^2$. The distortion compensation coefficient correction unit 30 corrects the distortion compensation coefficient $h_{n+1}(p)$ to $h_{n+1}(p)/m$ in accordance with Equations (1), (2) so that $|h_{n+1}(p)|^2$ will become smaller than $|h(p)_{MAX}|^2$. When $|h_{n+1}(p)|^2 > |h(p)_{MAX}|^2$ holds, the distortion compensation coefficient updating unit 28 stores the corrected distortion compensation coefficient $X[=h_{n+1}(p)/m]$ in the distortion compensation coefficient memory 22. When $|h_{n+1}(p)|^2 < |h(p)_{MAX}|^2$ holds, the distortion compensation coefficient updating unit 28 stores the uncorrected distortion compensation coefficient $Y[=h_{n+1}(p)]$ in the distortion compensation coefficient memory 22 as is. When distortion compensation processing for the next transmit signal x(t) is subsequently executed, the predistortion unit 23 reads the corrected distortion compensation coefficient out of the memory 22, executes distortion compensation processing and outputs the result. Now the distortion-compensated signal will fall within the envelope circle ECIR (see FIG. 2) and neither amplitude nor phase distortion will occur in the DA converter.

(c) Third Embodiment

Figure 5:
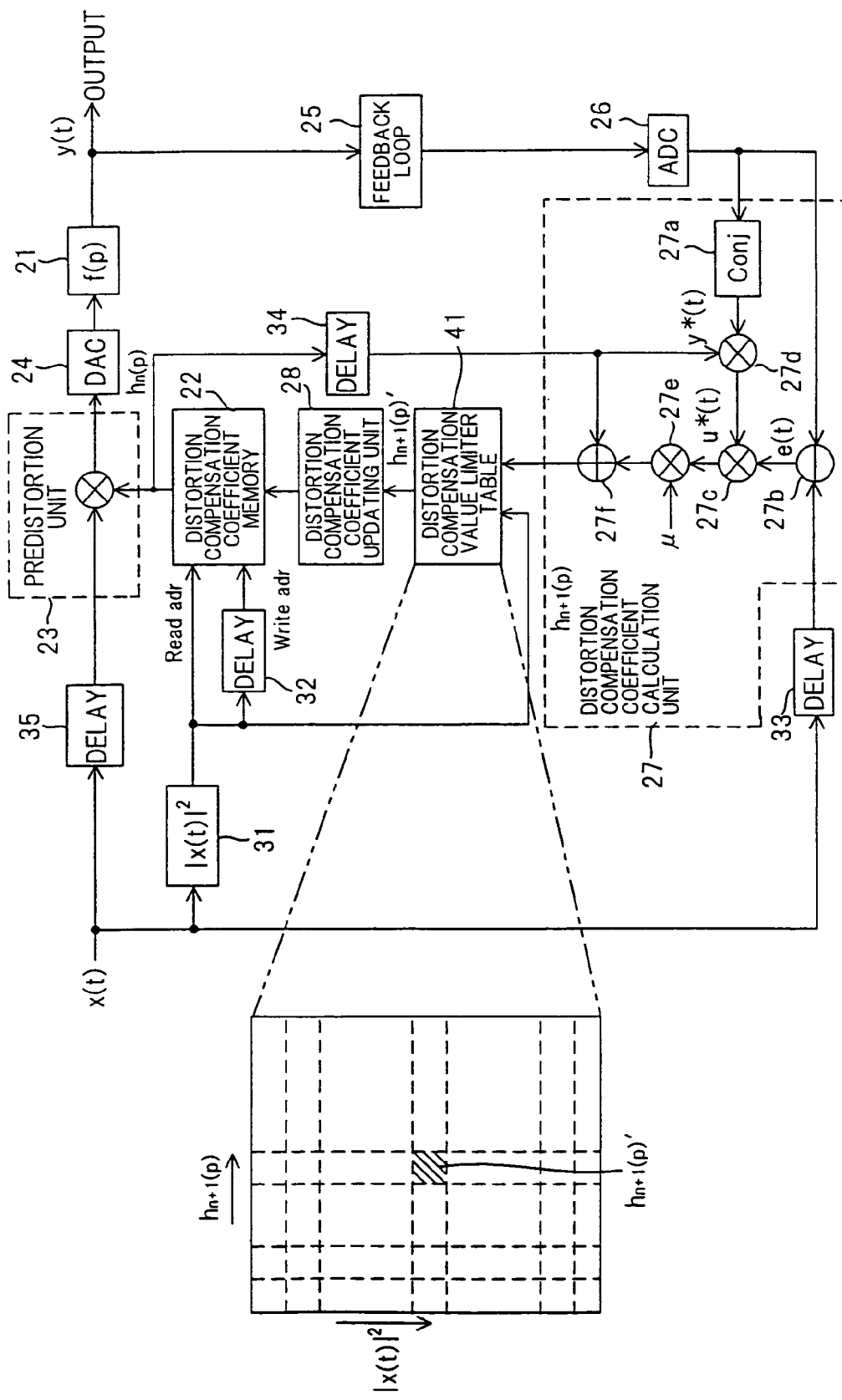
FIG. 5 is a diagram showing the construction of a third embodiment of the present invention.

FIG. 5 illustrates a third embodiment of the present invention applied to a distortion compensating apparatus for outputting a distortion-compensated signal by multiplying a transmit signal by a distortion compensation coefficient. Components in FIG. 5 identical with those illustrated in FIG. 3 are designated by like reference characters. This embodiment differs in the following respects:

(1) a corrected value $h_{n+1}(p)'$ of the distortion compensation coefficient $h_{n+1}(p)$ is stored in a distortion compensation value limiter table 41 beforehand in association with a combination of $|x(t)|^2$ and $h_{n+1}(p)$;

(2) the corrected value of a desired distortion compensation coefficient is read out of the table 41 and stored in the distortion compensation coefficient memory 22; and (3) the comparison unit 29 and distortion compensation coefficient correction unit 30 are deleted.

The distortion compensation value limiter table 41 is created as follows: The distortion compensation coefficient $h_{n+1}(p)$ is corrected to $h_{n+1}(p)/m$ so that the power $|x(t)^*h_{n+1}(p)|^2$ of the distortion-compensated signal obtained when distortion compensation processing is applied to the transmit signal x(t) using the distortion compensation coefficient $h_{n+1}(p)$ will fall below the upper-limit power Pmax. The corrected value $h_{n+1}(p)'[=h_{n+1}(p)/m]$ is then put into table form in correspondence with the combination of $|x(t)|^2$ and $h_{n+1}(p)$. In this case, if $|x(t)^*h_{n+1}(p)|^2$ is smaller than the upper-limit power Pmax, the distortion compensation coefficient $h_{n+1}(p)$ is not corrected and is put into table form in association with the combination of $|x(t)|^2$ and $h_{n+1}(p)$ When the distortion compensation coefficient calculation unit 27 calculates the distortion compensation coefficient $h_{n+1}(p)$ in distortion compensation processing, the distortion compensation coefficient updating unit 28 obtains, from table 41, the corrected value $h_{n+1}(p)'$ of the distortion compensation coefficient conforming to the combination of the distortion compensation coefficient $h_{n+1}(p)$ and power $|x(t)|^2$ of the transmit signal $x(t)$ and stores this value in the distortion compensation coefficient memory 22. When distortion compensation processing for the next transmit signal $x(t)$ is subsequently executed, the predistortion unit 23 reads the corrected distortion compensation coefficient out of the memory 22, executes distortion compensation processing and outputs the result.

If above-described arrangement is adopted, comparison and corrected-value calculation operations can be dispensed with and a corrected value of a distortion compensation coefficient can be obtained at high speed. The arrangement is simpler as well.

(d) Fourth Embodiment

Figure 6:
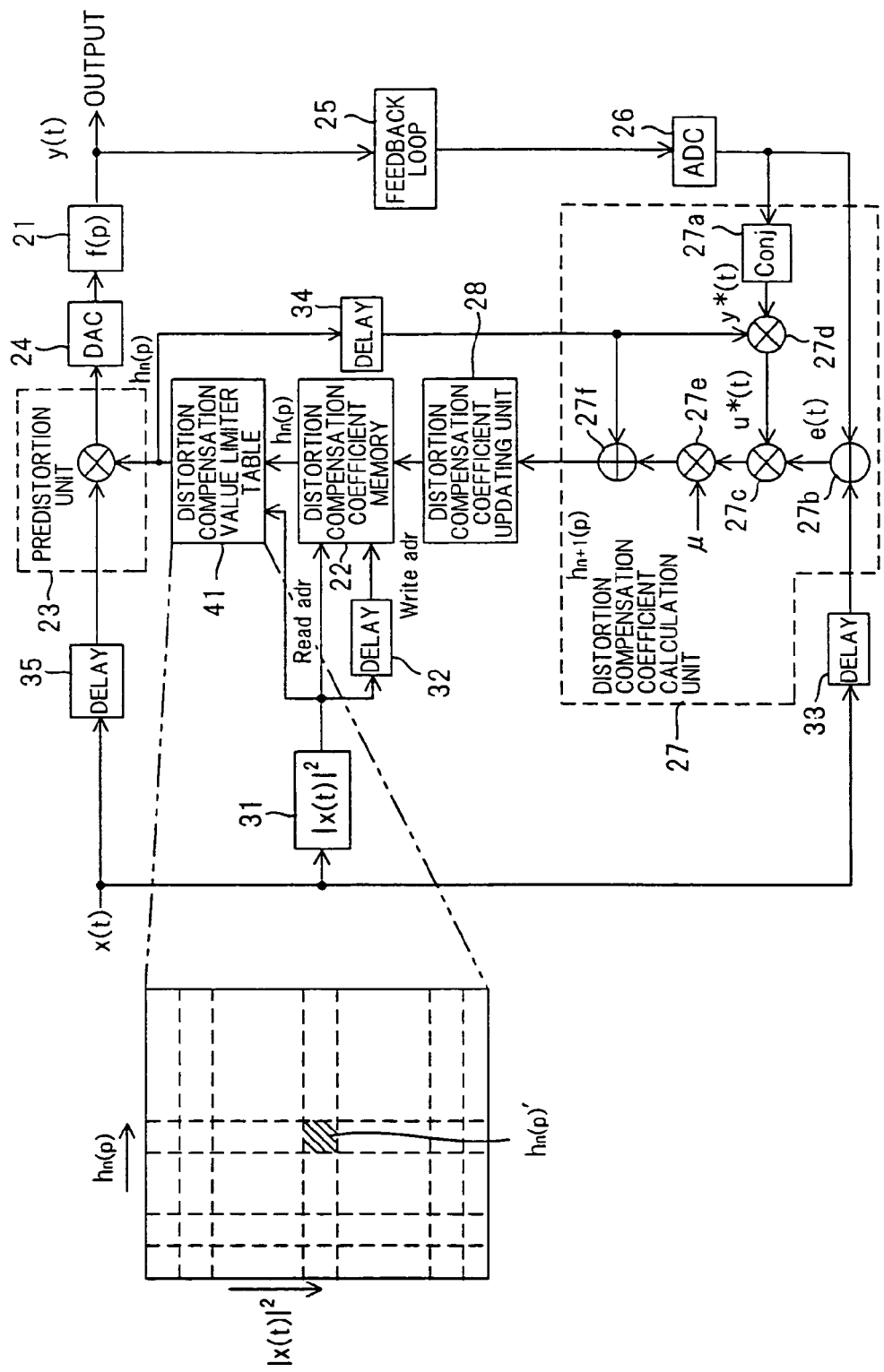
FIG. 6 is a diagram showing the construction of a fourth embodiment of the present invention.

FIG. 6 illustrates a fourth embodiment of the present invention applied to a distortion compensating apparatus for outputting a distortion-compensated signal by multiplying a transmit signal by a distortion compensation coefficient. Components in FIG. 6 identical with those illustrated in FIG. 5 are designated by like reference characters. This embodiment differs in the location of the table 41. In the third embodiment, the table 41 is provided on the input side of the distortion compensation coefficient memory 22. In the fourth embodiment, however, the table 41 is provided on the output side of the distortion compensation coefficient memory 22. In the fourth embodiment, in other words, the distortion compensation coefficient is corrected using the table 41 after the distortion compensation coefficient is read out of the memory 22.

When the distortion compensation coefficient calculation unit 27 calculates the distortion compensation coefficient $h_{n+1}(p)$ in distortion compensation processing, the distortion compensation coefficient updating unit 28 stores the distortion compensation coefficient $h_{n+1}(p)$ in the distortion compensation coefficient memory 22 as is. When distortion compensation processing for the next transmit signal $x(t)$ is executed and the distortion compensation coefficient $h_n(p)$ is read out of the memory 22, the predistortion unit 23 obtains, from table 41, the corrected distortion compensation coefficient $h_n(p)'$ that conforms to the combination of the distortion compensation coefficient $h_n(p)$ and $|x(t)|^2$, executes distortion compensation processing and outputs the result.

(e) Fifth Embodiment

Figure 7:
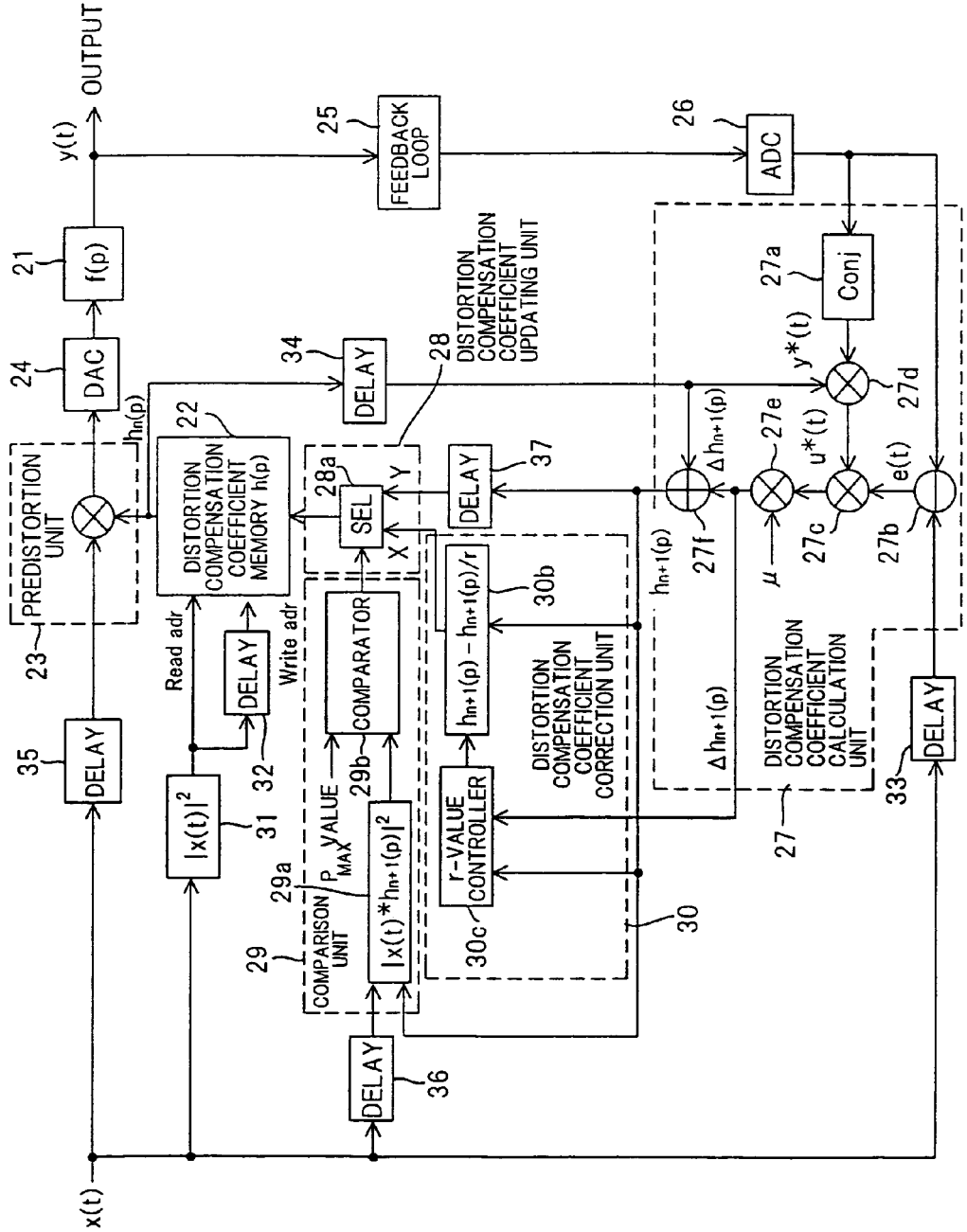
FIG. 7 is a diagram showing the construction of a fifth embodiment of the present invention.

FIG. 7 illustrates a fifth embodiment in which the operation for correcting a distortion compensation coefficient is simplified. Components in FIG. 7 identical with those of the first embodiment in FIG. 3 are designated by like reference characters. In the first embodiment, the operation for correcting a distortion compensation coefficient requires calculation and this in turn results in hardware of larger scale. In the fifth embodiment, the calculation is achieved by a bit shift. According to the fifth embodiment, when the power $|x(t)*h_{n+1}(p)|^2$ of the distortion-compensated signal is greater than the upper-limit power Pmax, the distortion compensation coefficient $h_{n+1}(p)$ is corrected to $[h_{n+1}(p)-h_{n+1}(p)/r]$ so that the following equations will hold:

$$[\{h_n(p)+\Delta h_{n+1}(p)\}-\{h_n(p)+\Delta h_{n+1}(p)\}/r]^2 \leq (h_n(p))^2 \quad (4)$$

$$[h_{n+1}(p)-h_{n+1}(p)/r]^2 \leq [h_n(p)]^2 \quad (4)'$$

In the above equations, $\Delta h_{n+1}(p)$ represents the output of the multiplier 27e. If r is decided in such a manner that Equation (4)' is decided and the corrected value $h_{n+1}(p)'$ is expressed by $$h_{n+1}(p)'=[h_{n+1}(p)-h_{n+1}(p)/r] \quad (5)$$

then $h_n(p)$ will be less than the DA converter limit. The corrected value $h_{n+1}(p)'$, therefore, will also fall below the limit value with certainty.

If Equation (4) is transformed, we have $$[h_n(p)+\{\Delta h_{n+1}(p)-(h_n(p)+\Delta h_{n+1}(p))/r\}]^2 \leq (h_n(p))^2 \quad (4)''$$

If the following relation holds:

$$\Delta h_{n+1}(p)-(h_n(p)+\Delta h_{n+1}(p))/r \leq 0 \quad (6)$$

then Equation (4) will hold true without fail. Accordingly, it will suffice to decide r so as to satisfy the following equation on the basis of Equation (6):

$$r \leq \{h_n(p)+\Delta h_{n+1}(p)\}/\Delta h_{n+1}(p) = h_{n+1}(p)/\Delta h_{n+1}(p) \quad (6)'$$

and to correct the distortion compensation coefficient $h_{n+1}(p)$ in accordance with Equation (5). Equation (6)', however, involves calculation. Accordingly, r is found by obtaining the largest integer H that satisfies $$2^H \leq \Delta h_{n+1}(p)$$

and shifting $h_{n+1}(p)$ a total of H times. In this case, Equation (5) involves calculation. Accordingly, if the smallest integer R that satisfies $$r \leq 2R$$

is found, then the right side of Equation (5) can be obtained in simple fashion by shifting the distortion compensation coefficient $h_{n+1}(p)$, which is the numerator, R times.

In the distortion compensation coefficient correction unit 30, an r-value controller 30c obtains and outputs the smallest integral value R that satisfies Equation (7), and an arithmetic unit 30d performs the operation $$h_{n+1}(p)'=[h_{n+1}(p)-h_{n+1}(p)/r]$$

and inputs the result to the selector 28a. The latter stores the corrected value X $(=[h_{n+1}(p)-h_{n+1}(p)/r])$ in the distortion compensation coefficient memory 22 when the power Pa of the distortion-compensated signal is greater than the upper-limit power Pmax, and stores the uncorrected distortion compensation coefficient $Y[=h_{n+1}(p)]$ in the distortion compensation coefficient memory 22 if Pa is less than Pmax.

(f) Sixth Embodiment

Figure 8:
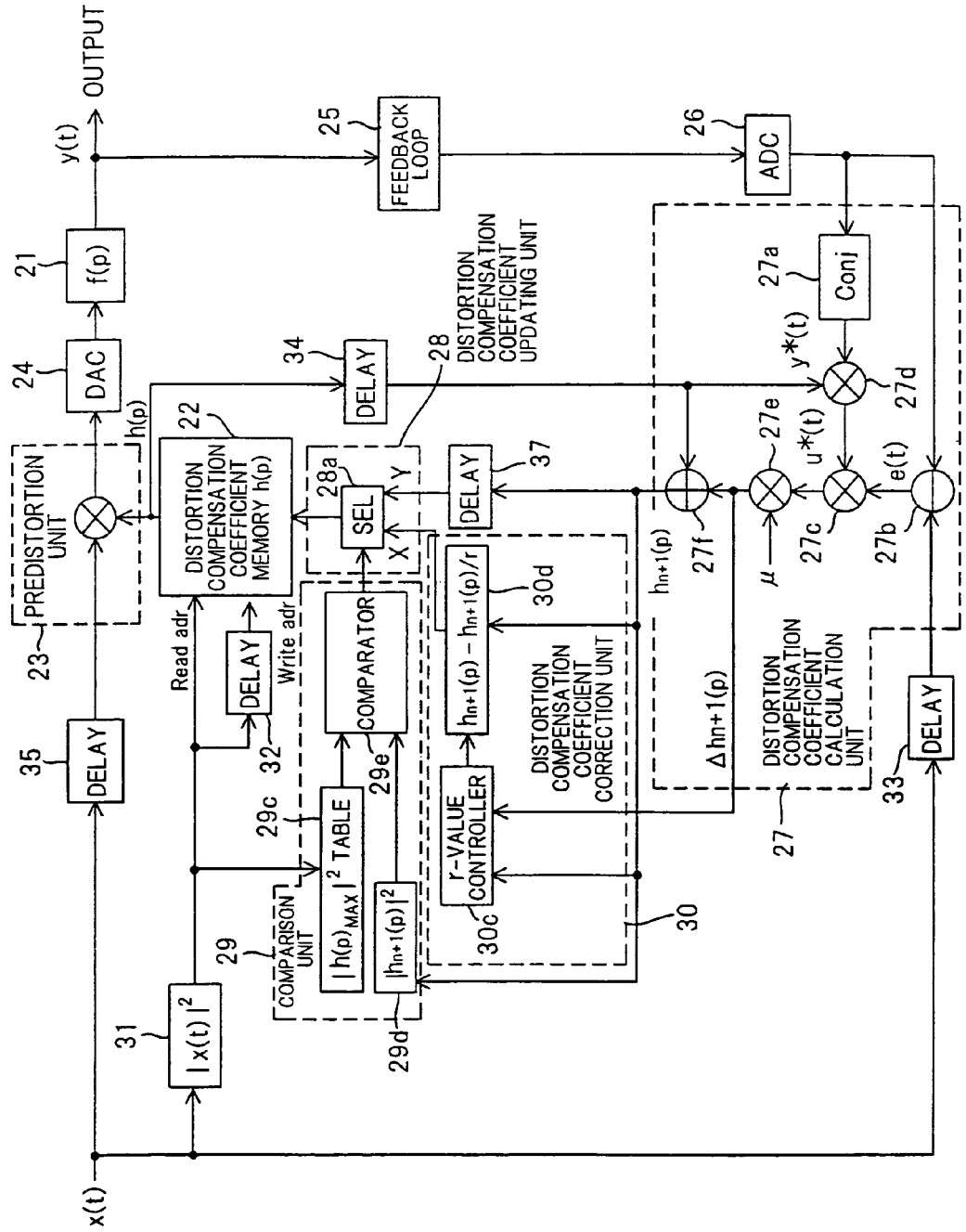
FIG. 8 is a diagram showing the construction of a sixth embodiment of the present invention.

FIG. 8 illustrates a sixth embodiment in which the operation for correcting a distortion compensation coefficient is simplified. Components in FIG. 8 identical with those of the second embodiment in FIG. 4 are designated by like reference characters. In the second embodiment, the operation for correcting a distortion compensation coefficient requires calculation and this in turn results in hardware of larger scale. In the sixth embodiment, the calculation is achieved by a bit shift. Though the construction of the distortion compensation coefficient correction unit 30 is different from that of the second embodiment, it is exactly the same as that of FIG. 7.

(g) Seventh Embodiment

Figure 9:
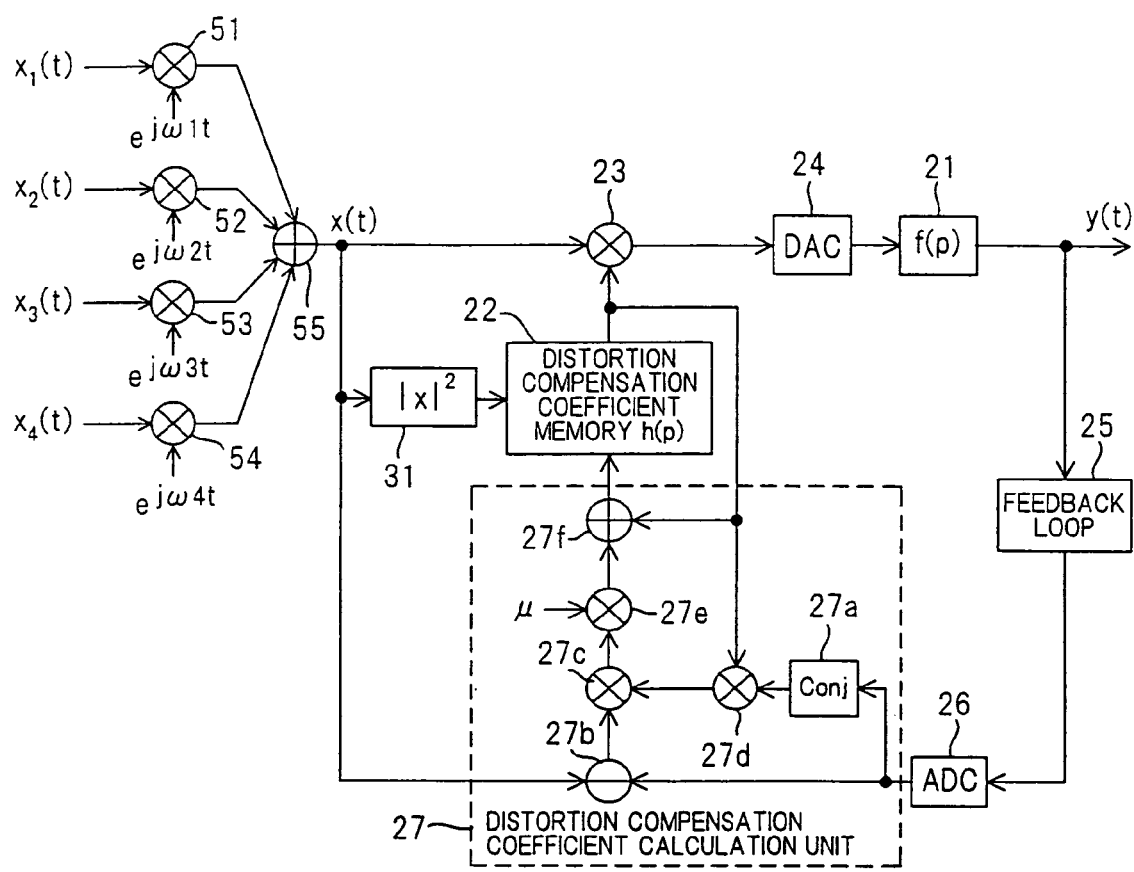
FIG. 9 is a block diagram illustrating a multicarrier-type transmitter to which a distortion compensating apparatus has been added.

The first to sixth embodiments are examples in which the invention is applied to a single-carrier transmitter. However, the invention can be applied to a multicarrier transmitter as well. FIG. 9 is a block diagram showing the construction of a transmitter in a case where a plurality of transmit signals are transmitted using a multicarrier signal. This illustrates an example of a case where four frequencies are multiplexed and transmitted. Digital transmit signals $x_1(t)$, $x_2(t)$, $x_3(t)$, $x_4(t)$ are multiplied by $\exp(j\omega_1 t)$, $\exp(j\omega_2 t)$, $\exp(j\omega_3 t)$, $\exp(j\omega_4 t)$ ($\omega_n = 2\pi f_n$), respectively, by frequency shifters 51, 52, 53, 54, respectively, to effect a frequency shift to frequencies $f_1$, $f_2$, $f_3$, $f_4$, after which these frequencies are frequency-multiplexed by a combiner 55. The digital frequency-multiplexed signal corresponds to the single-carrier transmit signal and subsequently undergoes distortion compensation processing similar to the processing executed in the case of the single carrier.

Figure 10:
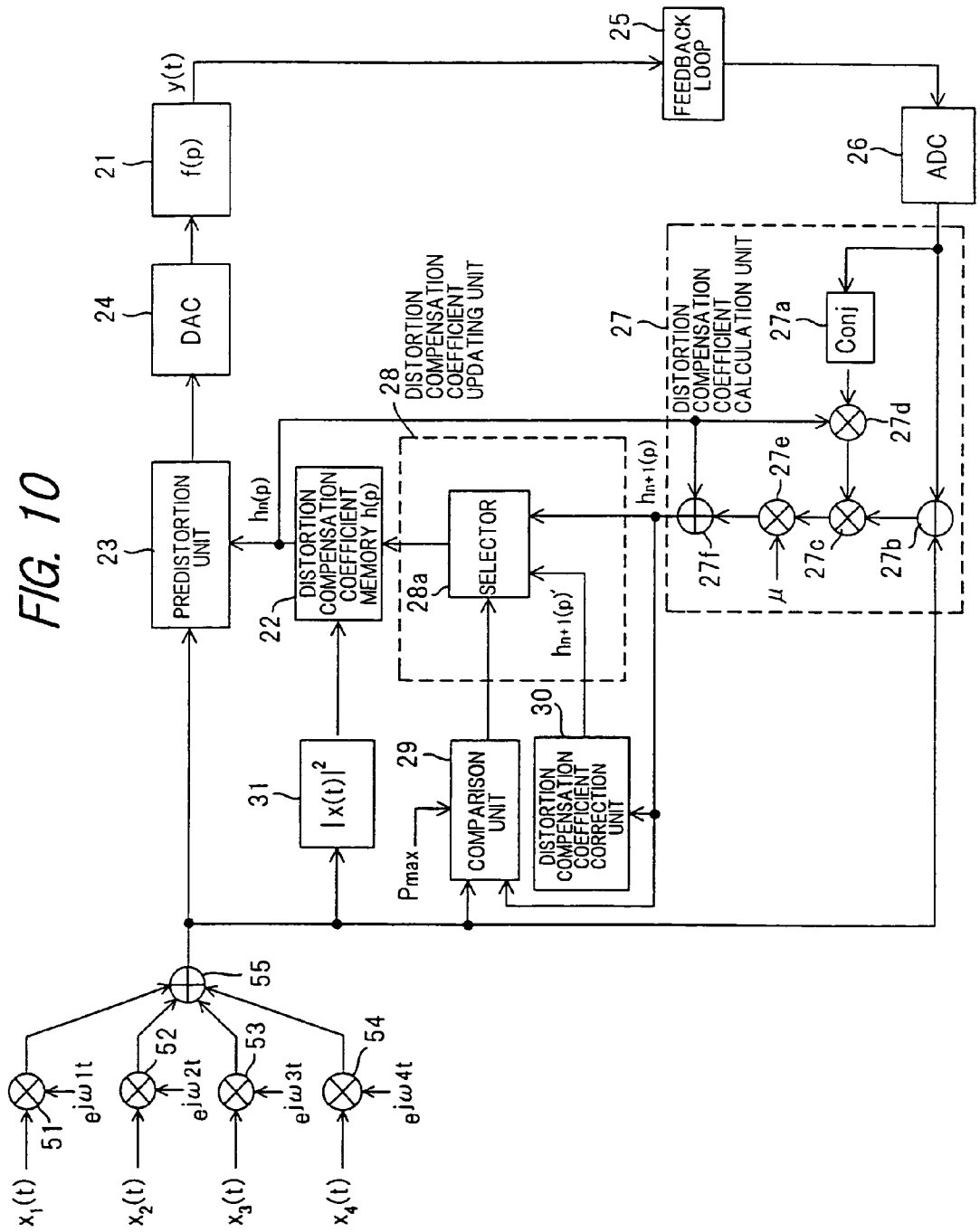
FIG. 10 is a block diagram illustrating the construction of a multicarrier-type distortion compensating apparatus according to a seventh embodiment.

FIG. 10 illustrates a seventh embodiment in which the distortion compensating apparatus of the first, second, fifth and sixth embodiments is applied to the multicarrier transmitter of FIG. 9. Components in FIG. 10 identical with those of the foregoing embodiments are designated by like reference characters.

Figure 11:
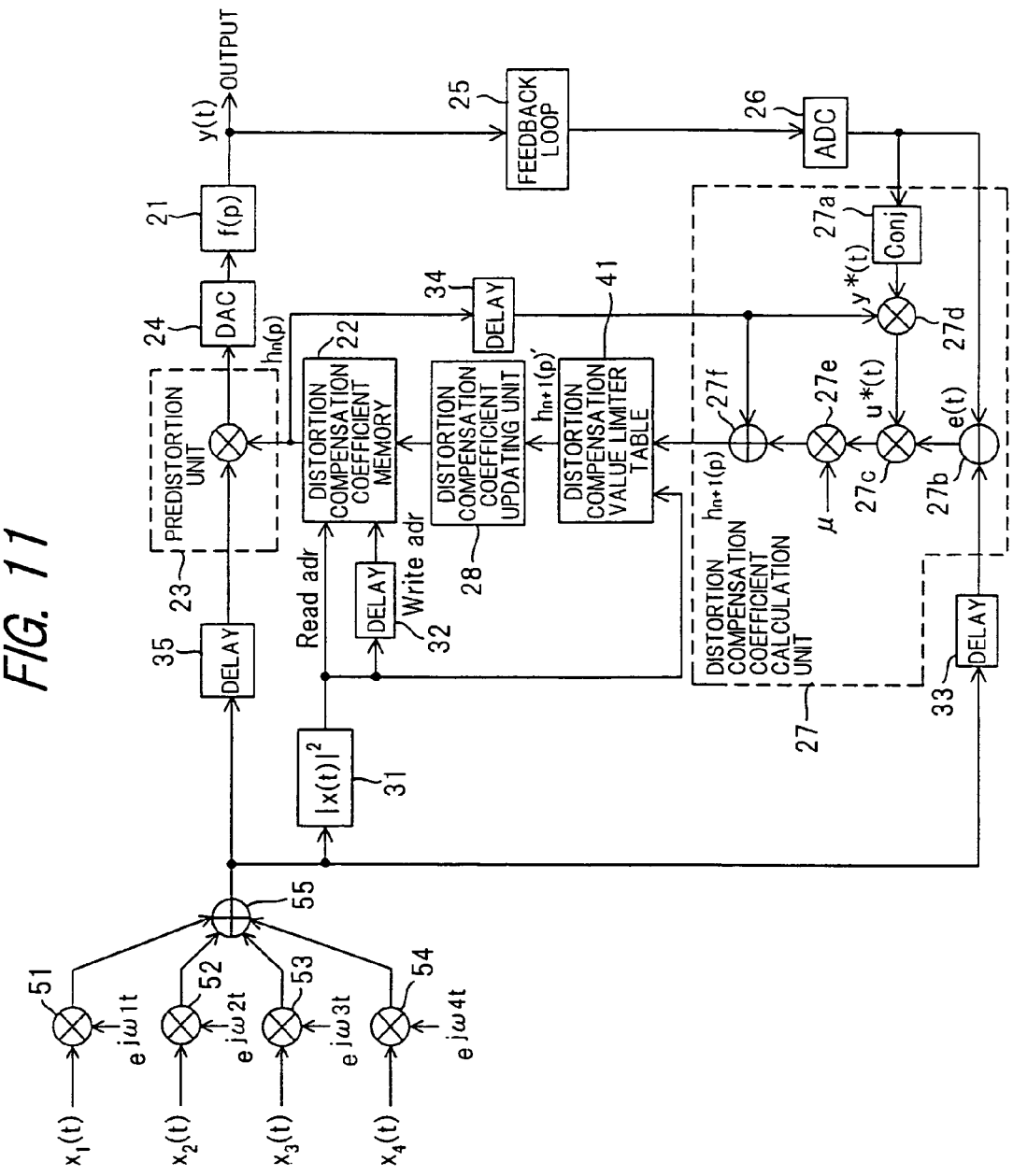
FIG. 11 is a block diagram illustrating the construction of a multicarrier-type distortion compensating apparatus according to an eighth embodiment.

FIG. 11 illustrates an eighth embodiment in which the distortion compensating apparatus of the third embodiment is applied to the multicarrier transmitter of FIG. 9. Components in FIG. 11 identical with those of FIGS. 5 and 9 are designated by like reference characters.

Figure 12:
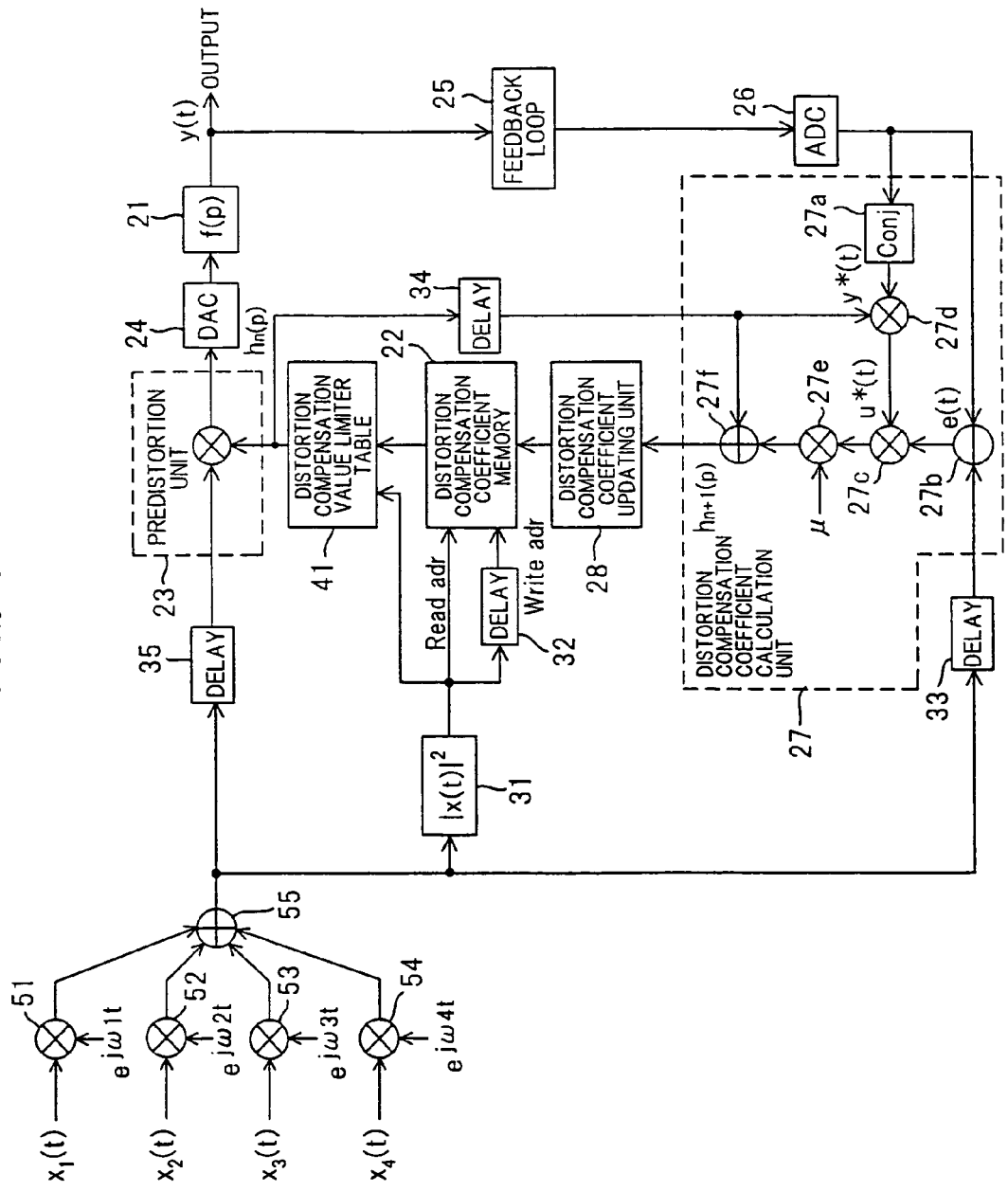
FIG. 12 is a block diagram illustrating the construction of a multicarrier-type distortion compensating apparatus according to a ninth embodiment.

FIG. 12 illustrates a ninth embodiment in which the distortion compensating apparatus of the fourth embodiment is applied to the multicarrier transmitter of FIG. 9. Components in FIG. 12 identical with those of FIGS. 6 and 9 are designated by like reference characters.

(C) Distortion Compensating Apparatus for Combining an Error Signal with a Main Signal and Inputting the Result to a Distortion Device The foregoing embodiments are examples wherein the invention is applied to a distortion compensating apparatus in which a transmit signal is multiplied by a distortion compensation coefficient to generate a distortion-compensated signal and the latter is input to a transmission power amplifier. However, the invention is applicable also to a distortion compensating apparatus in which a main signal (transmit signal) and a distortion component (error signal) appended to the transmit signal are DA-converted independently of each other and then combined and input to the transmission power amplifier. In accordance with the latter distortion compensating apparatus, the amplitude of the error signal is small and therefore the bit precision of a DA converter, which outputs only the error signal, can be reduced. Further, a DA converter that outputs only the transmit signal need not have a large dynamic range and therefore the bit precision of this DA converter can be reduced. These are the advantages of this distortion compensating apparatus.

(a) First Embodiment

Figure 13:
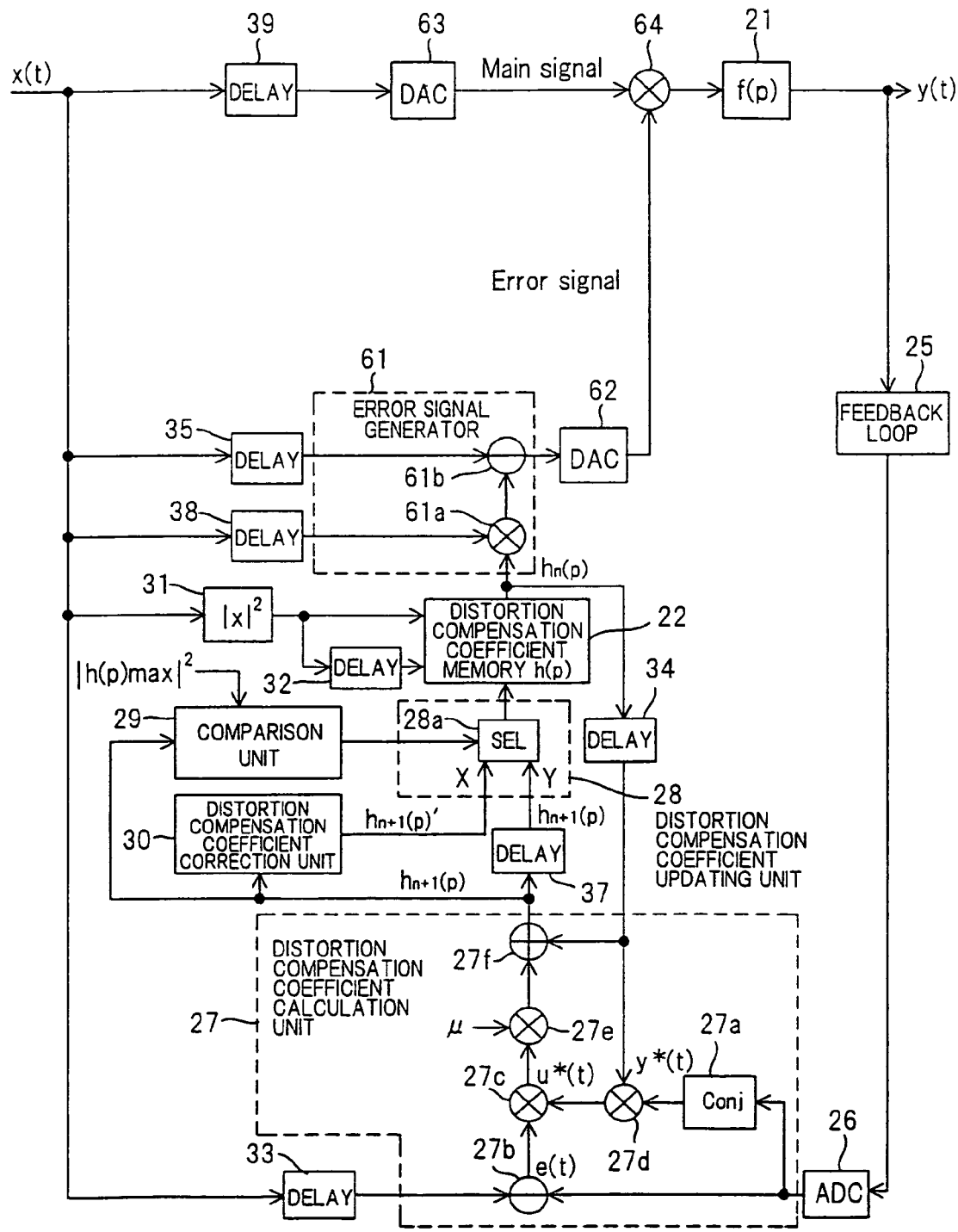
FIG. 13 illustrates a first embodiment in which an analog transmit signal and an error signal are combined and input to a distortion device.

FIG. 13 illustrates a first embodiment of a distortion compensating apparatus for combining an analog transmit signal and an error signal. Components in FIG. 13 identical with those of the embodiments thus far are designated by like reference characters.

As shown in FIG. 13, the apparatus includes the device (the transmission power amplifier) 21 which produces non-linear distortion of a function f(p); the distortion compensation coefficient memory 22 for storing the distortion compensation coefficient h(p), which corrects the distortion of the transmission power amplifier 21, in association with power p ($=|x(t)|^2$) of the transmit signal x(t); the feedback loop 25 for feeding back the output signal y(t) of the transmission power amplifier 21; the AD converter 26 for converting the feedback signal to digital data; the distortion compensation coefficient calculation unit 27 for calculating the distortion compensation coefficient $h_{n+1}(p)$ based upon the transmit signal x(t) before the distortion compensation thereof and the feedback signal; the distortion compensation coefficient updating unit 28, which has the selector 28a, for storing the calculated distortion compensation coefficient $h_{n+1}(p)$ or the corrected distortion compensation coefficient $h_{n+1}(p)'$ in association with the power $|x(t)|^2$ of the transmit signal x(t); and the comparison unit 29 compares the square $|h_{n+1}(p)|^2$ of the distortion compensation coefficient that has been calculated by the distortion compensation coefficient memory 22 and the square $|h(p)_{MAX}|^2$ of the maximum distortion compensation coefficient. The apparatus further includes the distortion compensation coefficient correction unit 30 for correcting the distortion compensation coefficient $h_{n+1}(p)$ to $h_{n+1}(p)/m$ and outputting the corrected value $h_{n+1}(p)'[=h_{n+1}(p)/m]$; the transmit-signal power calculation unit 31 for generating read/write addresses of the distortion compensation coefficient memory 22; and delay circuits 32 to 39 for adjusting timing.

The apparatus further includes an error signal generator 61 having a multiplier 61a for reading the distortion compensation coefficient $h_n(p)$ that conforms to the power $|x(t)|^2$ of the transmit signal out of the memory 22 and subjecting the transmit signal x(t) to complex multiplication by the distortion compensation coefficient $h_n(p)$, and a subtractor 61b for outputting an error signal E(t), which is the difference between the multiplier output signal $x(t)*h_n(p)$ and the transmit signal x(t). The apparatus further includes a DA converter 62 for converting the digital error signal E(t) to an analog signal; a DA converter 63 for converting the transmit signal (main signal) x(t) to an analog signal; and a combiner 64 for combining and outputting the analog transmit signal x(t) and the analog error signal E(t).

The DA converter 62 subjects only the distortion signal (error signal) E(t) to a digital-to-analog conversion. The upper-limit value of the distortion compensation coefficient does not depend upon the transmit signal x(t) and is fixed at a certain value $h(p)_{MAX}$. Accordingly, if the distortion compensation coefficient $h_n(p)$ conforming to the power of the transmit signal falls within a circuit of radius $h(p)_{MAX}$ tangent to a DA converter limit $LH_S$ (see FIG. 14), the DA converter limit $LH_S$ will not be exceeded, regardless of the phase of the distortion compensation coefficient $h_n(p)$, and neither amplitude nor phase will be distorted in the DA converter 24. However, when the output amplitude of the transmission power amplifier 21 rises owing to the action of the distortion function f(p), the difference between the transmit signal x(t) before the distortion compensation thereof and the feedback signal increases and the distortion compensation coefficient $h_{n+1}(p)$ output from the distortion compensation coefficient calculation unit 27 grows larger and exceeds the maximum distortion compensation coefficient $h(p)_{MAX}$. If in such case the distortion compensation coefficient $h_{n+1}(p)$ is stored in the distortion compensation coefficient memory 22 as is without being corrected, this distortion compensation coefficient will be read out of the memory 22, the distortion-compensated signal $h_n(p)$ will exceed the DA converter limit $LH_S$ and both amplitude and phase distortion will be produced in the DA converter 62.

Accordingly, before the distortion compensation coefficient $h_{n+1}(p)$ is stored in the memory 22 following the calculation of this coefficient, the square $|h_{n+1}(p)|^2$ of this distortion compensation coefficient and the square $|h(p)_{MAX}|^2$ of the upper-limit distortion compensation coefficient are compared. When $|h_{n+1}(p)|^2 > |h(p)_{MAX}|^2$ holds, the size of the distortion compensation coefficient is corrected by being multiplied by 1/m while the phase thereof is maintained. If this arrangement is adopted, the DA converter input will be limited in amplitude, the DA converter limit $LH_S$ will no longer be exceeded and neither amplitude distortion nor phase distortion will occur in the DA converter. Moreover, phase follow-up becomes possible because the size of the distortion compensation coefficient $h_{n+1}(p)$ is reduced while the phase thereof is maintained. It should be noted that the reason for squaring is that the distortion compensation coefficient $h_{n+1}(p)$ is a complex number.

Thus, the comparison unit 29 compares the square $|h_{n+1}(p)|^2$ of the distortion compensation coefficient $h_{n+1}(p)$, which has been calculated by the distortion compensation coefficient calculation unit 27, and the square $|h(p)_{MAX}|^2$ of the maximum distortion compensation coefficient. If $|h_{n+1}(p)|^2$ is less than $|h(p)_{MAX}|^2$, the distortion compensation coefficient updating unit 28 stores the calculated distortion compensation coefficient $h_{n+1}(p)$ in the memory 22 without correcting it. If $|h_{n+1}(p)|^2$ is greater than $|h(p)_{MAX}|^2$, the distortion compensation coefficient updating unit 28 stores the distortion compensation coefficient $h_{n+1}(p)'$ in the memory 22.

When distortion compensation processing for the next transmit signal x(t) is subsequently executed, the corrected distortion compensation coefficient $h_n(p)$ is read out of the memory 22, the error signal E(t) is output, the combiner 64 combines the analog main signal (the transmit signal) and the analog error signal, which have been DA-converted independently by the DA converters 62 and 63, respectively, and inputs the resultant signal to the transmission power amplifier. Now the distortion compensation coefficient $h_n(p)$ is smaller than the maximum distortion compensation coefficient $h(p)_{MAX}$ and, as a result, the DA converter 62 produces neither amplitude nor phase distortion.

(b) Second Embodiment

Figure 15:
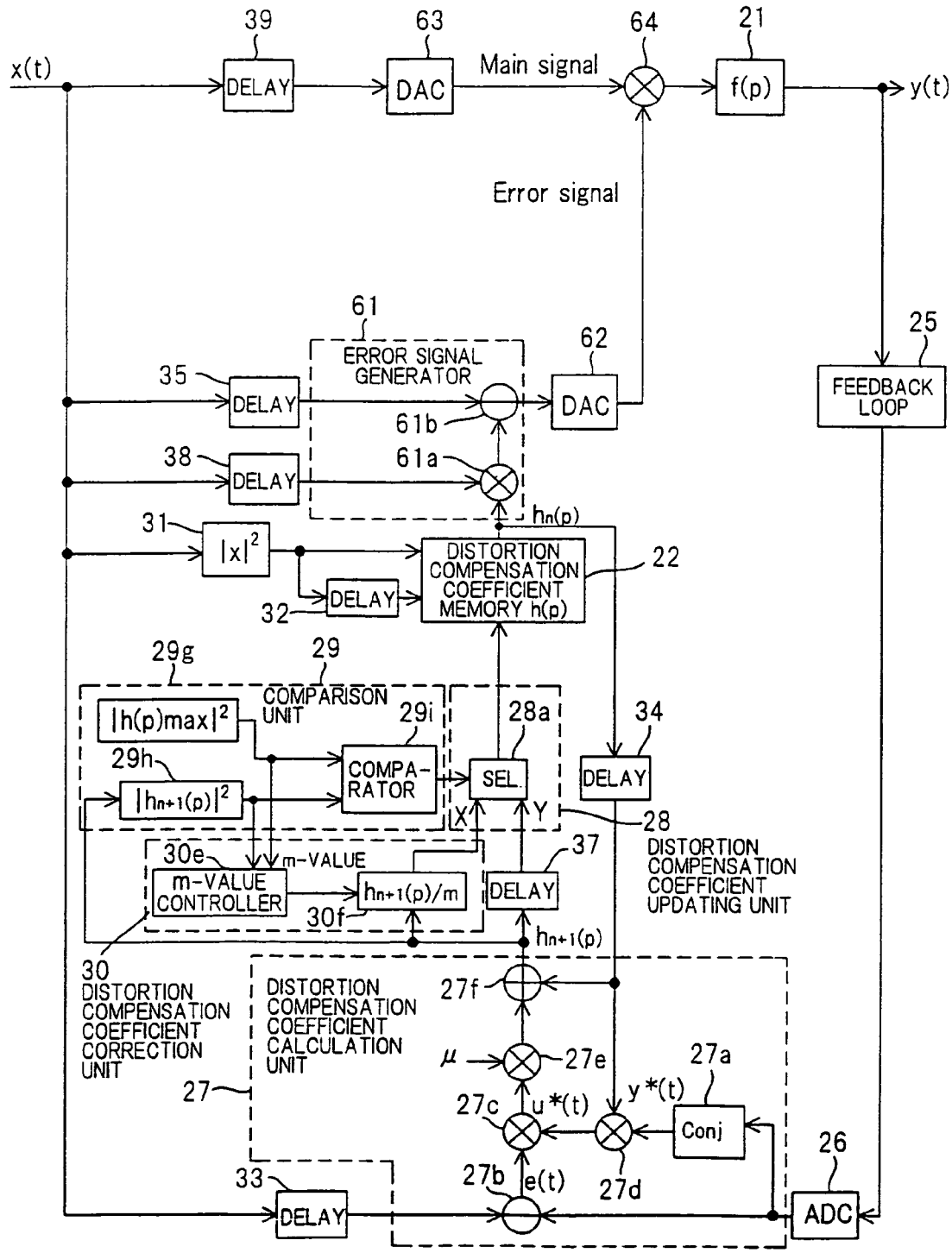
FIG. 15 illustrates a second embodiment in which an analog transmit signal and an error signal are combined and input to a distortion device.

FIG. 15 is a diagram illustrating the construction of a second embodiment of a distortion compensating apparatus for combining an analog transmit signal and an analog error signal, which have been DA-converted independently, and inputting the resultant signal to a transmission power amplifier. Components in FIG. 15 identical with those of the first embodiment of FIG. 13 are designated by like reference characters. This embodiment differs in that the structures of the comparison unit 29 and distortion compensation coefficient correction unit 30 are shown in detail.

The comparison unit 29 has a memory 29g for holding the square $|h(p)_{MAX}|^2$ of the maximum distortion compensation coefficient, an arithmetic unit 29h for calculating the square $|h_{n+1}(p)|^2$ of the distortion compensation coefficient, and a comparator 29i for comparing $|h_{n+1}(p)|^2$ and $|h(p)_{MAX}|^2$. The distortion compensation coefficient correction unit 30, which corrects the distortion compensation coefficient $h_{n+1}(p)$ to $h_{n+1}(p)/m$ so that the square $|h_{n+1}(p)|^2$ of the distortion compensation coefficient will become smaller than the square $|h(p)_{MAX}|^2$ of the maximum distortion compensation coefficient, has an m-value controller 30e and a corrected-value calculation unit 30f. Here m represents a coefficient attenuation ratio and the following relation holds:

$$m^2 = |h_{n+1}(p)|^2 / |h(p)_{MAX}|^2$$

and m is found from $$m = |h_{n+1}(p)| / |h(p)_{MAX}| \tag{8}$$

The m-value controller 30e performs the calculation of Equation (8) to calculate the coefficient attenuation ratio m, and the corrected-value calculation unit 30f outputs the corrected value X of the distortion compensation coefficient upon calculating the same in accordance with the following equation:

$$X = h_{n+1}(p)/m$$

When the distortion compensation coefficient $h_{n+1}(p)$ has been found, the comparison unit 29 compares $|h_{n+1}(p)|^2$ and $|h(p)_{MAX}|^2$. Further, the distortion compensation coefficient correction unit 30 corrects the distortion compensation coefficient $h_{n+1}(p)$ to $h_{n+1}(p)/m$ in such a manner that the square $|h_{n+1}(p)|^2$ of the distortion compensation coefficient will become smaller than the square $|h(p)_{MAX}|^2$ of the maximum distortion compensation coefficient. If $|h_{n+1}(p)|^2$ is less than $|h(p)_{MAX}|^2$, the distortion compensation coefficient updating unit 28 stores the calculated distortion compensation coefficient $h_{n+1}(p)$ in the memory 22 as is without correcting it. If $|h_{n+1}(p)|^2$ is greater than $|h(p)_{MAX}|^2$, the distortion compensation coefficient updating unit 28 stores the corrected value $h_{n+1}(p)'$ of the distortion compensation coefficient in the memory 22.

When distortion compensation processing for the next transmit signal x(t) is subsequently executed, the corrected distortion compensation coefficient $h_n(p)$ is read out of the memory 22, the error signal E(t) is output, the combiner 64 combines the transmit signal and the error signal, which have been DA-converted independently by the DA converters 62 and 63, respectively, and inputs the resultant signal to the transmission power amplifier. Now the distortion compensation coefficient $h_n(p)$ is smaller than the maximum distortion compensation coefficient $h(p)_{MAX}$ and, as a result, the DA converter 62 produces neither amplitude nor phase distortion.

(c) Third Embodiment

Figure 16:
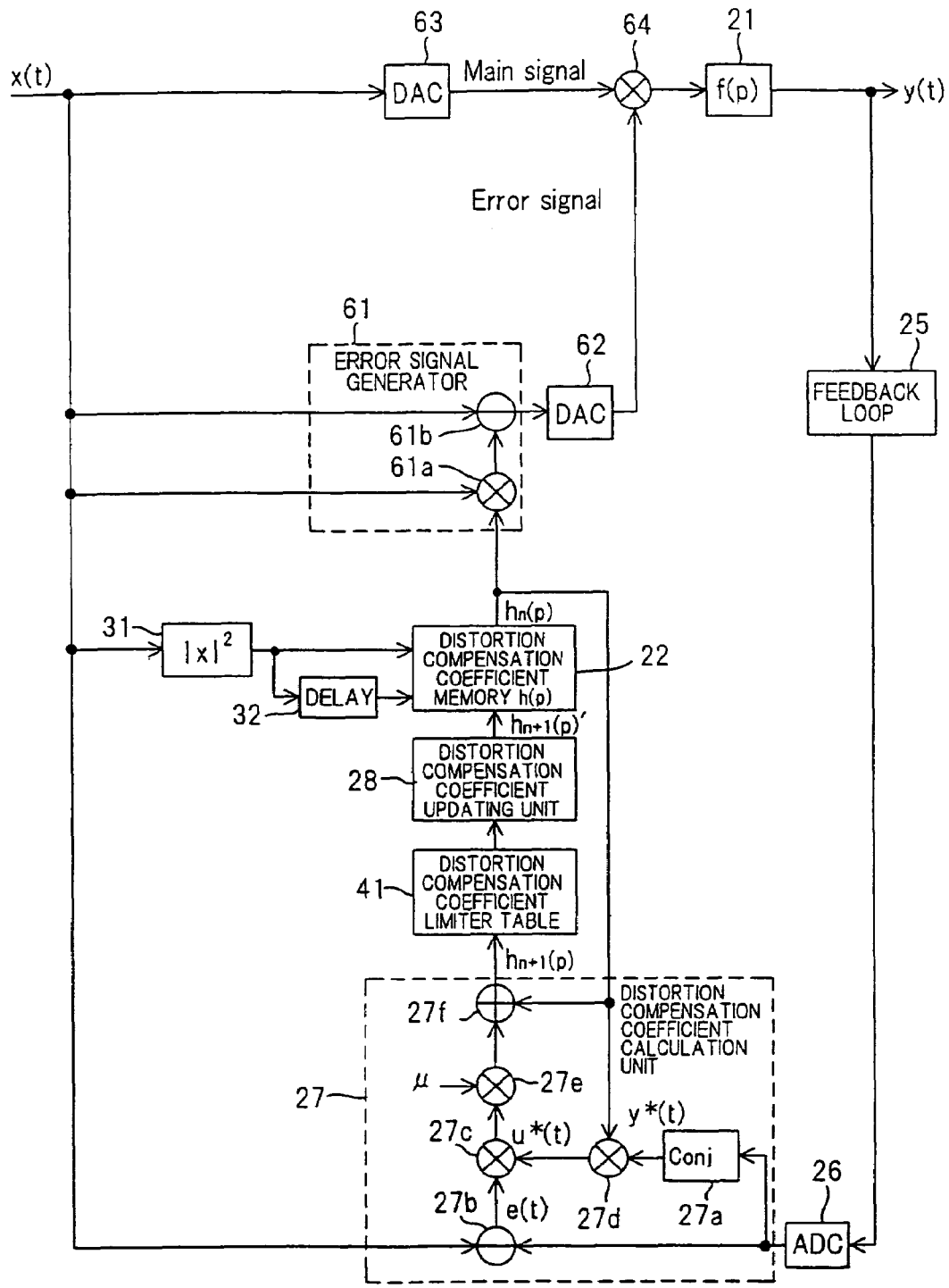
FIG. 16 illustrates a third embodiment in which an analog transmit signal and an error signal are combined and input to a distortion device.

FIG. 16 is a diagram illustrating the construction of a third embodiment of a distortion compensating apparatus for combining an analog transmit signal and an analog error signal, which have been DA-converted independently, and inputting the resultant signal to a transmission power amplifier. Components in FIG. 16 identical with those of the first embodiment of FIG. 13 are designated by like reference characters. This embodiment differs in the following respects:

(1) a corrected value $h_{n+1}(p)'$ of the distortion compensation coefficient is stored in the distortion compensation value limiter table 41 beforehand in association with $h_{n+1}(p)$;

(2) the corrected value $h_{n+1}(p)'$ of a desired distortion compensation coefficient is read out of the table 41 and stored in the distortion compensation coefficient memory 22;

(3) the comparison unit 29 and distortion compensation coefficient correction unit 30 are deleted; and (4) the delay circuits are deleted.

The distortion compensation value limiter table 41 is created as follows: The distortion compensation coefficient $h_{n+1}(p)$ is corrected to $h_{n+1}(p)/m$ so that the square $|h_{n+1}(p)|^2$ of the distortion-compensated signal will become less than the square $|h(p)_{MAX}|^2$ of the maximum distortion compensation coefficient. The corrected value $h_{n+1}(p)'[=h_{n+1}(p)/m]$ is then put into table form in association with $h_{n+1}(p)$. In this case, if $|h_{n+1}(p)|^2$ is smaller than $|h(p)_{MAX}|^2$, the distortion compensation coefficient $h_{n+1}(p)$ is not corrected and is put into table form in association with $h_{n+1}(p)$ as is.

When the distortion compensation coefficient calculation unit 27 calculates the distortion compensation coefficient $h_{n+1}(p)$ in distortion compensation processing, the distortion compensation coefficient updating unit 28 obtains, from table 41, the corrected value $h_{n+1}(p)'$ of the distortion compensation coefficient conforming to the distortion compensation coefficient $h_{n+1}(p)$ and stores this value in the distortion compensation coefficient memory 22.

When distortion compensation processing for the next transmit signal x(t) is subsequently executed, the corrected distortion compensation coefficient $h_n(p)$ is read out of the memory 22, the error signal E(t) is output, the combiner 64 combines the transmit signal and the error signal, which have been DA-converted independently by the DA converters 62 and 63, respectively, and inputs the resultant signal to the transmission power amplifier. Now the distortion compensation coefficient $h_n(p)$ is smaller than the maximum distortion compensation coefficient $h(p)_{MAX}$ and, as a result, the DA converter 62 produces neither amplitude nor phase distortion.

(d) Fourth Embodiment

Figure 17:
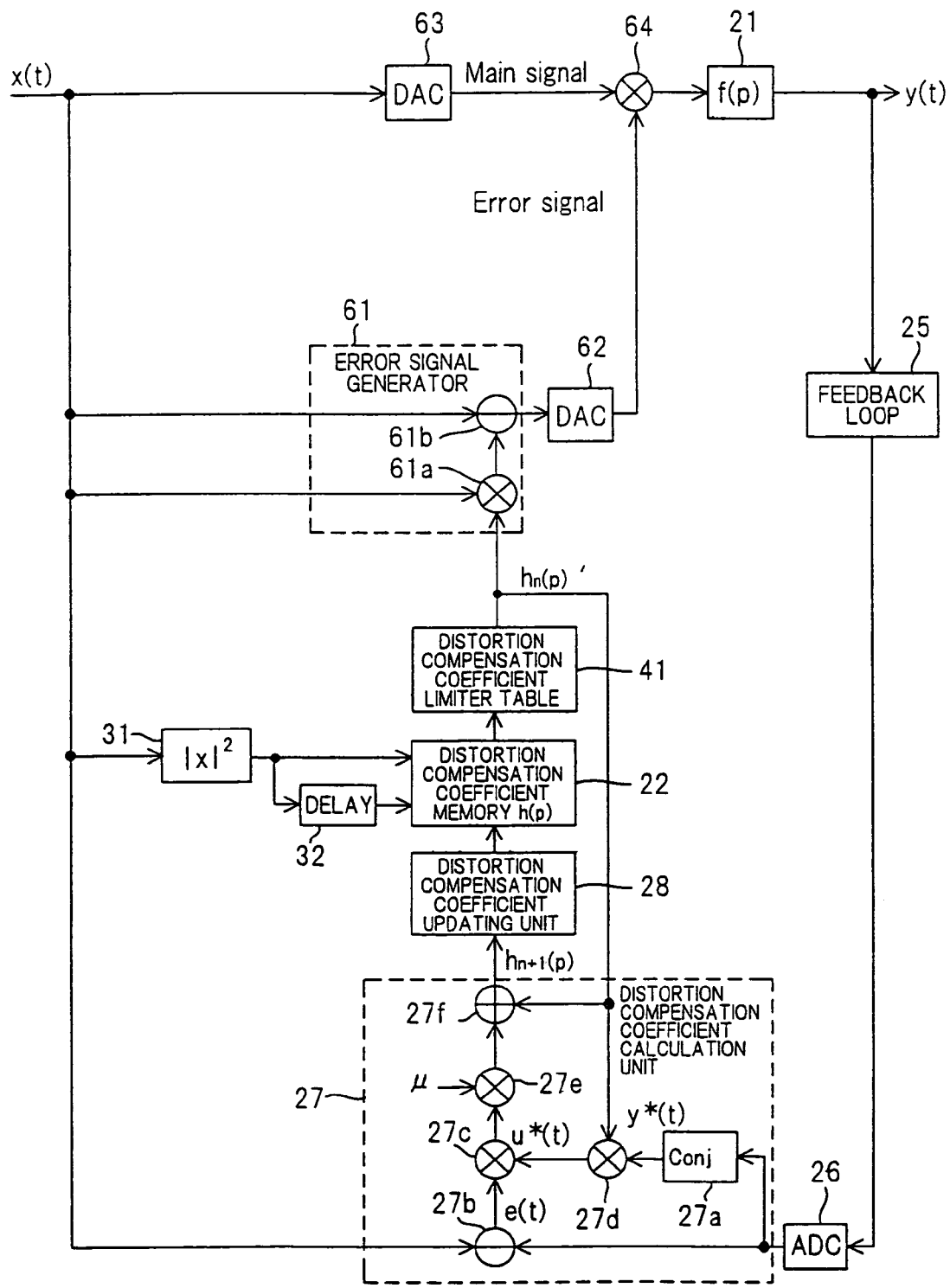
FIG. 17 illustrates a fourth embodiment in which an analog transmit signal and an error signal are combined and input to a distortion device.

FIG. 17 is a diagram illustrating the construction of a fourth embodiment of a distortion compensating apparatus for combining an analog transmit signal and an analog error signal, which have been DA-converted independently, and inputting the resultant signal to a transmission power amplifier. Components in FIG. 17 identical with those of FIG. 13 are designated by like reference characters. This embodiment differs in the location of the table 41. In the third embodiment, the table 41 is provided on the input side of the distortion compensation coefficient memory 22. In the fourth embodiment, however, the table 41 is provided on the output side of the distortion compensation coefficient memory 22. In the fourth embodiment, in other words, the distortion compensation coefficient is corrected using the table 41 after the distortion compensation coefficient is read out of the memory 22.

When the distortion compensation coefficient calculation unit 27 calculates the distortion compensation coefficient $h_{n+1}(p)$ in distortion compensation processing, the distortion compensation coefficient updating unit 28 stores the distortion compensation coefficient $h_{n+1}(p)$ in the distortion compensation coefficient memory 22 as is. When distortion compensation processing for the next transmit signal x(t) is executed and the distortion compensation coefficient $h_n(p)$ is read out of the memory 22, the error signal generator 61 obtains the distortion compensation coefficient $h_n(p)'$ conforming to the distortion compensation coefficient $h_n(p)$ from the table 41 and outputs the error signal E(t), and the combiner 64 combines the transmit signal and the error signal, which have been DA-converted independently by the DA converters 62 and 63, respectively, and inputs the resultant signal to the transmission power amplifier 21.

(e) Embodiment Applied to Multicarrier Transmitter

Figure 18:
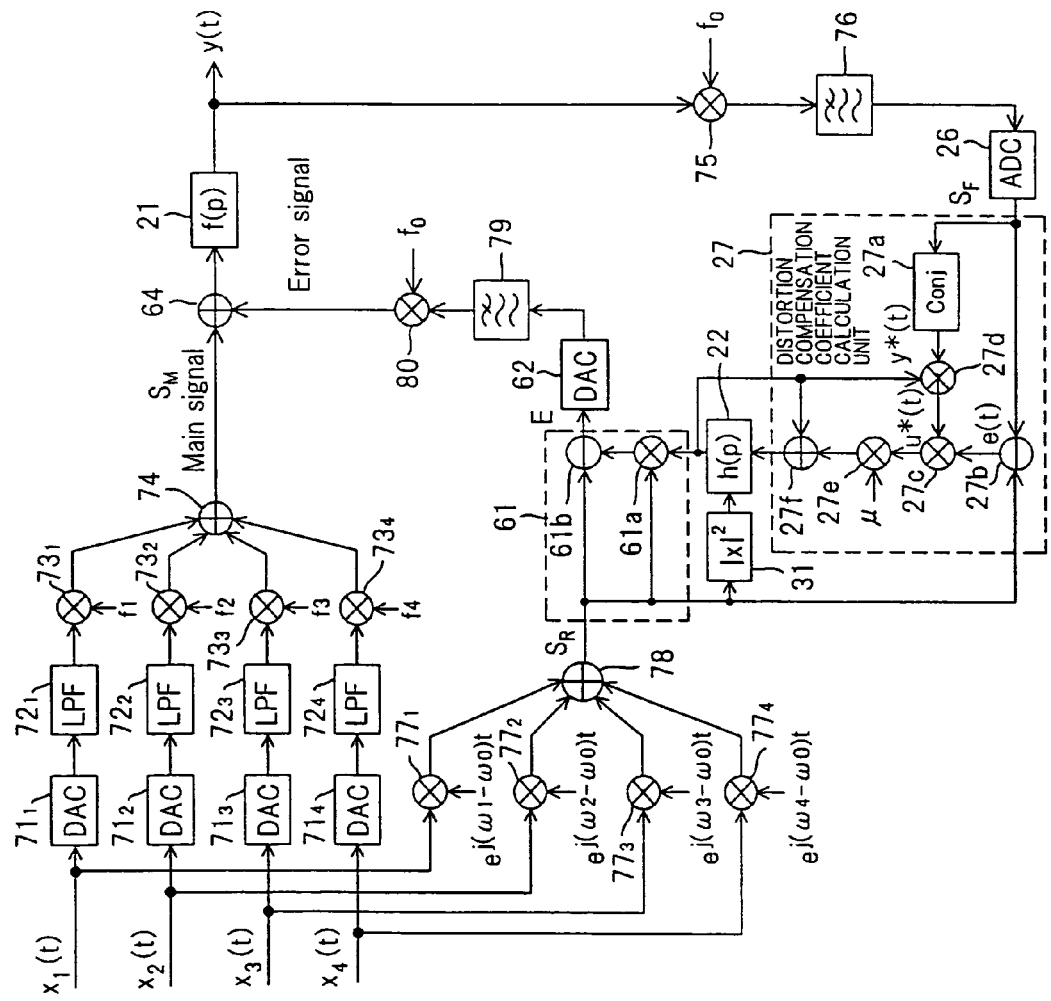
FIG. 18 is a block diagram illustrating a multicarrier-type transmitter to which a distortion compensating apparatus has been added.

The first to fourth embodiments are examples in which the invention is applied to a single-carrier transmitter. However, the invention can be applied to a multicarrier transmitter as well. FIG. 18 is a block diagram showing the construction of a transmitter in a case where a plurality of transmit signals are transmitted using a multicarrier signal. This illustrates an example of a case where four frequencies are multiplexed and transmitted.

Transmit signals $x_1(t)$, $x_2(t)$, $x_3(t)$, $x_4(t)$ of the respective carriers are converted to analog signals by independent DA converters $71_1$, $71_2$, $71_3$, $71_4$, respectively. Upon passing through filters $72_1$, $72_2$, $72_3$, $72_4$, the analog signals are frequency-converted to desired carrier frequencies $f_1$, $f_2$, $f_3$, $f_4$ [see (a) in FIG. 19] by frequency converters $73_1$, $73_2$, $73_3$, $73_4$, respectively, and these frequencies are then frequency-multiplexed by a combiner 74.

The frequency-multiplexed signal (main signal) $S_M$ obtained is combined with the error signal E(t), which is output from the error signal generator 61, by the combiner 64, and the resultant signal enters the transmission power amplifier 21. Part of the output of the transmission power amplifier 21 is frequency-converted to a multiplexed signal of frequencies $f_1$-$f_0$, $f_2$-$f_0$, $f_3$-$f_0$, $f_4$-$f_0$ by a frequency converter 75, the signal passes through a filter 76 and is AD-converted by the AD converter 26, and the digital signal is input to the distortion compensation coefficient calculation unit 27 as a feedback signal $S_F$.

Meanwhile, the transmit signals $x_1(t)$, $x_2(t)$, $x_3(t)$, $x_4(t)$ are multiplied by $\exp j(\omega_1-\omega_0)t$, $\exp j(\omega_2-\omega_0)t$, $\exp j(\omega_3-\omega_0)t$, $\exp j(\omega_4-\omega_0)t$ (where $\omega_n=2\pi f_n$), respectively, by frequency shifters $77_1$, $77_2$, $77_3$, $77_4$, respectively, to effect a frequency shift to the frequencies $f_1$-$f_0$, $f_2$-$f_0$, $f_3$-$f_0$, $f_4$-$f_0$ [see (b) in FIG. 19], after which these frequencies are frequency-multiplexed by a combiner 78. The multiplexed signal is input to the distortion compensating apparatus as a referential signal $S_R$.

The distortion compensating apparatus outputs an error signal E, which gives rise to non-linear distortion in the transmission power amplifier 21, upon calculating the error signal using the referential signal $S_R$ and the feedback signal $S_F$. The DA converter 62 DA-converts the error signal E obtained and inputs the analog signal to a frequency converter 80 via a filter 79. The frequency converter 80 multiplies the error signal E by a signal of frequency $f_0$ to thereby effect an up-conversion to an error signal of frequencies $f_1$, $f_2$, $f_3$, $f_4$. The combiner 64 combines the main signal (transmit signal) $S_M$ of frequencies $f_1$, $f_2$, $f_3$, $f_4$ and the error signal E of frequencies $f_1$, $f_2$, $f_3$, $f_4$ and inputs the combined signal to the transmission power amplifier 21. Thus there is obtained a signal that is the result of providing the frequency-multiplexed signal (main signal) with a characteristic that is the reverse of the non-linear distortion of the amplifier.

Figure 20:
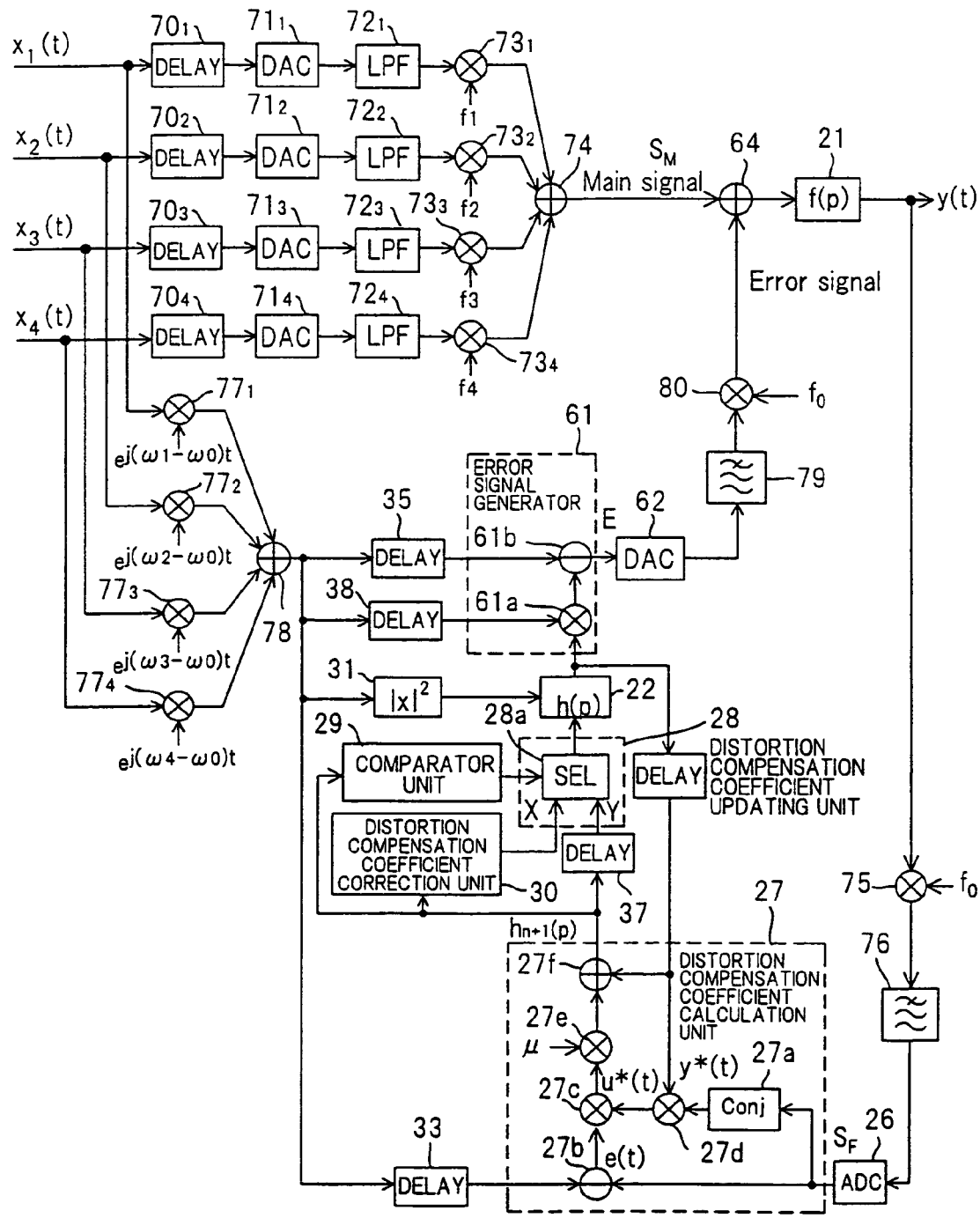
FIG. 20 is a block diagram illustrating the construction of a multicarrier-type distortion compensating apparatus according to a fifth embodiment.

FIG. 20 illustrates a fifth embodiment of a case where the distortion compensating apparatus according to the first embodiment of FIG. 13 is applied to the multicarrier transmitter of FIG. 18. Components identical with those in FIGS. 13 and 18 are designated by like reference characters. Here numerals $70_1$ to $70_3$ denote delay circuits for adjusting timing.

Figure 21:
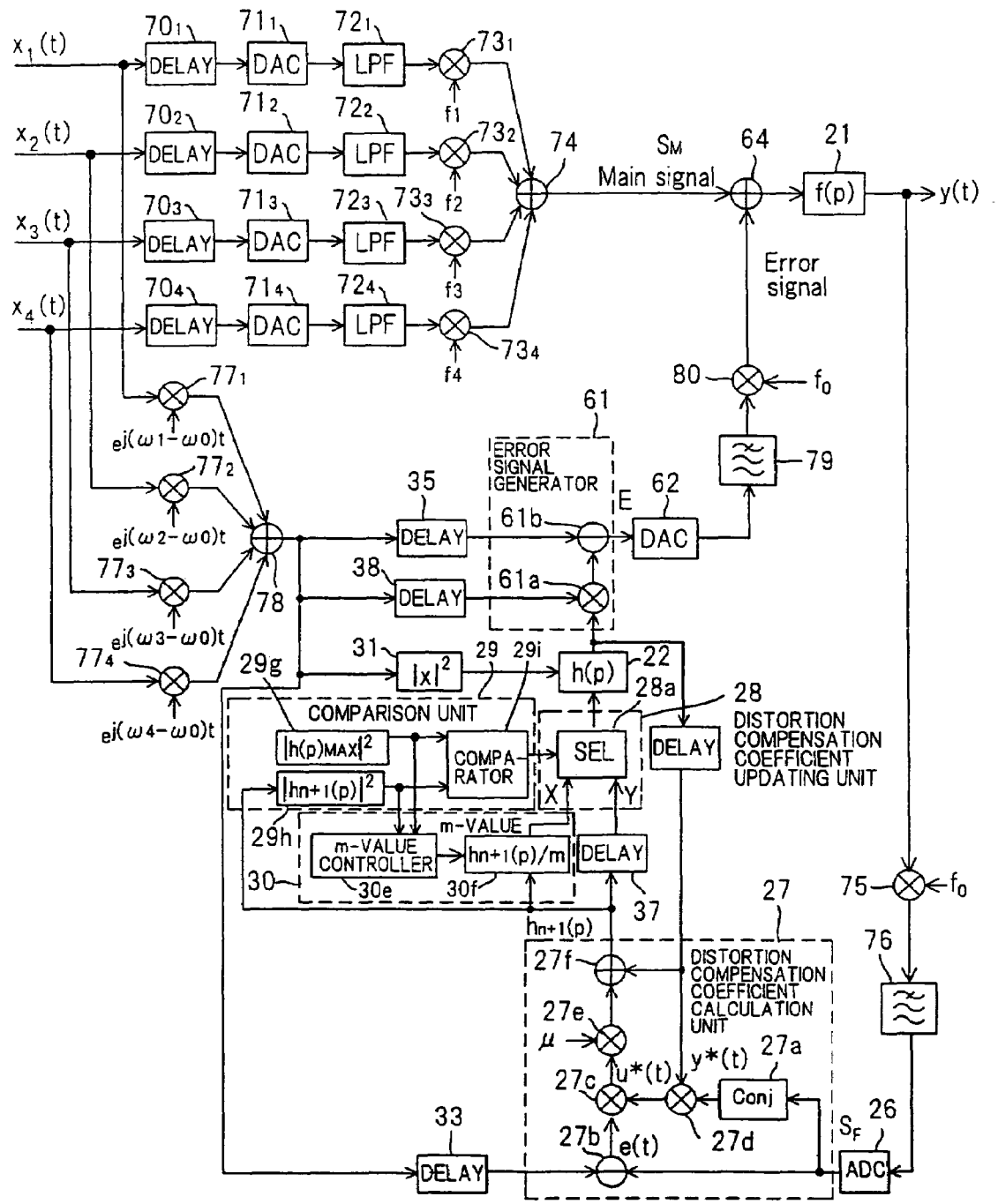
FIG. 21 is a block diagram illustrating the construction of a multicarrier-type distortion compensating apparatus according to a sixth embodiment.

FIG. 21 illustrates a sixth embodiment of a case where the distortion compensating apparatus according to the second embodiment of FIG. 15 is applied to the multicarrier transmitter of FIG. 18. Components identical with those in FIGS. 15 and 18 are designated by like reference characters.

Figure 22:
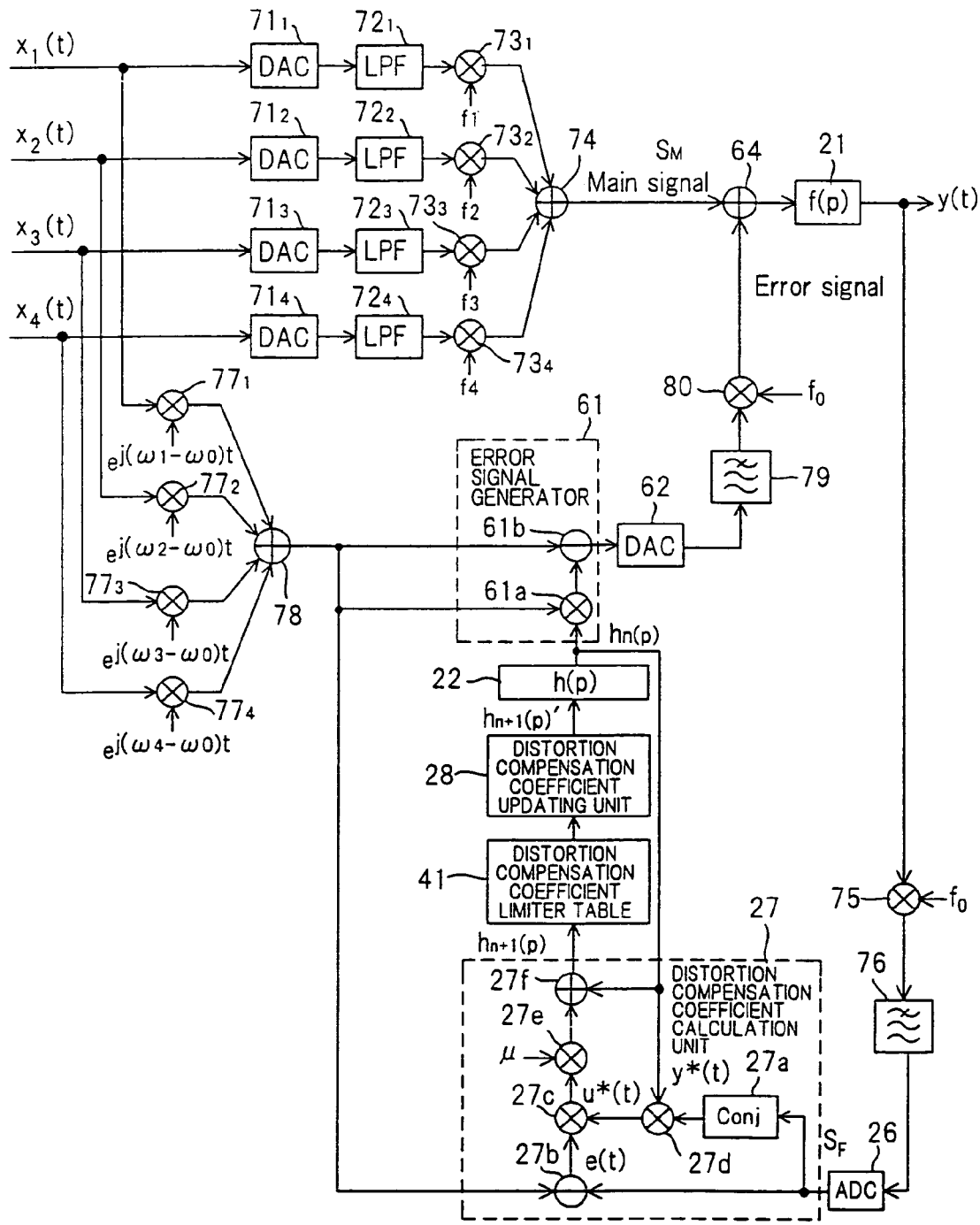
FIG. 22 is a block diagram illustrating the construction of a multicarrier-type distortion compensating apparatus according to a seventh embodiment.

FIG. 22 illustrates a seventh embodiment of a case where the distortion compensating apparatus according to the third embodiment of FIG. 16 is applied to the multicarrier transmitter of FIG. 18. Components identical with those in FIGS. 16 and 18 are designated by like reference characters.

Figure 23:
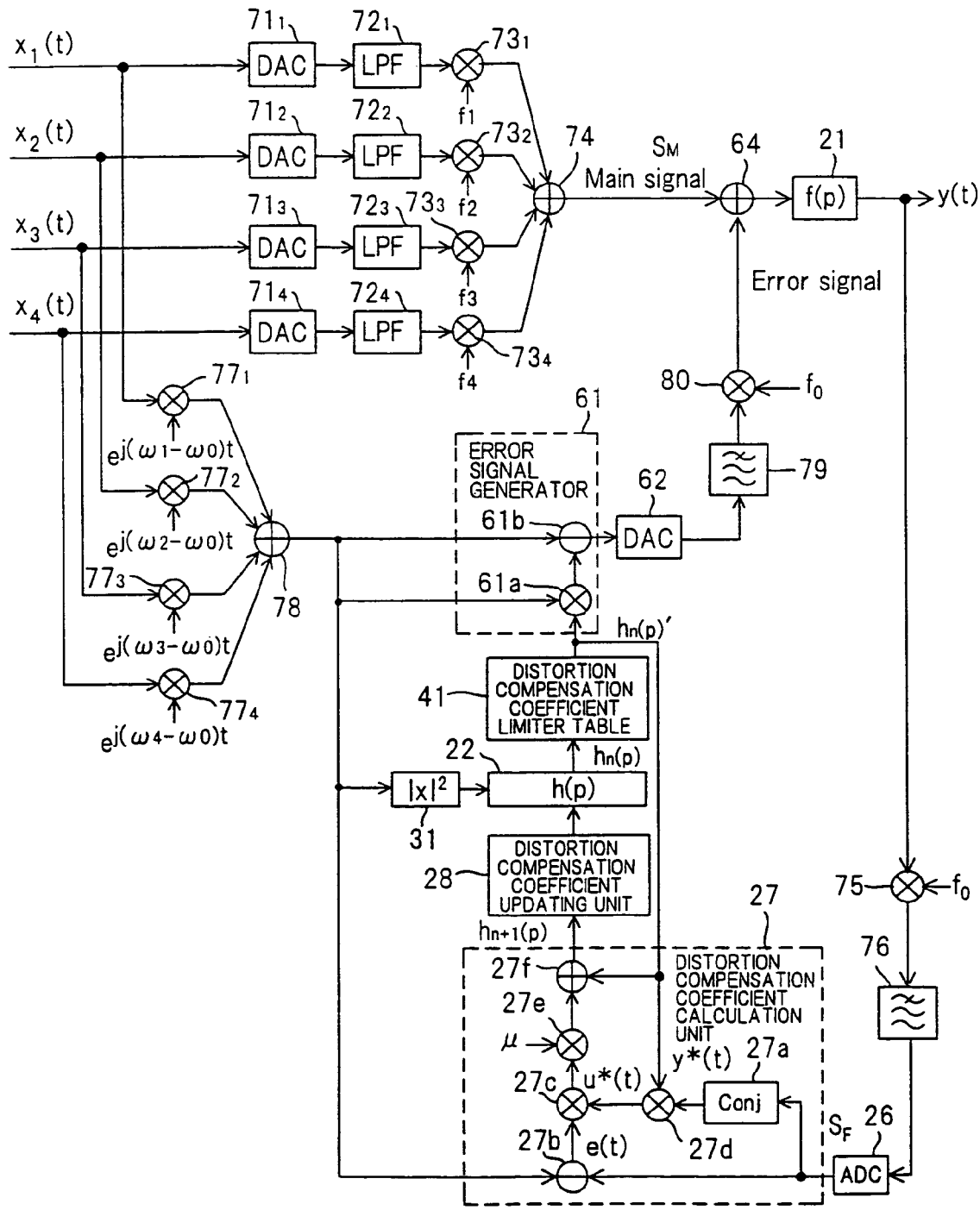
FIG. 23 is a block diagram illustrating the construction of a multicarrier-type distortion compensating apparatus according to an eighth embodiment.

FIG. 23 illustrates an eighth embodiment of a case where the distortion compensating apparatus according to the fourth embodiment of FIG. 17 is applied to the multicarrier transmitter of FIG. 18. Components identical with those in FIGS. 17 and 18 are designated by like reference characters.

(f) Embodiment Applied to Different Multicarrier Transmitter

Figure 24:
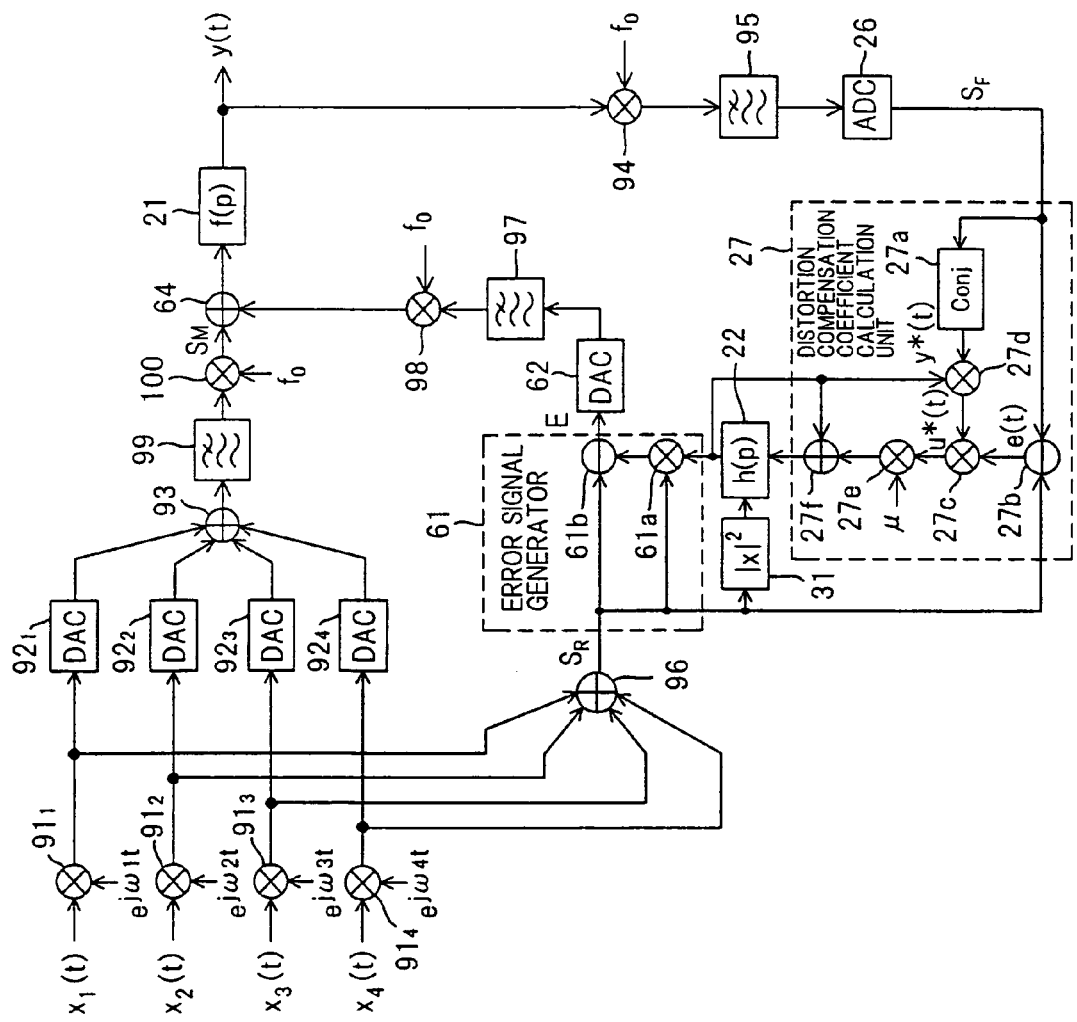
FIG. 24 is a block diagram illustrating another multicarrier-type transmitter to which a distortion compensating apparatus has been added.

FIG. 24 is a block diagram showing the construction of another transmitter in a case where a plurality of transmit signals are transmitted using a multicarrier signal. This illustrates an example of a case where four frequencies are multiplexed and transmitted.

Figure 25:
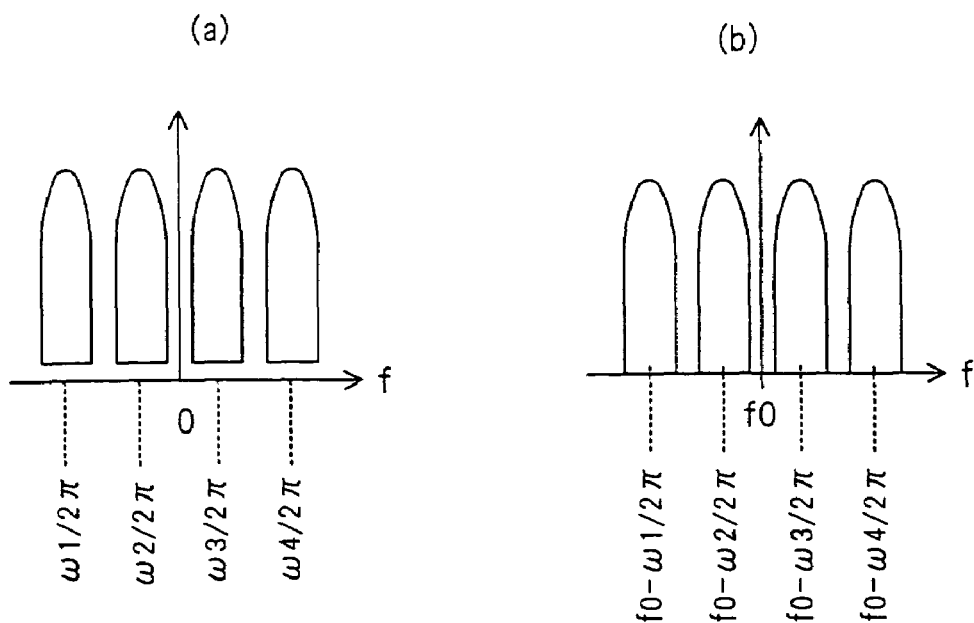
FIG. 25 is a diagram useful in describing a frequency conversion.

Transmit signals $x_1(t)$, $x_2(t)$, $x_3(t)$, $x_4(t)$ of the respective carriers are multiplied by $expj\omega_1 t$, $expj\omega_2 t$, $expj\omega_3 t$, $expj\omega_4 t$ (where $\omega_n=2\pi f_n$), respectively, by frequency shifters $91_1$, $91_2$, $91_3$, $91_4$, respectively, to effect a frequency shift to the frequencies $f_1$, $f_2$, $f_3$, $f_4$ [see (a) in FIG. 25], after which these frequencies are converted to analog signals by independent DA converters $92_1$, $92_2$, $92_3$, $92_4$. The analog signals are frequency-multiplexed by a combiner 93. The frequency-multiplexed signal passes through a low-pass filter 99 and then is shifted to high-frequency bands $f_0$-$f_1$, $f_0$-$f_2$, $f_0$-$f_3$, $f_0$-$f_4$ by a frequency shifter 100 (see (b) in FIG. 25) to obtain a main signal $S_M$, which enters the combiner 64. Thereafter, the frequency-multiplexed signal (main signal) $S_M$ is combined with the error signal E, which is output from the error signal generator 61, by the combiner 64, and the resultant signal is input to the transmission power amplifier 21. Part of the output of the transmission power amplifier 21 is frequency-converted to a low-frequency band multiplexed signal of frequencies $f_1$, $f_2$, $f_3$, $f_4$ by a frequency converter 94, the signal passes through a filter 95 and is AD-converted by the AD converter 26, and the digital signal is input to the distortion compensation coefficient calculation unit 27 as the feedback signal $S_F$.

The outputs of the frequency shifters $91_1$-$91_4$ are frequency-multiplexed by a combiner 96, after which the resultant signal is input to the distortion compensating apparatus as the referential signal $S_R$.

The distortion compensating apparatus outputs an error signal E, which gives rise to non-linear distortion in the transmission power amplifier 21, upon calculating the error signal using the referential signal $S_R$ and the feedback signal $S_F$. The DA converter 62 DA-converts the error signal E obtained and inputs the analog signal to a frequency converter 98 via a filter 97. The frequency converter 98 multiplies the error signal E of frequencies $f_1$, $f_2$, $f_3$, $f_4$ by a signal of frequency $f_0$ to thereby effect a shift to high-frequency bands $f_0$-$f_1$, $f_0$-$f_2$, $f_0$-$f_3$, $f_0$-$f_4$. The combiner 64 combines the main signal (transmit signal) $S_M$ and the error signal E and inputs the combined signal to the transmission power amplifier 21. Thus there is obtained a signal that is the result of providing the frequency-multiplexed signal (main signal) with a characteristic that is the reverse of the non-linear distortion of the amplifier.

Figure 26:
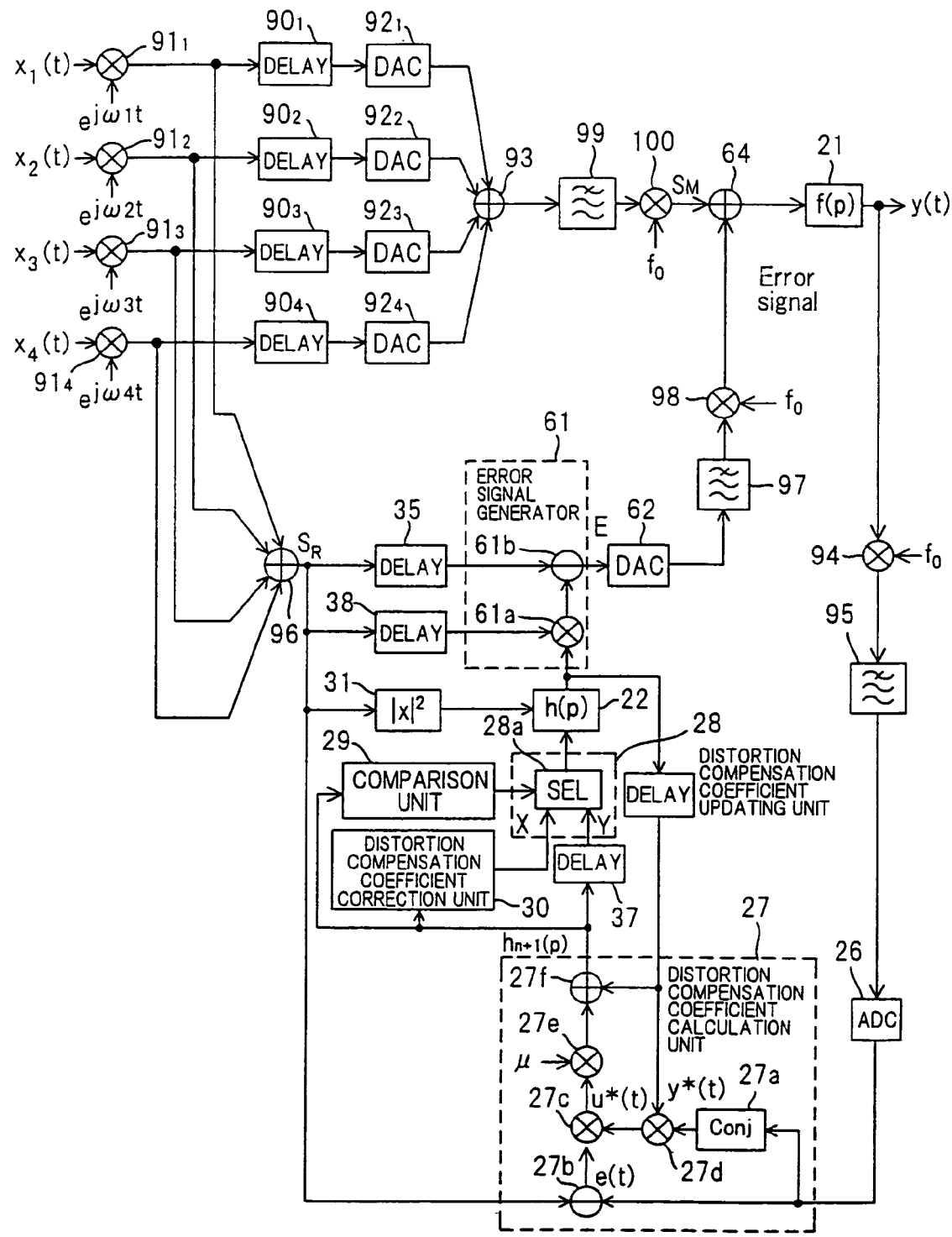
FIG. 26 is a block diagram illustrating the construction of a multicarrier-type distortion compensating apparatus according to a ninth embodiment.

FIG. 26 illustrates a ninth embodiment of a case where the distortion compensating apparatus according to the first embodiment of FIG. 13 is applied to the multicarrier transmitter of FIG. 24. Components identical with those in FIGS. 13 and 24 are designated by like reference characters. Reference characters $90_1$, to $90_3$ denote delay circuits for adjusting timing.

Figure 27:
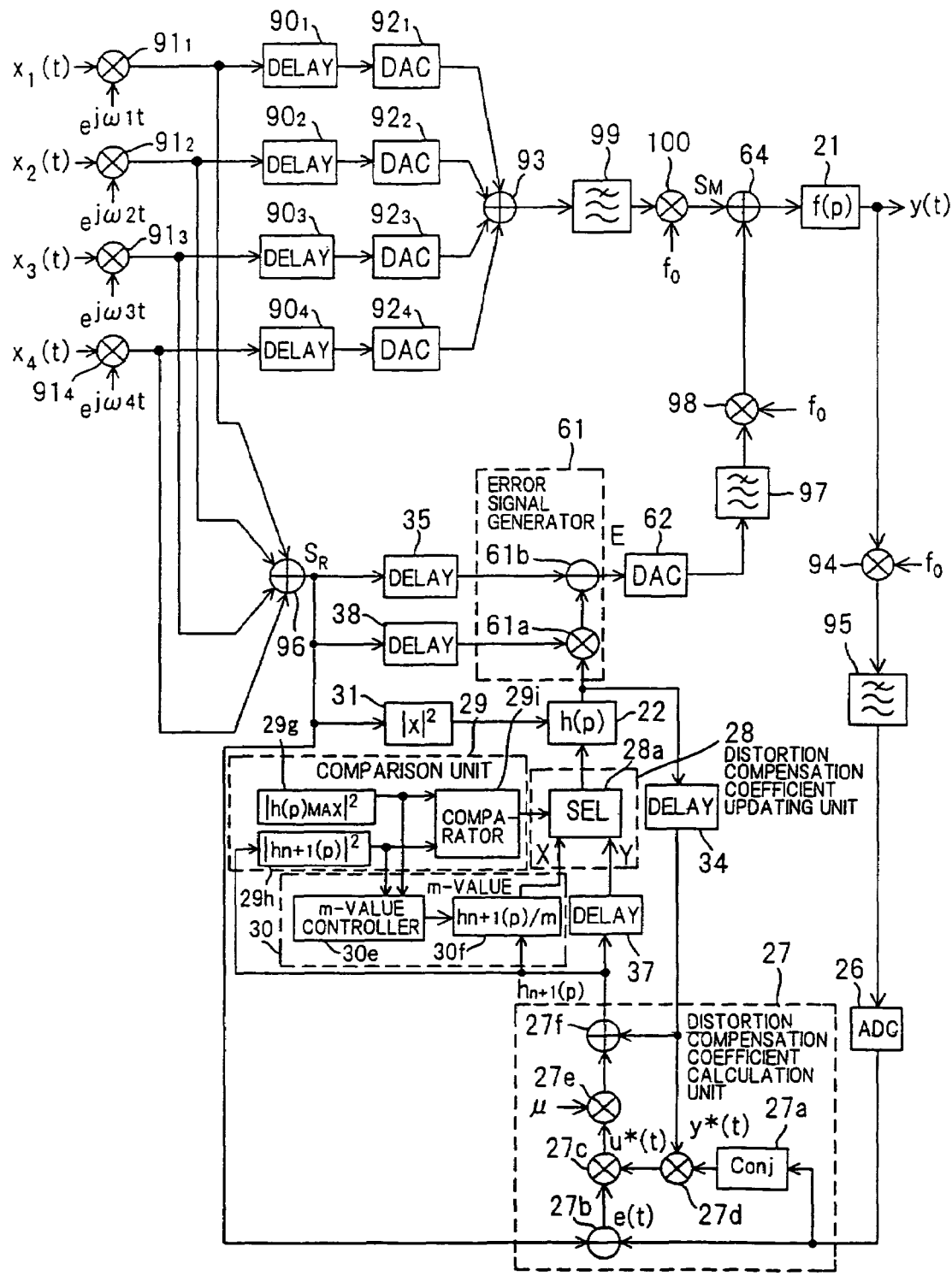
FIG. 27 is a block diagram illustrating the construction of a multicarrier-type distortion compensating apparatus according to a tenth embodiment.

FIG. 27 illustrates a tenth embodiment of a case where the distortion compensating apparatus according to the second embodiment of FIG. 15 is applied to the multicarrier transmitter of FIG. 24. Components identical with those in FIGS. 16 and 24 are designated by like reference characters.

Figure 28:
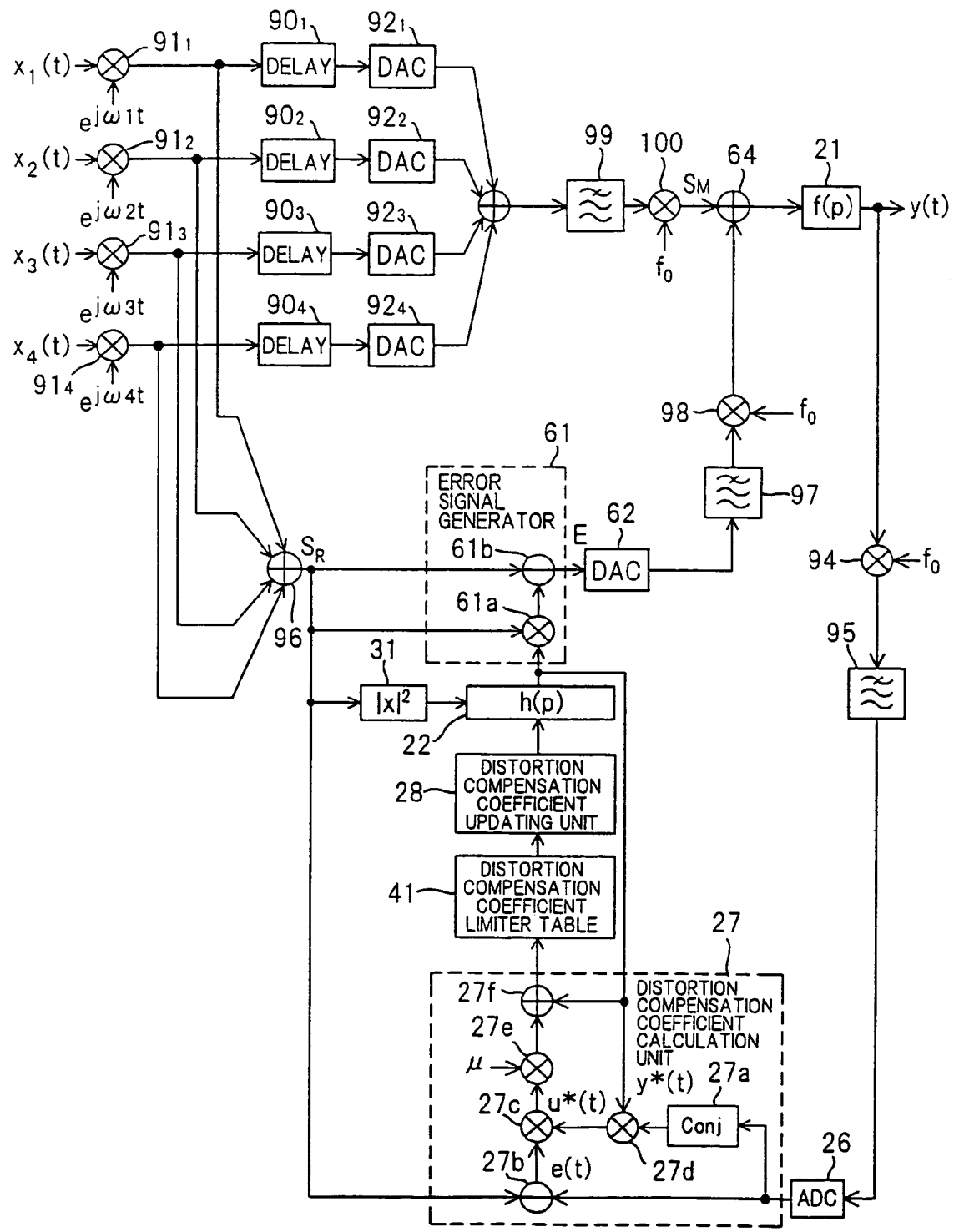
FIG. 28 is a block diagram illustrating the construction of a multicarrier-type distortion compensating apparatus according to an 11th embodiment.

FIG. 28 illustrates an 11th embodiment of a case where the distortion compensating apparatus according to the third embodiment of FIG. 16 is applied to the multicarrier transmitter of FIG. 24. Components identical with those in FIGS. 17 and 24 are designated by like reference characters.

Figure 29:
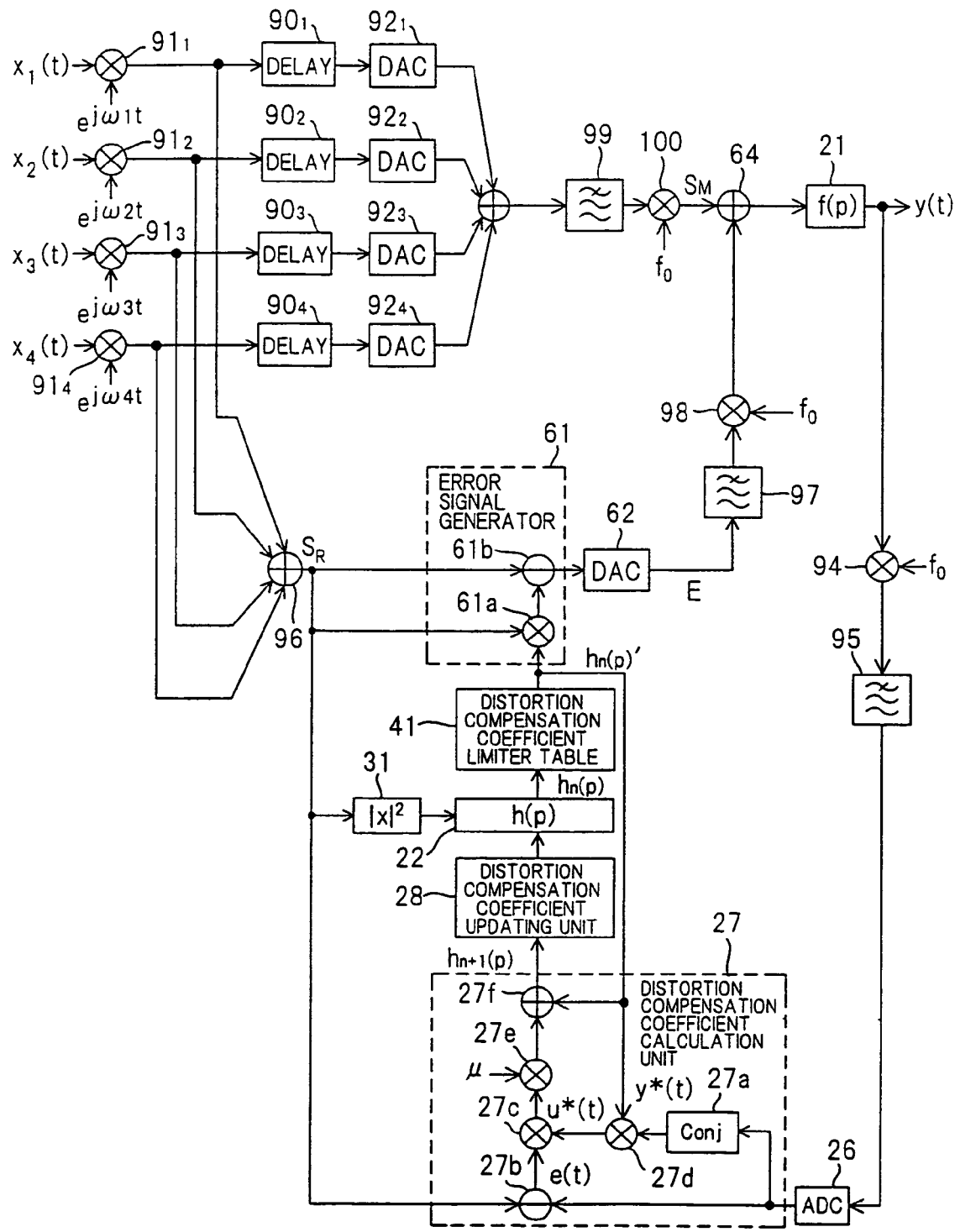
FIG. 29 is a block diagram illustrating the construction of a multicarrier-type distortion compensating apparatus according to a 12th embodiment.

FIG. 29 illustrates a 12th embodiment of a case where the distortion compensating apparatus according to the fourth embodiment of FIG. 17 is applied to the multicarrier transmitter of FIG. 24. Components identical with those in FIGS. 15 and 24 are designated by like reference characters.

(D) Distortion Compensating Apparatus Having Function for Controlling Amplitude of Feedback Signal In the foregoing embodiments, a distortion compensation coefficient is corrected to exercise control in such a manner that a transmit signal that has undergone distortion compensation processing will not exceed a limit level. In the embodiments that follow, however, the amplitude of a feedback signal from a transmission power amplifier is controlled so that a transmit signal that has undergone distortion compensation processing will not exceed a limit level.

(a) First Embodiment

Figure 30:
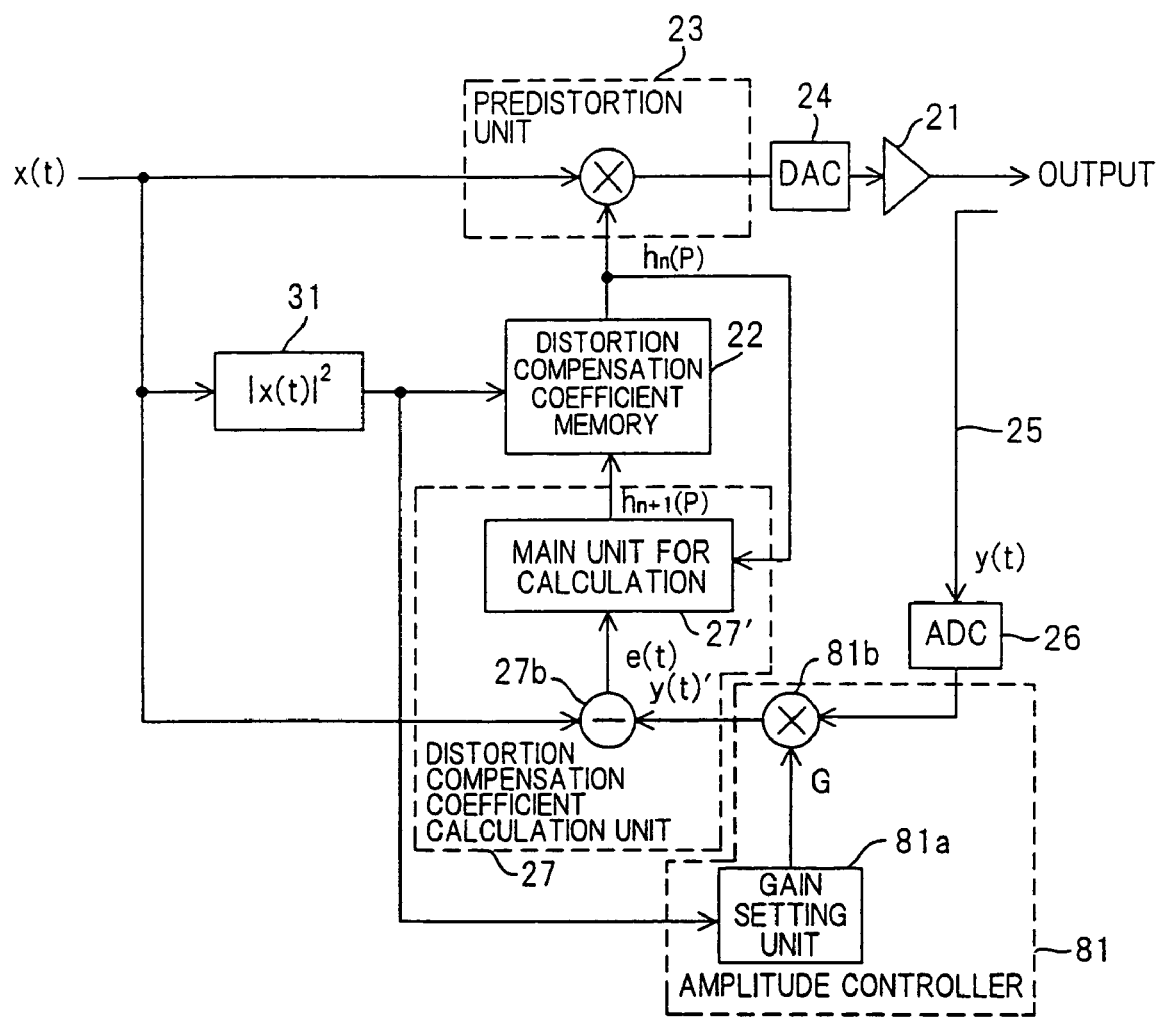
FIG. 30 illustrates a first embodiment of a distortion compensating apparatus having a function for controlling the amplitude of a feedback signal.

FIG. 30 is a diagram showing the construction of a distortion compensating apparatus according to a first embodiment for controlling the amplitude of the feedback signal y(t) based upon the amplitude or power of the transmit signal x(t). The apparatus includes the device (the transmission power amplifier) 21 which produces non-linear distortion of a function f(p); the distortion compensation coefficient memory 22 for storing the distortion compensation coefficient h(p), which corrects the distortion of the transmission power amplifier 21, in association with power p $(=|x(t)|^2)$ of the transmit signal x(t); a predistortion unit 23 for reading the distortion compensation coefficient $h_n(p)$ conforming to the power p of the transmit signal x(t) out of the memory 22 and applying distortion compensation processing$[=x(t)*h_n(p)]$ to the transmit signal x(t) using this distortion compensation coefficient $h_n(p)$; the DA converter 24 for converting the digital transmit signal $x(t)*h_n p$, which is the result of the applied distortion compensation processing, to an analog signal; the feedback loop 25 for feeding back the output signal y(t) of the transmission power amplifier 21; the AD converter 26 for converting the output signal, namely the feedback signal y(t), to digital data; the distortion compensation coefficient calculation unit 27 for calculating a distortion compensation coefficient $h_{n+1}(p)$ based upon the transmit signal x(t) before the distortion compensation thereof and the feedback signal y(t); the transmit-signal power calculation unit 31 for generating read/write addresses of the distortion compensation coefficient memory 22; and an amplitude controller 81 for controlling the amplitude of the feedback signal y(t) based upon the amplitude or power $|x(t)|^2$ of the transmit signal x(t) before the latter is compensated for distortion.

The distortion compensation coefficient calculation unit 27 has a structure identical with that shown in FIG. 3 but only the subtractor 27b for calculating the difference e(t) between the transmit signal x(t) prior to the distortion compensation thereof and the feedback signal is shown. The other components are illustrated as a main unit 27' for calculating the distortion compensation coefficient. The amplitude controller 81 has a gain setting unit 81a for storing the corresponding relationship between the amplitude or power of the transmit signal x(t) and gain and for outputting a gain G that conforms to the transmit signal x(t), and a multiplier 81b for multiplying the feedback signal y(t) by the gain G.

The amplitude and phase of the output signal are not distorted in the linear region of the transmission power amplifier 21. In the non-linear region of the transmission power amplifier 21, however, the difference e(t) between the transmit signal x(t) before the distortion compensation thereof and the feedback signal y(t) increases and so does the distortion compensation coefficient $h_{n+1}(p)$ output from the distortion compensation coefficient calculation unit 27. The distortion compensation coefficient $h_{n+1}(p)$ eventually is read out and the predistortion unit 23 outputs the distortion-compensated signal $x(t)*h_{n+1}(p)$. If the distortion-compensated signal $x(t)*h_{n+1}(p)$ exceeds the DA converter limit, amplitude distortion and phase distortion occur in the DA converter. The larger the transmit signal, the greater the tendency for the above. If some measures are not taken, therefore, amplitude and phase distortion will occur in the non-linear region of the power amplifier.

Accordingly, in the non-linear region, the amplitude controller 81 performs control based upon the uncompensated transmit signal x(t) so as to raise the amplitude of the feedback signal y(t) in such a manner that the difference e(t) between the two signals will not increase. If this arrangement is adopted, the distortion compensation coefficient $h_{n+1}(p)$ can be prevented from increasing, the distortion-compensated signal $x(t)*h_{n+1}(p)$ can be prevented from exceeding the DA converter limit and amplitude and phase distortion can be prevented from occurring.

Figure 31A:
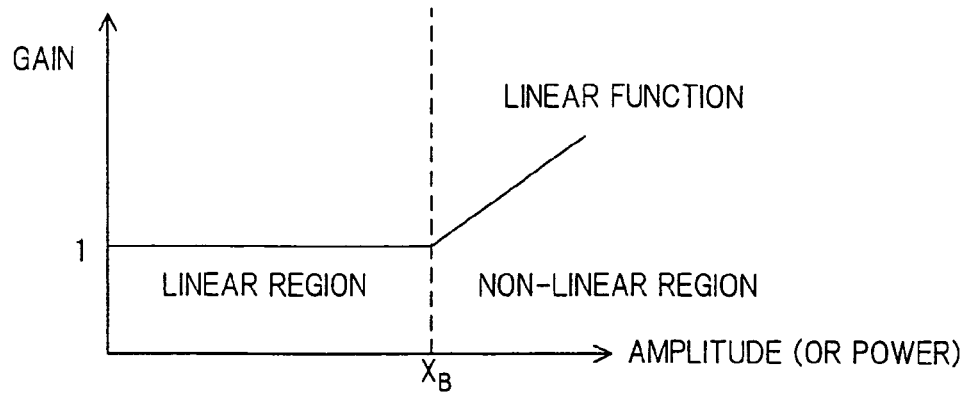
FIGS. 31A to 31C are diagrams useful in describing the relationship between transmit-signal amplitude (power) and gain.
Figure 31B:
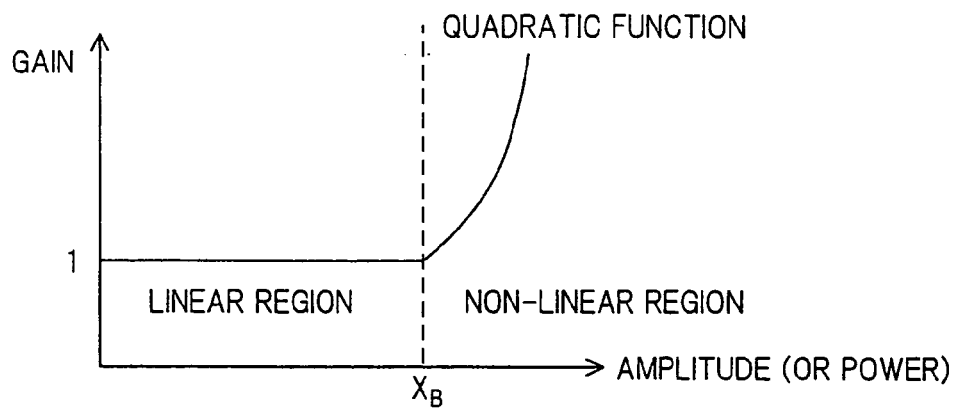
Figure 31C:
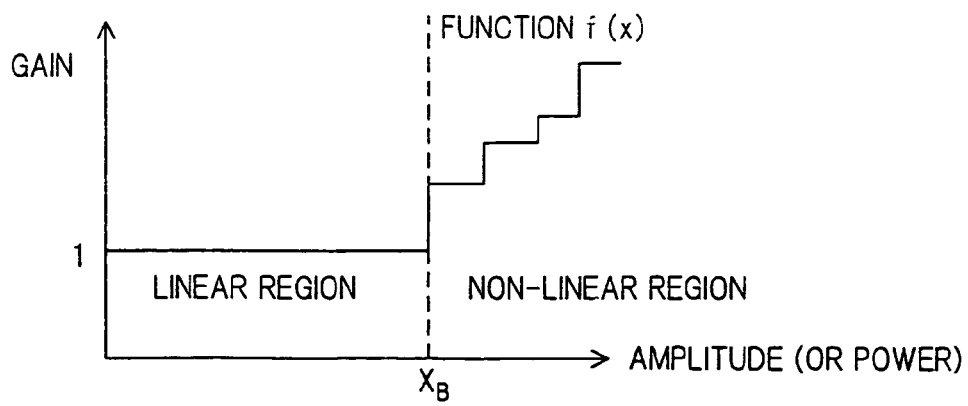

It should be noted that the difference e(t) between the transmit signal x(t) and feedback signal y(t) increases as the degree of non-linearity of the transmission power amplifier rises, i.e., as the level of the uncompensated transmit signal x(t) rises. Accordingly, a gain vs. amplitude characteristic (or gain vs. power characteristic) illustrated in any one of FIGS. 31A to 31C is set in the gain setting unit 81a. FIG. 31A illustrates a characteristic in which the gain G is fixed at 1 in the linear region of the transmission power amplifier 21 and rises in accordance with a linear function of the transmit-signal amplitude (or power) in the non-linear region. FIG. 31B illustrates a characteristic in which the gain G rises in accordance with a quadratic function of the transmit-signal amplitude (or power) in the non-linear region. FIG. 31C illustrates a characteristic in which the gain G rises in steps in accordance with the transmit-signal amplitude (or power) in the non-linear region.

Since gain G=1 holds when the transmit signal x(t) prior to the distortion compensation thereof is below a linear/non-linear boundary signal $X_B$, the amplitude controller 81 does not change the level of the feedback signal y(t). However, if the transmit signal x(t) prior to the distortion compensation thereof exceeds the linear/non-linear boundary signal $X_B$, the gain G becomes greater than 1 in accordance with the set function of the gain setting unit 81a. As a consequence, the amplitude controller 81 outputs y(t)'=G·y(t) (G>1) to reduce the difference e(t) output from the subtractor 27b. As a result, the distortion compensation coefficient $h_{n+1}(p)$ can be prevented from increasing, the distortion-compensated signal $x(t)*h_{n+1}(p)$ can be prevented from exceeding the DA converter limit and the occurrence of amplitude and phase distortion can be suppressed.

The foregoing relates to a case where gain is controlled in accordance with the characteristics of FIGS. 31A to 31C in the non-linear region. However, gain can be controlled in accordance with any function without being limited to these characteristics. Further, in the case described above, gain G is varied instantaneously. However, an arrangement may be adopted in which gain is varied up to the set value asymptotically in time in the manner of an exponential function, or in which gain is varied up to the set value in the manner of a linear function. In other words, the function of the gain G is chosen taking into consideration the characteristics of the power amplifier and the characteristics of the feedback loop. Time control of the gain G also is decided in similar fashion.

Figure 32:
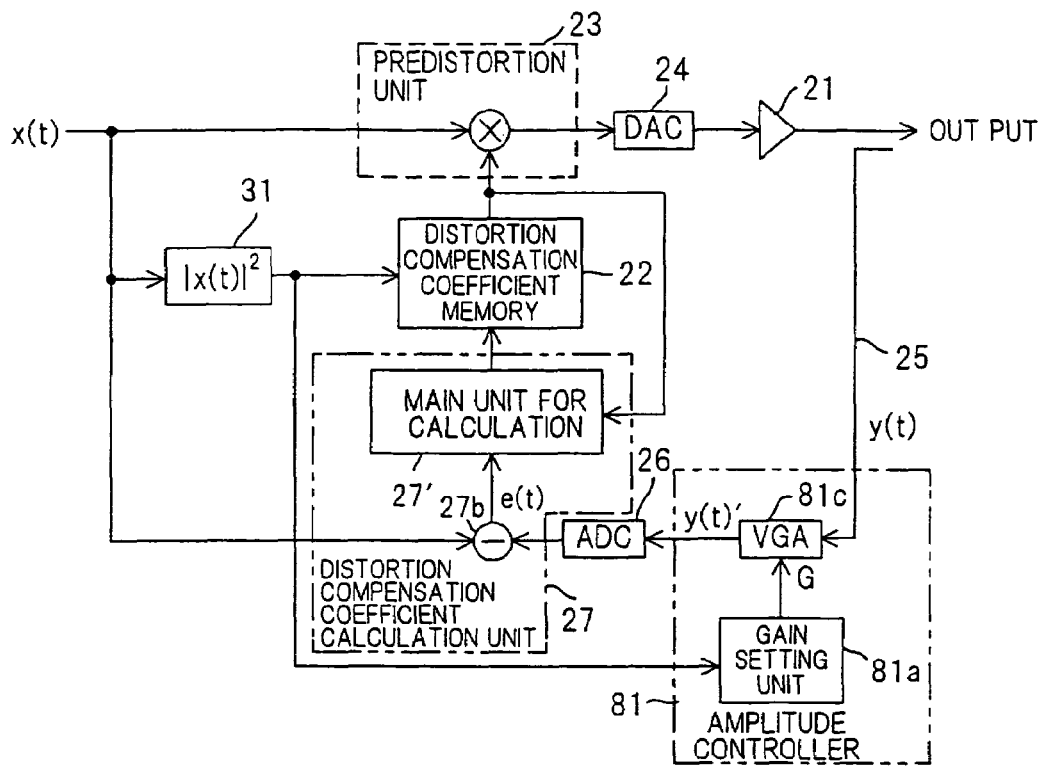
FIG. 32 illustrates a first modification of the first embodiment.
Figure 33:
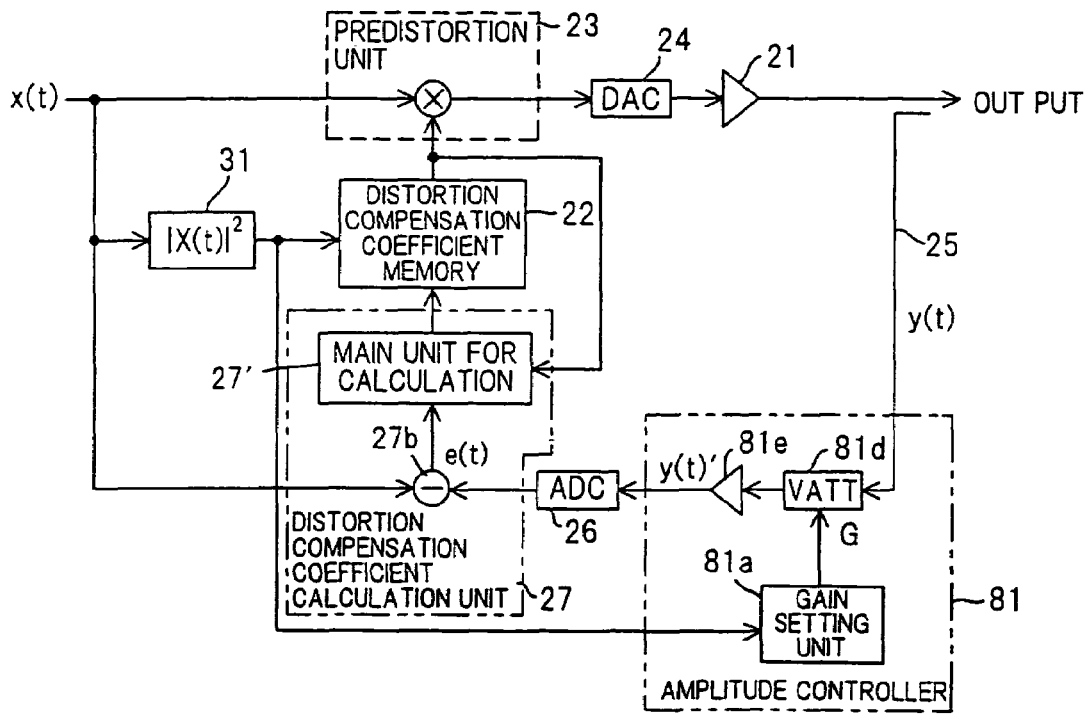
FIG. 33 illustrates a second modification of the first embodiment.

FIGS. 32 and 33 illustrate first and second modifications of the first embodiment of the present invention. These are examples in which the amplitude of the feedback signal y(t) is controlled in analog fashion before an analog-to-digital conversion is performed. In FIG. 32, the amplitude controller 81 is provided on the input side of the AD converter 26, controls the gain G of a variable-gain amplifier (VGA) 81c in accordance with the level of the transmit signal x(t), amplifies the feedback signal y(t) by the variable-gain amplifier (VGA) 81c and outputs the resultant signal. In FIG. 33, the amplitude controller 81 is provided on the input side of the AD converter 26, controls the amount of attenuation of a variable attenuator (VATT) 81d in accordance with the level of the transmit signal x(t), attenuates the feedback signal y(t) a predetermined amount by the variable attenuator 81d, then amplifies the output of the attenuator by a constant-gain amplifier 81e and outputs the resultant signal.

The modifications of FIGS. 32 and 33 can be applied to the embodiments below as well.

(b) Second Embodiment

FIG. 34 is a diagram showing the construction of a distortion compensating apparatus according to a second embodiment for controlling the amplitude of the feedback signal y(t). Components identical with those of the first embodiment of FIG. 30 are designated by like reference characters. This second embodiment differs from the first embodiment in that (1) a DAC-limit surpass detector 82 (for example, as illustrated in FIG. 34) is provided in the second embodiment for detecting whether the transmit signal after the distortion compensation thereof has surpassed a DA converter limit LML (see FIG. 2); (2) the amplitude controller 81 controls the amplitude of the feedback signal y(t) when the transmit signal after the distortion compensation thereof has surpassed the DA converter limit LML; and (3) a fixed gain G0 (>1) that is independent of the level of the transmit signal x(t) has been set in the gain setting unit 81a.

If the transmit signal (distortion-compensated signal) x'(t) after the distortion compensation thereof exceeds the DA converter limit $LM_L$, the amplitude and the phase of the feedback signal y(t) become distorted and the amplitude declines. Accordingly, the DAC-limit surpass detector 82 determines whether the transmit signal after the distortion compensation thereof has surpassed the DA converter limit $LM_L$. If such is the case, then the amplitude controller 81 multiplies the feedback signal y(t) by the fixed gain $G_0$(>1). As a result, the difference e(t) output from the subtractor 27b decreases, the distortion compensation coefficient $h_{n+1}(p)$ can be prevented from increasing, the distortion-compensated signal can be prevented from exceeding the DA converter limit LML and the occurrence of amplitude and phase distortion can be suppressed thereafter.

(c) Third Embodiment

Figure 35:
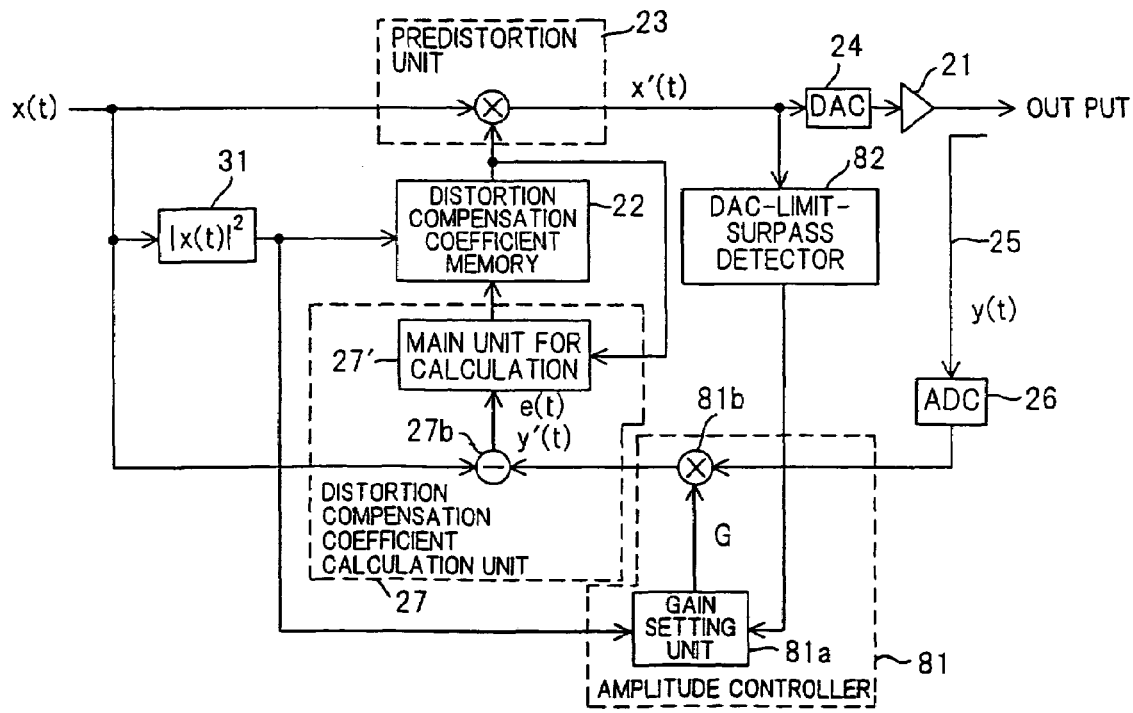
FIG. 35 illustrates a third embodiment of a distortion compensating apparatus having a function for controlling the amplitude of a feedback signal.

FIG. 35 is a diagram showing the construction of a distortion compensating apparatus according to a third embodiment for controlling the amplitude of the feedback signal y(t) based upon the amplitude or power of the transmit signal x(t). Components identical with those of the second embodiment are designated by like reference characters. This embodiment differs in that (1) the gain G is not fixed; (2) the gain setting unit 81a is provided with a gain table in which the characteristic of any one of FIGS. 31A to 31C has been sent; and (3) when the distortion-compensated signal x'(t) has exceeded the DA converter limit $LM_L$, the amplitude controller 81 controls the gain G based upon the level of the transmit signal x(t).

The DAC-limit surpass detector 82 determines whether the distortion-compensated signal x'(t) output from the predistortion unit 23 has surpassed the DA converter limit $LM_L$. If the distortion-compensated signal x'(t) is a value within the DA converter limit, the gain setting unit 81a of the amplitude controller 81 outputs a gain G of 1 and changes the amplitude of the feedback signal.

If the distortion-compensated signal x'(t) surpasses the DA converter limit, however, the DAC-limit surpass detector 82 instructs the amplitude controller 81 to change over the gain. In response, the gain setting unit 81a reads a gain G (>1) conforming to the level of the transmit signal x(t) out of a gain table (not shown) and inputs the gain to the multiplier 81b. The latter multiplies the feedback signal y(t) by the gain G (>1) and outputs the signal y(t)'[=G·y(t)]. As a result, the difference e(t) output from the subtractor 27b decreases, the distortion compensation coefficient $h_{n+1}(p)$ does not increase, the distortion-compensated signal no longer exceeds the DA converter limit and amplitude and phase distortion no longer occur.

In accordance with the third embodiment, gain is controlled based upon the level of the transmit signal x(t). As a result, control for preventing the occurrence of amplitude and phase distortion can be performed more finely in comparison with the second embodiment in which gain is fixed.

(d) Fourth Embodiment

Figure 36:
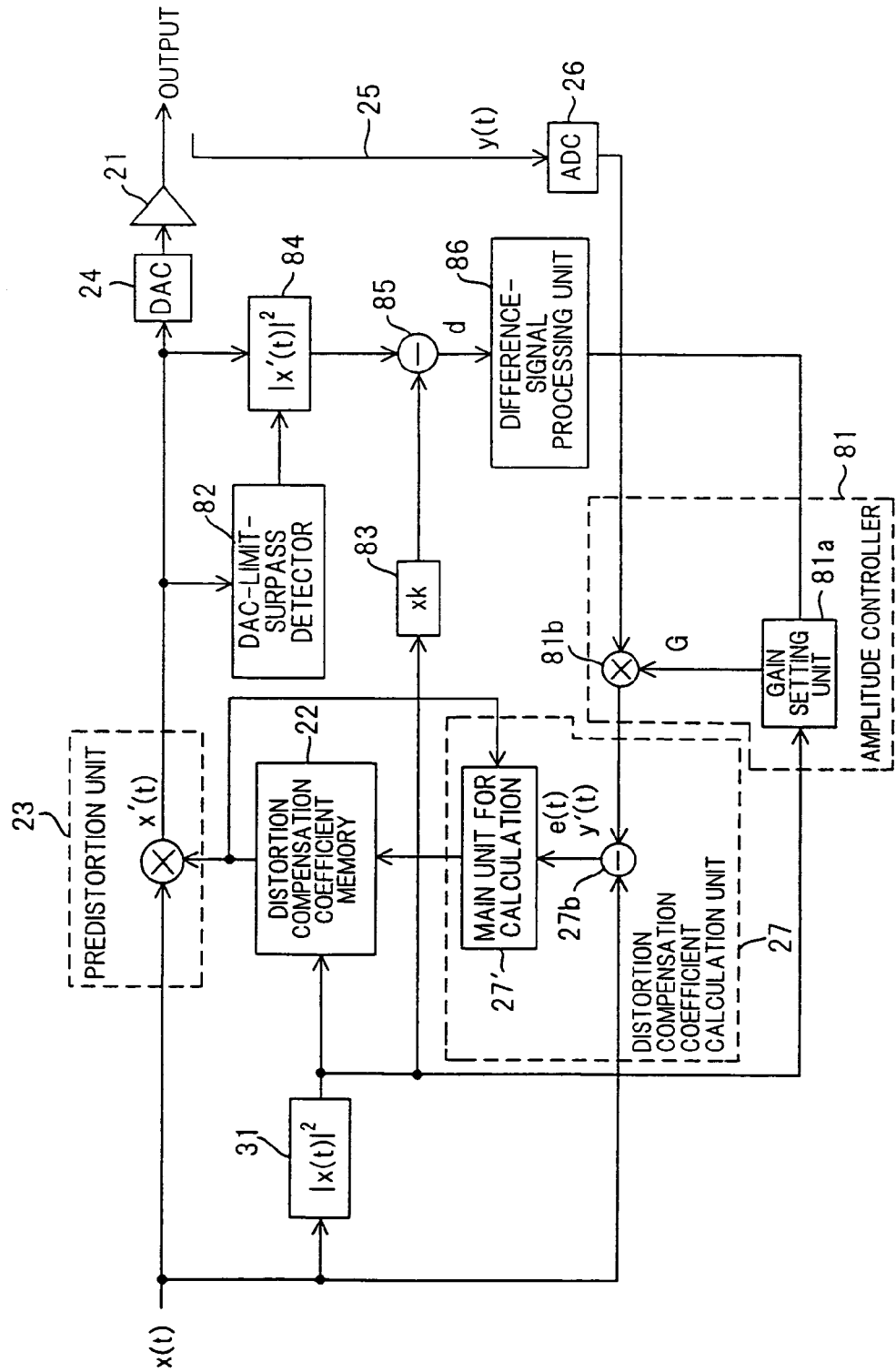
FIG. 36 illustrates a fourth embodiment of a distortion compensating apparatus having a function for controlling the amplitude of a feedback signal.

FIG. 36 is a diagram showing the construction of a distortion compensating apparatus according to a fourth embodiment for controlling the amplitude of the feedback signal y(t) based upon the amplitude or power of the transmit signal x(t). Components identical with those of the third embodiment are designated by like reference characters. This embodiment differs in that (1) a multiplier 83 is provided for multiplying the power $|x(t)|^2$ of the uncompensated transmit signal x(t) by a factor k (where k is a constant); (2) an arithmetic unit 84 is provided for calculating the power $|x'(t)|^2$ of the transmit signal x'(t); (3) an arithmetic unit 85 is provided for calculating the difference between $k·|x(t)|^2$, which is k times the transmission signal power, and the power $|x'(t)|^2$ of the distortion-compensated signal; (4) a difference-signal processing unit 86 is provided for instructing the amplitude controller 81 to start control of the amplitude of the feedback signal y(t) when the power $|x'(t)|^2$ of the distortion-compensated signal is greater than $k·|x(t)|^2$, which is k times the transmission signal power; and (5) the amplitude controller 81 controls the amplitude of the feedback signal y(t) in response to the command to start amplitude control. It should be noted that k is an average value of distortion compensation coefficients that have been stored in the distortion compensation coefficient memory 22 or a fixed value that conforms to the type of transmission power amplifier 21.

Figure 37:
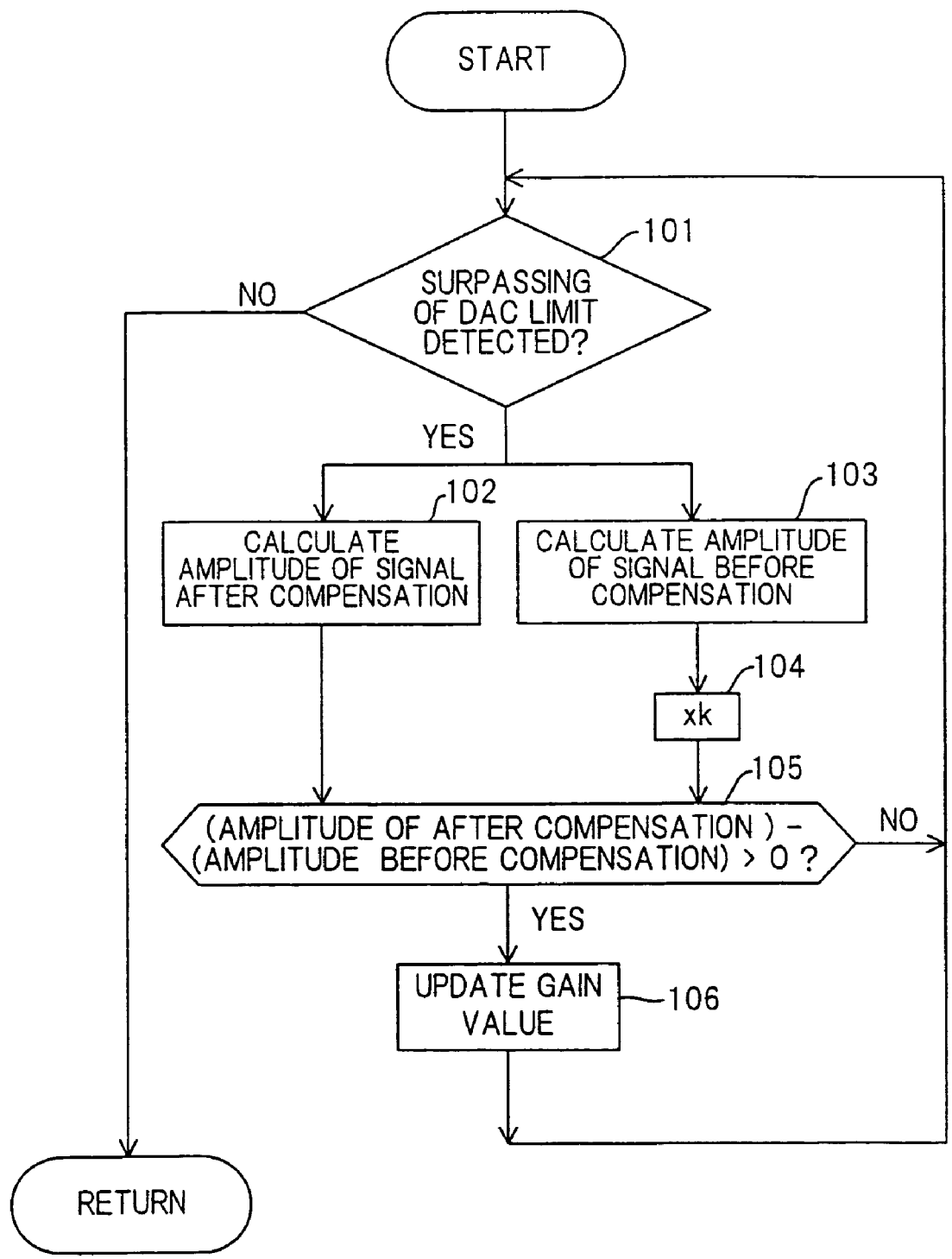
FIG. 37 illustrates the overall processing flow of the fourth embodiment.

FIG. 37 illustrates the overall processing flow of the distortion compensating apparatus according to the fourth embodiment. The DAC-limit surpass detector 82 checks to determine whether the distortion-compensated signal x'(t) output from the predistortion unit 23 has surpassed the DA converter limit $LM_L$ (step 101). If the distortion-compensated signal x'(t) falls within the DA converter limit, the gain setting unit 81a outputs gain G (=1) and therefore does not change the amplitude of the feedback signal.

If the distortion-compensated signal x'(t) surpasses the DA converter limit, however, the DAC-limit surpass detector 82 instructs the arithmetic unit 84 to calculate the power $|x'(t)|^2$ of the distortion-compensated signal. The arithmetic unit 84 responds by calculating the power $|x'(t)|^2$ of the distortion-compensated signal (step 102). Further, the power calculation unit 31 calculates the power $|x(t)|^2$ of the transmit signal and the multiplier 83 performs the calculation $k·|x(t)|^2$ (steps 103, 104). Next, the arithmetic unit 85 performs the calculation indicated by the following equation:

$$d=|x'(t)|^2-k·|x(t)|^2 \qquad (9)$$

and inputs the result d to the difference-signal processing unit 86. The latter determines whether $$d=|x'(t)|^2-k·|x(t)|^2>0 \qquad (10)$$

holds (step 105). If the decision rendered is "YES", then the difference-signal processing unit 86 instructs the amplitude controller 81 to update the gain. In response, the gain setting unit 81a of the amplitude controller 81 reads the gain G (>1), which conforms to the level of the transmit signal x(t), out of the gain table and inputs the gain to the multiplier 81b (step 106).

The multiplier 81b subsequently multiplies the feedback signal y(t) by the gain G (>1) and outputs the signal y(t)'[=G·y(t)]. As a result, the difference e(t) output from the subtractor 27b decreases, the distortion compensation coefficient $h_{n+1}$(p) does not increase, the distortion-compensated signal no longer exceeds the DA converter limit and amplitude and phase distortion no longer occur.

In the description rendered above, the power difference between the transmit signal and the distortion-compensated signal is calculated by the arithmetic unit 85 and gain is changed over based upon the power difference to control the amplitude of the feedback signal. However, the amplitude of the feedback signal can be controlled also by changing over the gain based upon an amplitude difference between the transmit signal and the distortion-compensated signal.

In accordance with the fourth embodiment, the gain G is controlled based upon the amplitude or power of the transmit signal x(t) only when the distortion-compensated signal x'(t) exceeds the DAC limit and the difference between the transmit signal x(t) and the distortion-compensated signal x'(t) increases. As a consequence, gain is controlled upon making sure that such control is truly necessary, and gain is not controlled when control is unnecessary. This makes possible finer control to suppress amplitude and phase distortion.

Figure 38:
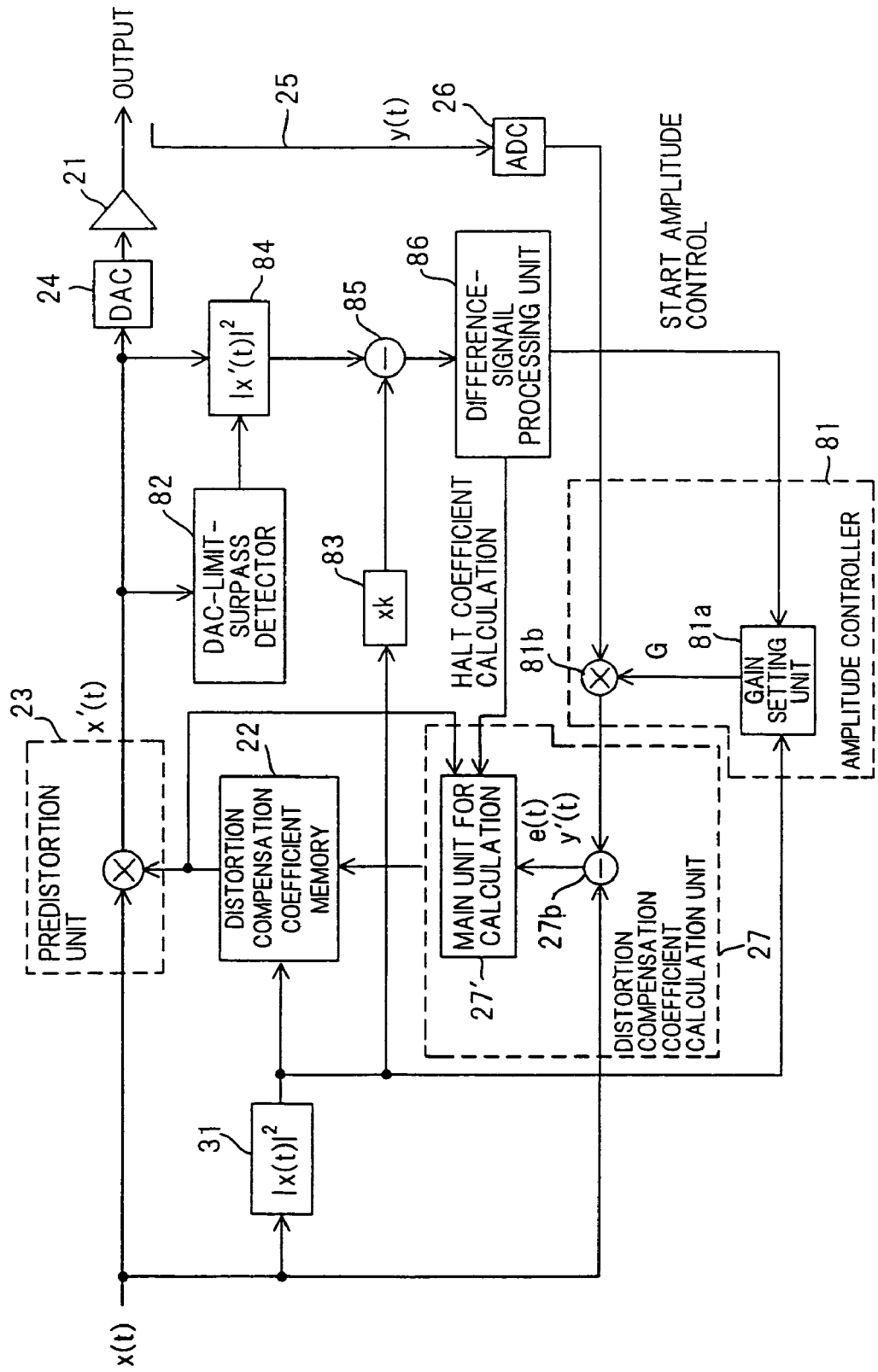
FIG. 38 illustrates a first modification of the fourth embodiment.

FIG. 38 is a first modification of the fourth embodiment, in which components identical with those of the fourth embodiment are designated by like reference characters. This modification differs from the fourth embodiment in that (1) when Equation (10) holds (i.e., d>0), the difference-signal processing unit 86 instructs the amplitude controller 81 to start control of the amplitude of the feedback signal, and instructs the distortion compensation coefficient calculation unit 27 to halt the calculation of the distortion compensation coefficient when the difference d exceeds a threshold value $D_{TH}$; and (2) in response to the command to halt calculation, the distortion compensation coefficient calculation unit 27 halts the calculation/updating of the distortion compensation coefficient. If d exceeds the threshold value $D_{TH}$, this means that the distortion compensating effect of the calculated distortion compensation coefficient is doubtful, i.e., that the distortion compensation coefficient has become less reliable. Accordingly, if the difference d has exceeded the threshold value $D_{TH}$, then, until the relation $d<D_{TH}$ is established, updating of the distortion compensation coefficient is not carried out and the distortion-compensated signal is thenceforth generated in accordance with the distortion compensation coefficient obtained thus far.

If d in Equation (9), namely the difference between k times the power $|x(t)|^2$ of the transmit signal and the power $|x'(t)|^2$ of the distortion-compensated signal, is equal to or less than zero ($d \leq 0$), then, even if the distortion-compensated signal x'(t) exceeds the DAC limit, the gain setting unit 81*a* inputs G=1 to the multiplier 81*b* and does not change the amplitude of the feedback signal y(t). However, if the distortion-compensated signal x'(t) exceeds the DAC limit and, moreover, d>0 holds, then the gain setting unit 81*a* reads the gain G (>1) conforming to the level of the transmit signal x(t) out of a gain table and inputs the gain to the multiplier 81*b*. The latter multiplies the feedback signal y(t) by the gain G (>1) and outputs the signal y(t)'[=G·y(t)]. As a result, the difference e(t) output from the subtractor 27*b* decreases, the distortion compensation coefficient $h_{n+1}(p)$ does not increase, the distortion-compensated signal no longer exceeds the DA converter limit and amplitude and phase distortion no longer occur.

Further, when the difference d increases further and the threshold value $D_{TH}$ is exceeded, the difference-signal processing unit 86 instructs the distortion compensation coefficient calculation unit 27 to halt the calculation of the distortion compensation coefficient. In response, the distortion compensation coefficient calculation unit 27 stops calculating the distortion compensation coefficient, as a result of which distortion compensation coefficient is not updated. Thus, when the difference d between k times the power of the transmit signal and the power of the distortion-compensated signal exceeds the threshold value $D_{TH}$, updating of the distortion compensation coefficient is halted. This makes it possible to prevent a distortion compensation coefficient from taking on a value of doubtful effectiveness.

Figure 39:
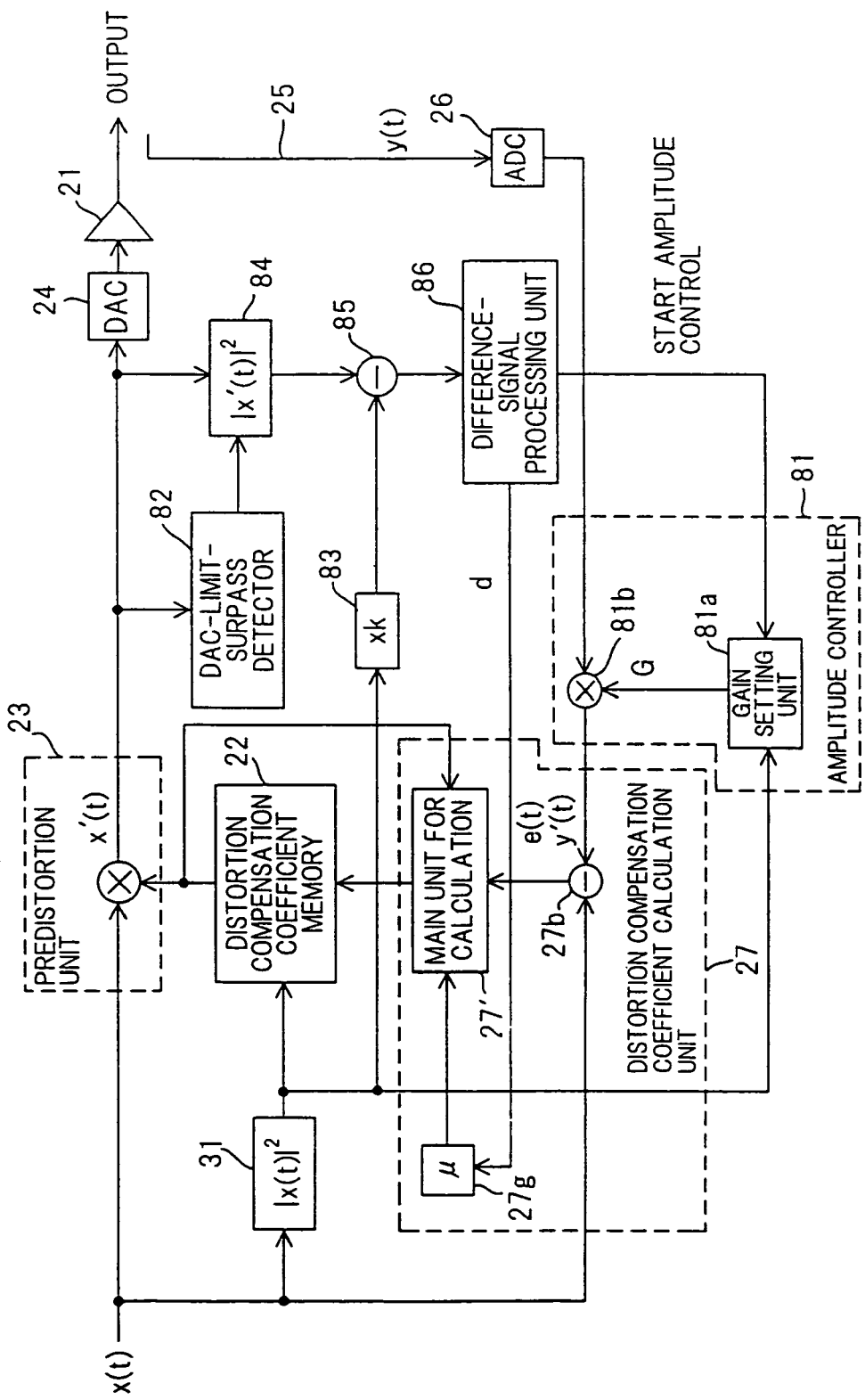
FIG. 39 illustrates a second modification of the fourth embodiment.

FIG. 39 is a second modification of the fourth embodiment, in which components identical with those of the fourth embodiment are designated by like reference characters. This modification differs from the fourth embodiment in that (1) a μ generator 27*g* is provided for generating a step-size parameter μ used in calculation of distortion compensation coefficients; (2) when Equation (10) holds (i.e., d>0), the difference-signal processing unit 86 instructs the amplitude controller 81 to start control of the amplitude of the feedback signal and inputs the difference d to the μ generator 27*g*; and (3) the μ generator 27*g* controls the step-size parameter μ based upon the value of the difference d.

Figure 40:
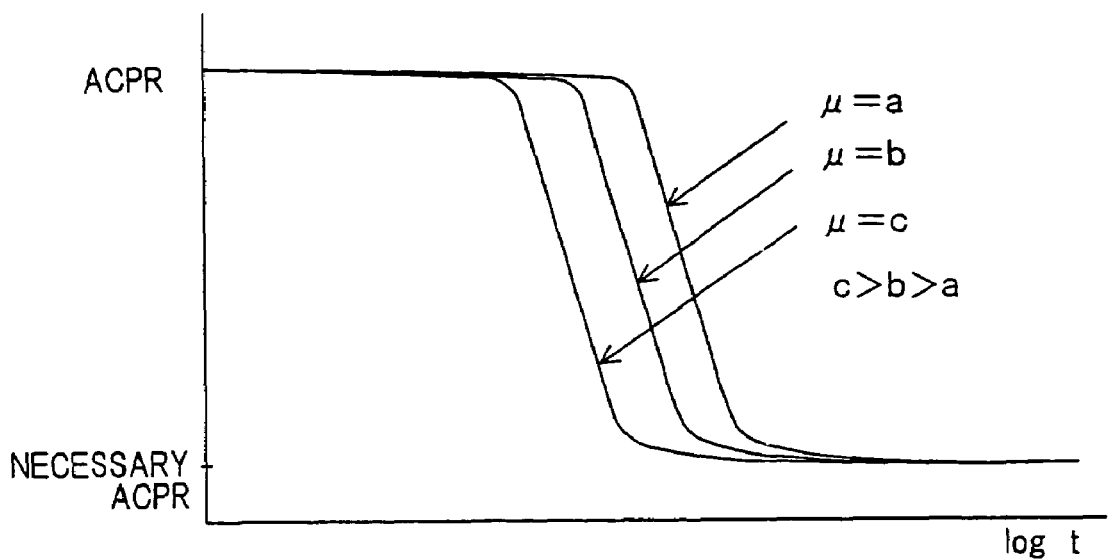
FIG. 40 is a diagram useful in describing the relationship between a μ value and convergence time.

As shown in FIG. 40, convergence time required for compensation of distortion to end so as to satisfy the necessary ACPR is dependent upon the magnitude of the step-size parameter μ; the larger the parameter μ, the shorter the convergence time. If μ is too large, however, stability in the vicinity of the target value declines. Accordingly, the value of μ is controlled based upon the size of the difference d and the convergence time is shortened while taking the stability of linearizer convergence into consideration. For example, if a situation arises in which the difference d exceeds a threshold value and divergence begins to develop in the distortion-compensation control loop, the value of μ is increased to prevent such divergence immediately. At this time the gain G may be made a constant or may be controlled dynamically (e.g., in accordance with a linear function) so as to accommodate the value of μ. Further, if the difference d decreases, μ is reduced accordingly to effect a return to a steady value. If this arrangement is adopted, the difference e(t) output from the subtractor 27*b* can be reduced in a short period of time and control can be carried out in such a manner that the amplitude of the distortion-compensated signal will not exceed a limit value.

(e) Fifth Embodiment

Figure 41:
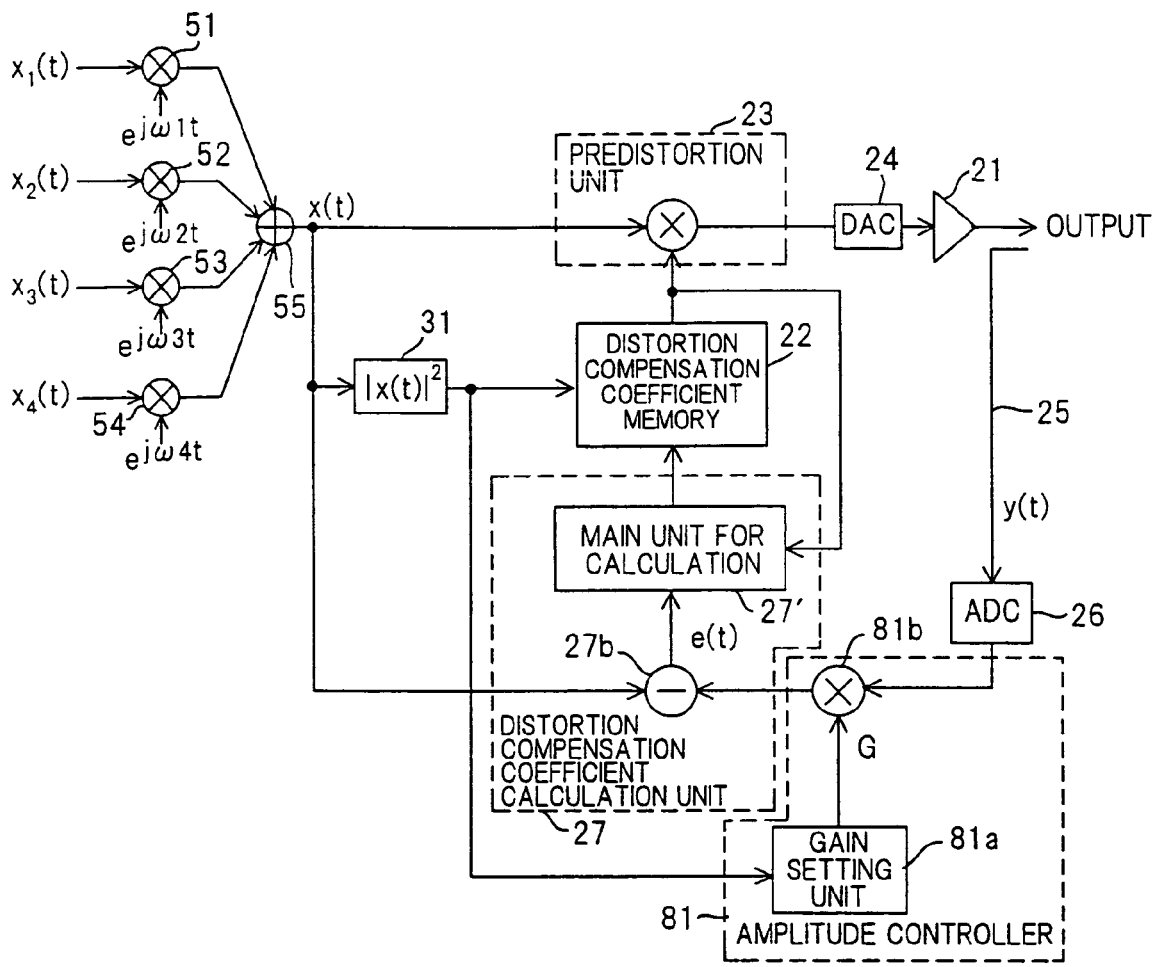
FIG. 41 is a diagram illustrating an example of an arrangement in which a multicarrier-type transmitter is equipped with a distortion compensating apparatus according to the present invention.
Figure 42:
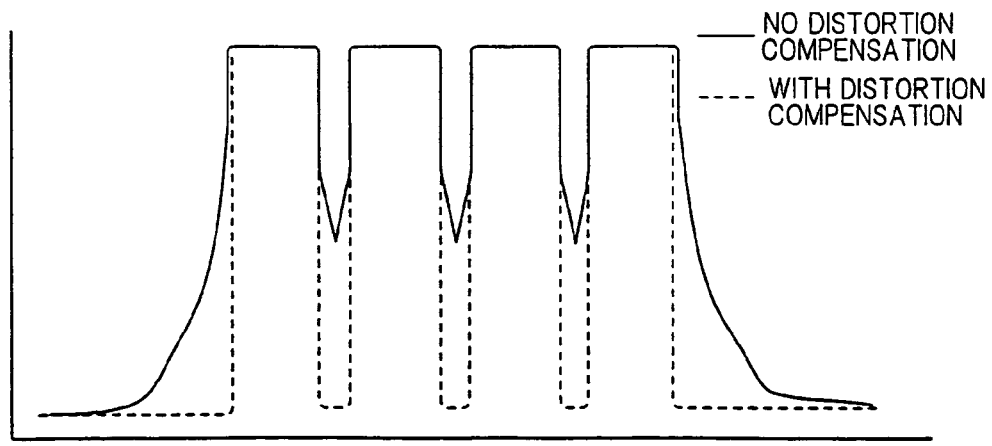
FIG. 42 is illustrates an example of the effects of a multicarrier linearizer.

The first to fourth embodiments are examples in which the invention is applied to a single-carrier transmitter. However, the invention can be applied to a multicarrier transmitter as well. FIG. 41 is a diagram showing the construction of a distortion compensating apparatus (multicarrier linearizer) for a case where a plurality of transmit signals are transmitted using a multicarrier signal. This illustrates an example of a case where four frequencies are multiplexed and transmitted. The digital transmit signals $x_1(t), x_2(t), x_3(t), x_4(t)$ are multiplied by $\exp(j\omega_1 t), \exp(j\omega_2 t), \exp(j\omega_3 t), \exp(j\omega_4 t)$ ($\omega_n = 2\pi f_n$), respectively, by the frequency shifters 51, 52, 53, 54, respectively, to effect a frequency shift to frequencies $f_1, f_2, f_3, f_4$, after which these frequencies are frequency-multiplexed by the combiner 55. The digital frequency-multiplexed signal corresponds to the transmit signal x(t) of the single-carrier distortion compensating apparatus (see FIG. 30) and subsequently undergoes distortion compensation processing similar to the processing executed in the case of the single carrier. FIG. 42 is a diagram useful in describing the effects of the multicarrier linearizer, in which the solid line indicates a spectrum characteristic without distortion compensation and the dashed line a spectrum characteristic with distortion compensation.

FIG. 41 is an example in which the distortion compensating apparatus of the first embodiment has been adapted so as to be capable of multicarrier transmission. However, the distortion compensating apparatus of the second to fourth embodiments also can be adapted for multicarrier transmission in a similar manner.

(f) Sixth Embodiment

The first to fifth embodiments are examples in which the invention is applied to a distortion compensating apparatus in which the transmit signal x(t) is multiplied by the distortion compensation coefficient $h_n(p)$ to generate the distortion-compensated signal x'(t) and the latter is input to the transmission power amplifier 21. However, the invention is applicable also to a distortion compensating apparatus in which a main signal (transmit signal) x(t) and a distortion component (error signal) E(t) appended to the transmit signal are DA-converted independently of each other and then combined and input to the transmission power amplifier.

Figure 43:
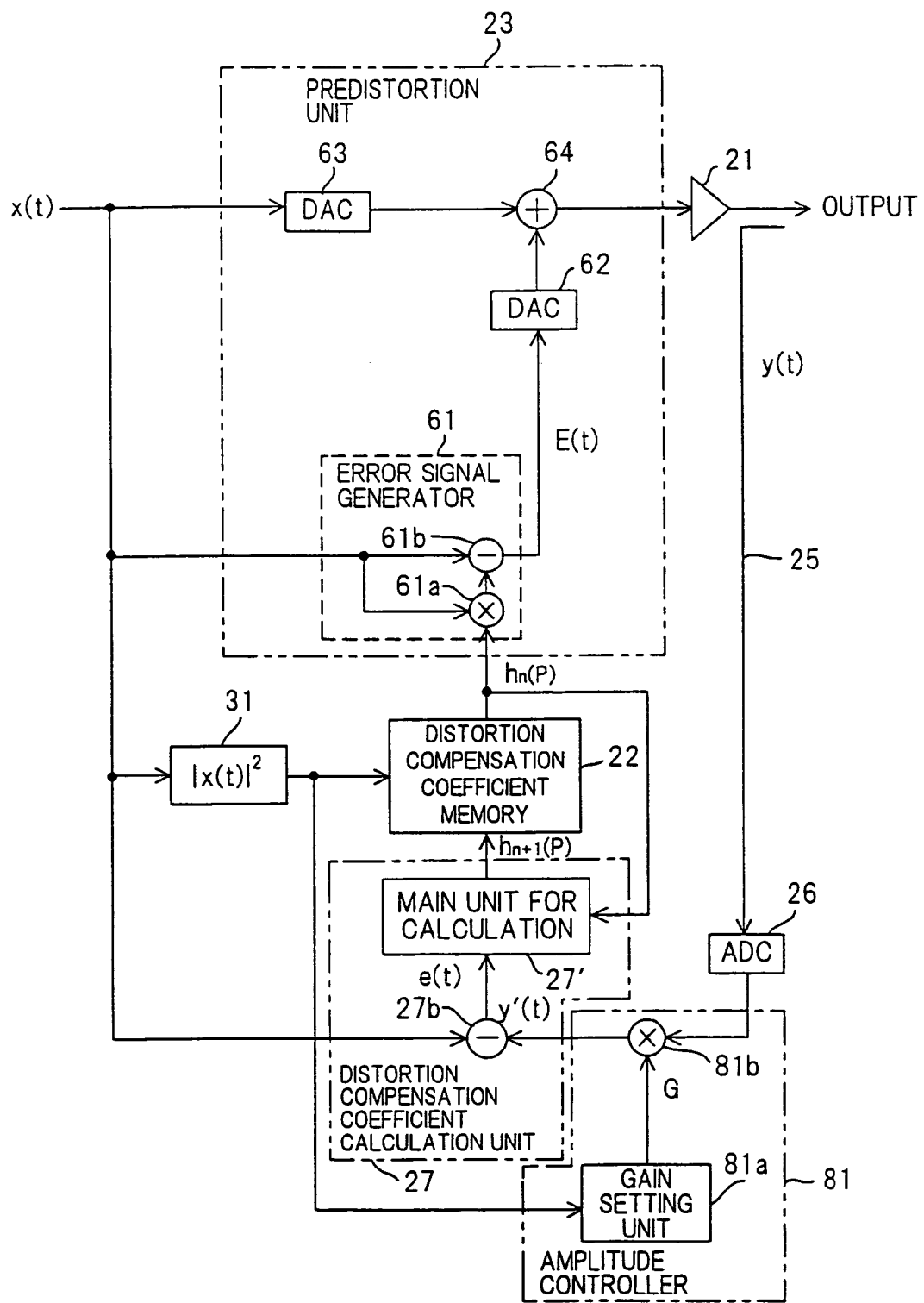
FIG. 43 illustrates a sixth embodiment of a distortion compensating apparatus having a function for controlling the amplitude of a feedback signal.

FIG. 43 illustrates a sixth embodiment of a distortion compensating apparatus for combining the analog transmit signal and the error signal E(t). Components in FIG. 43 identical with those of the embodiments thus far are designated by like reference characters.

As shown in FIG. 43, the apparatus includes the device (the transmission power amplifier) 21 which produces non-linear distortion of a function f(p); the distortion compensation coefficient memory 22 for storing the distortion compensation coefficient h(p), which corrects the distortion of the transmission power amplifier 21, in association with power p ($=|x(t)|^2$) of the transmit signal x(t); the predistortion unit 23 for outputting a distortion-compensated signal; the feedback loop 25 for feeding back the output signal y(t) of the transmission power amplifier 21; the AD converter 26 for converting the feedback signal y(t) to digital data; the distortion compensation coefficient calculation unit 27 for calculating the distortion compensation coefficient $h_{n+1}(p)$ based upon the transmit signal x(t) before the distortion compensation thereof and the feedback signal y(t); the transmit-signal power calculation unit 31 for generating read/write addresses of the distortion compensation coefficient memory 22; and the amplitude controller 81 for controlling the amplitude of the feedback signal y(t) based upon the amplitude or power of the transmit signal x(t) before the latter is compensated for distortion. The arrangement set forth above is similar to that of the first embodiment and the components operate in the same manner as those of the first embodiment.

The predistortion unit 23 includes the error signal generator 61, which has the multiplier 61a for reading the distortion compensation coefficient $h_n(p)$ that conforms to the power $|x(t)|^2$ of the transmit signal out of the memory 22 and multiplying the transmit signal x(t) by the distortion compensation coefficient $h_n(p)$, and the subtractor 61b for outputting the error signal E(t), which is the difference between the multiplier output signal $x(t)*h_n(p)$ and the transmit signal x(t); the DA converter 62 for converting the digital error signal E(t) to an analog signal; the DA converter 63 for converting the transmit signal (main signal) x(t) to an analog signal; and the combiner 64 for combining and outputting the analog transmit signal x(t) and the analog error signal E(t).

When the transmit signal x(t) is subjected to distortion compensation processing, the error signal generator 61 reads the distortion compensation coefficient $h_n(p)$ out of the memory 22 and outputs the error signal E(t), and the combiner 64 combines the analog main signal (the transmit signal) and the analog error signal, which have been DA-converted independently by the DA converters 62 and 63, respectively, and inputs the resultant signal to the transmission power amplifier. Since the amplitude of the error signal is small, the bit precision of the DA converter 62, which outputs only the error signal, can be reduced. Further, since the DA converter 63, which outputs only the transmit signal, does not require a large dynamic range, the bit precision of the DA converter 63 can be reduced.

When the transmit signal x(t) is below the linear/non-linear boundary signal $X_B$ (see FIG. 31), the gain G is made 1, the level of the feedback signal y(t) is not changed and the signal is input to the distortion compensation coefficient calculation unit 27 as is. The distortion compensation coefficient calculation unit 27 calculates the difference e(t) between the transmit signal x(t) and the feedback signal y(t), calculates the distortion compensation coefficient $h_{n+1}(p)$ based upon the difference e(t) and stores the result in the distortion compensation coefficient memory 22.

If the transmit signal x(t) exceeds the linear/non-linear boundary signal $X_B$, on the other hand, the amplitude controller 81 controls the gain G in accordance with the transmit signal x(t) so that the relation G>1 is established. Consequently, the transmit signal x(t) exceeds the linear/non-linear boundary signal $X_B$ and the feedback signal y(t) declines. Even though the difference e(t) increases, the amplitude controller 81 immediately outputs y(t)'=G·y(t) (G>1) to reduce the difference e(t) output from the subtractor 27b. As a result, the distortion compensation coefficient $h_{n+1}(p)$ can be prevented from increasing, the distortion-compensated signal can be prevented from exceeding the DA converter limit and the occurrence of amplitude and phase distortion can be suppressed.

Figure 44:
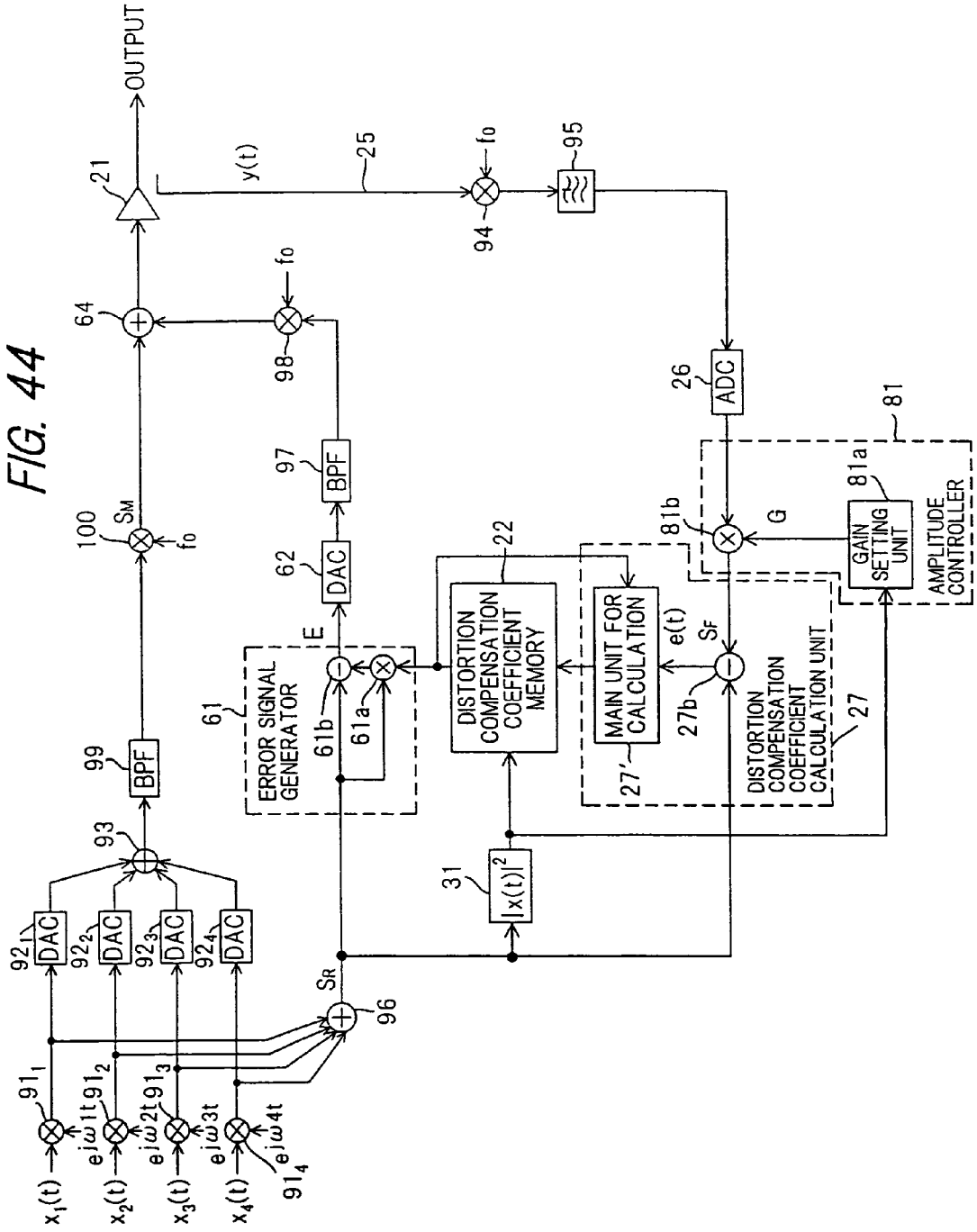
FIG. 44 is a diagram illustrating the construction of a multicarrier-type transmitter.
Figure 45:
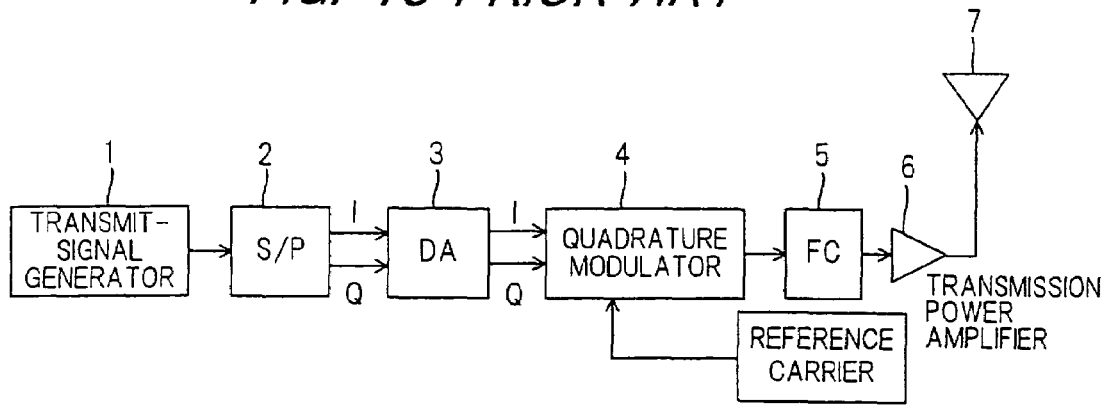
FIG. 45 is a block diagram showing a transmitter according to the prior art.
Figure 46A:
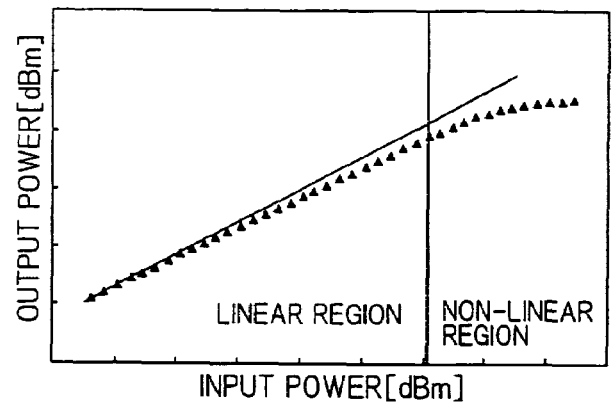
FIGS. 46A and 46B are diagrams useful in describing problems which arise owing to the non-linearity of a transmission power amplifier according to the prior art.
Figure 46B:
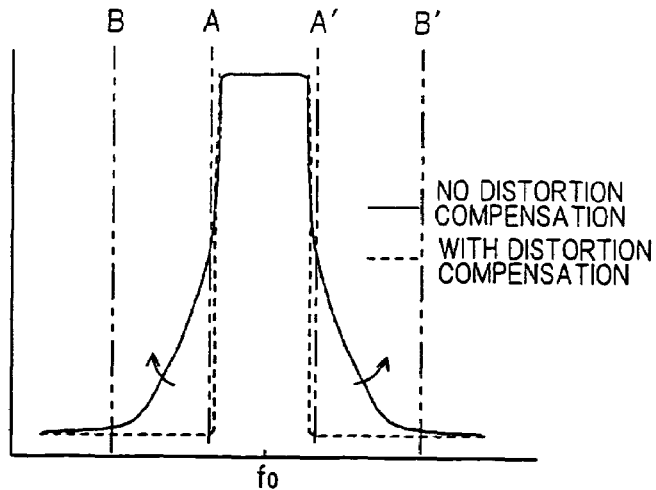
Figure 47:
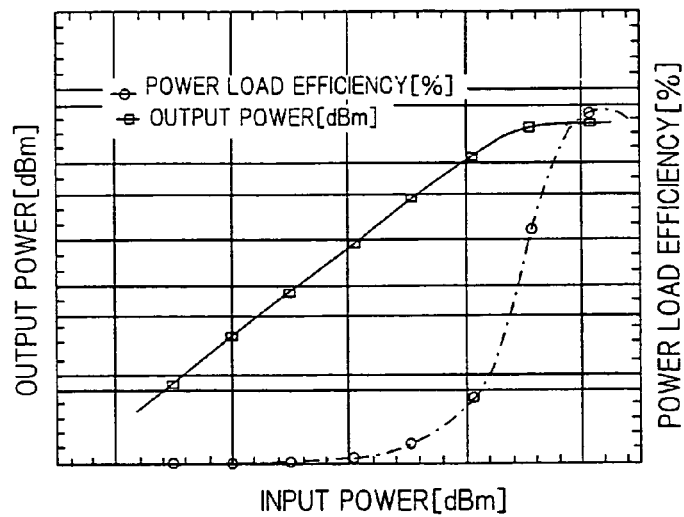
FIG. 47 is a diagram useful in describing the efficiency characteristic of a power amplifier according to the prior art.
Figure 48:
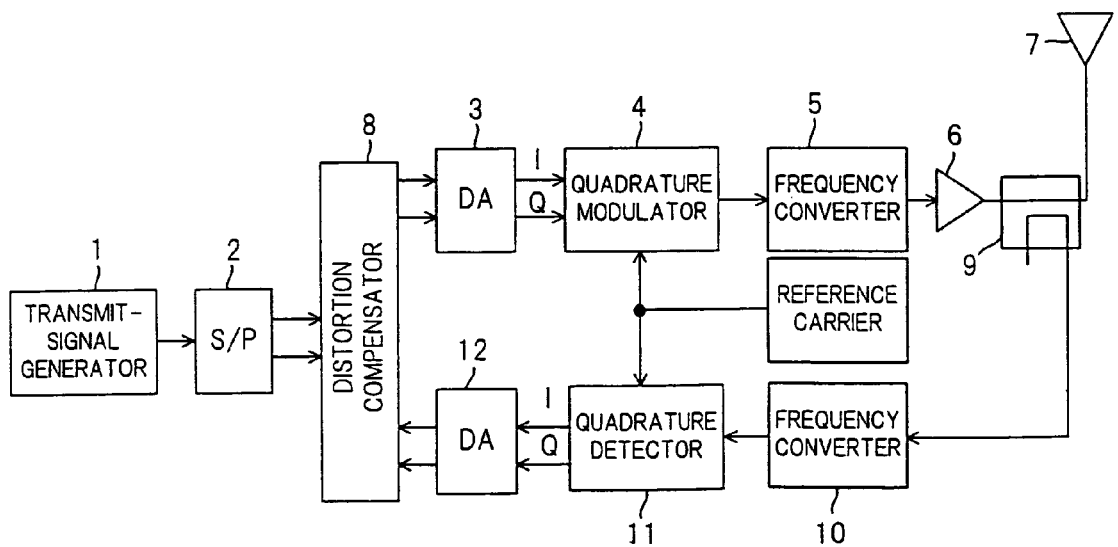
FIG. 48 is a block diagram of a transmitter equipped with a digital non-linear distortion compensating apparatus according to the prior art.
Figure 49:
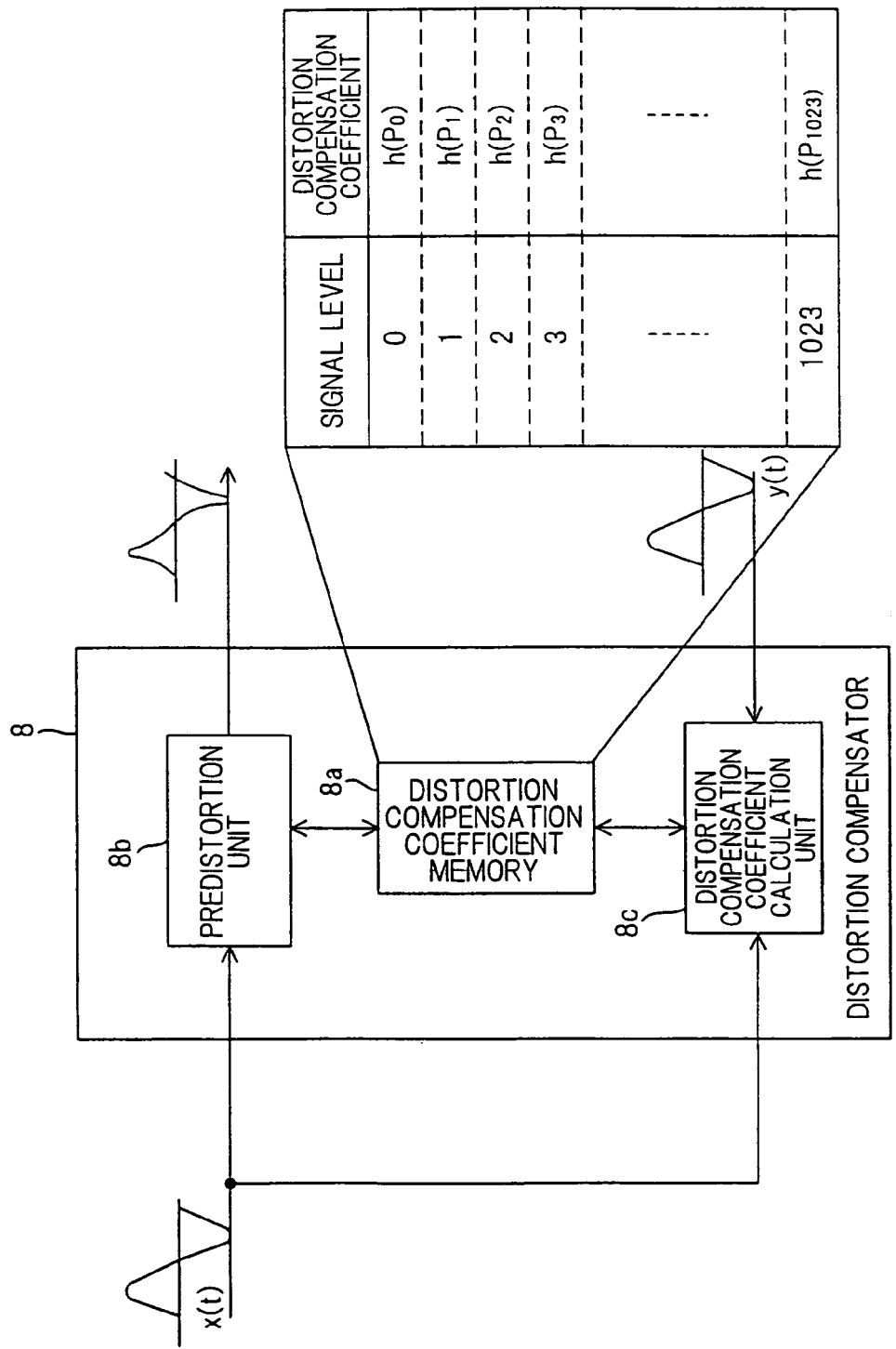
FIG. 49 is a diagram illustrating the function of a compensator according to the prior art.
Figure 50:
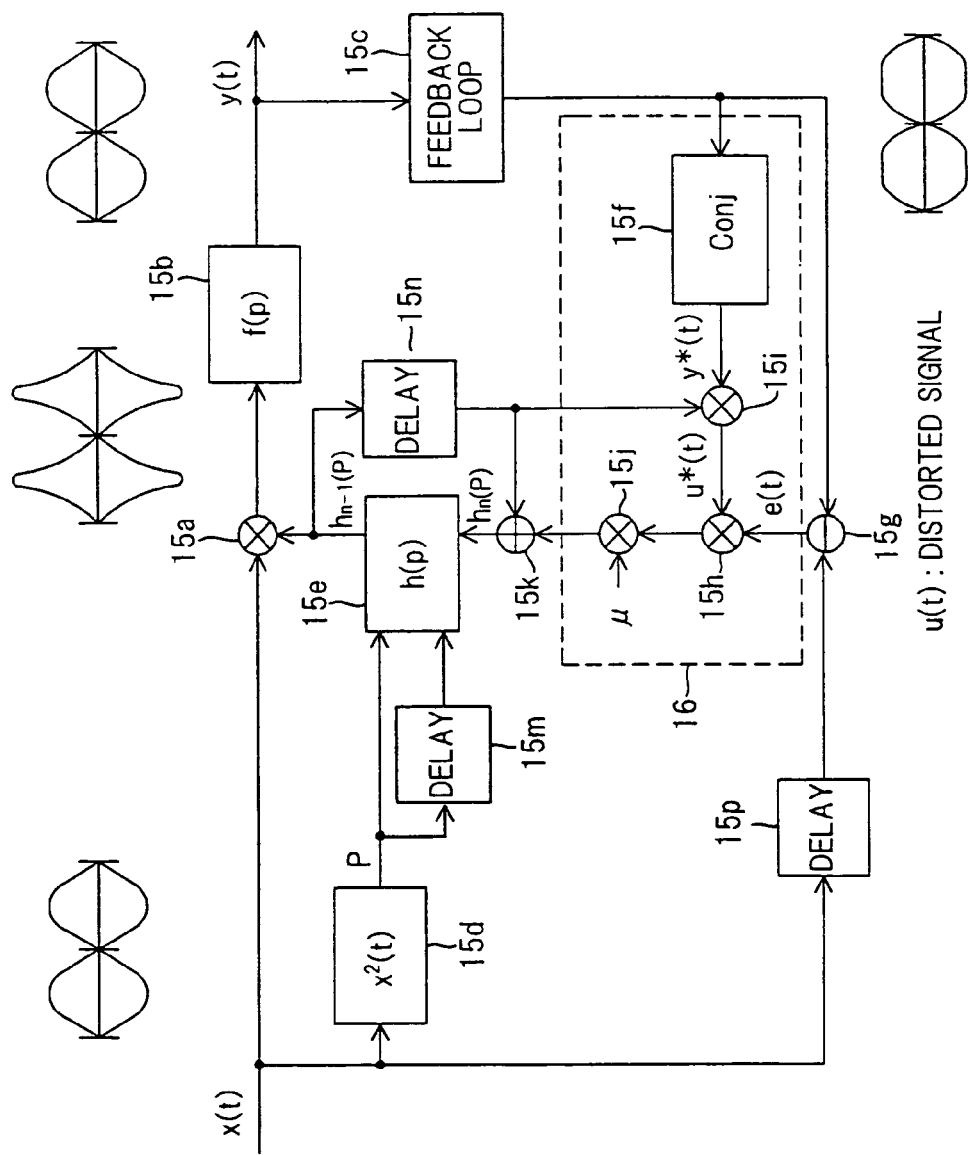
FIG. 50 is a diagram useful in describing distortion compensation processing according to an adaptive LMS algorithm.
Figure 51:
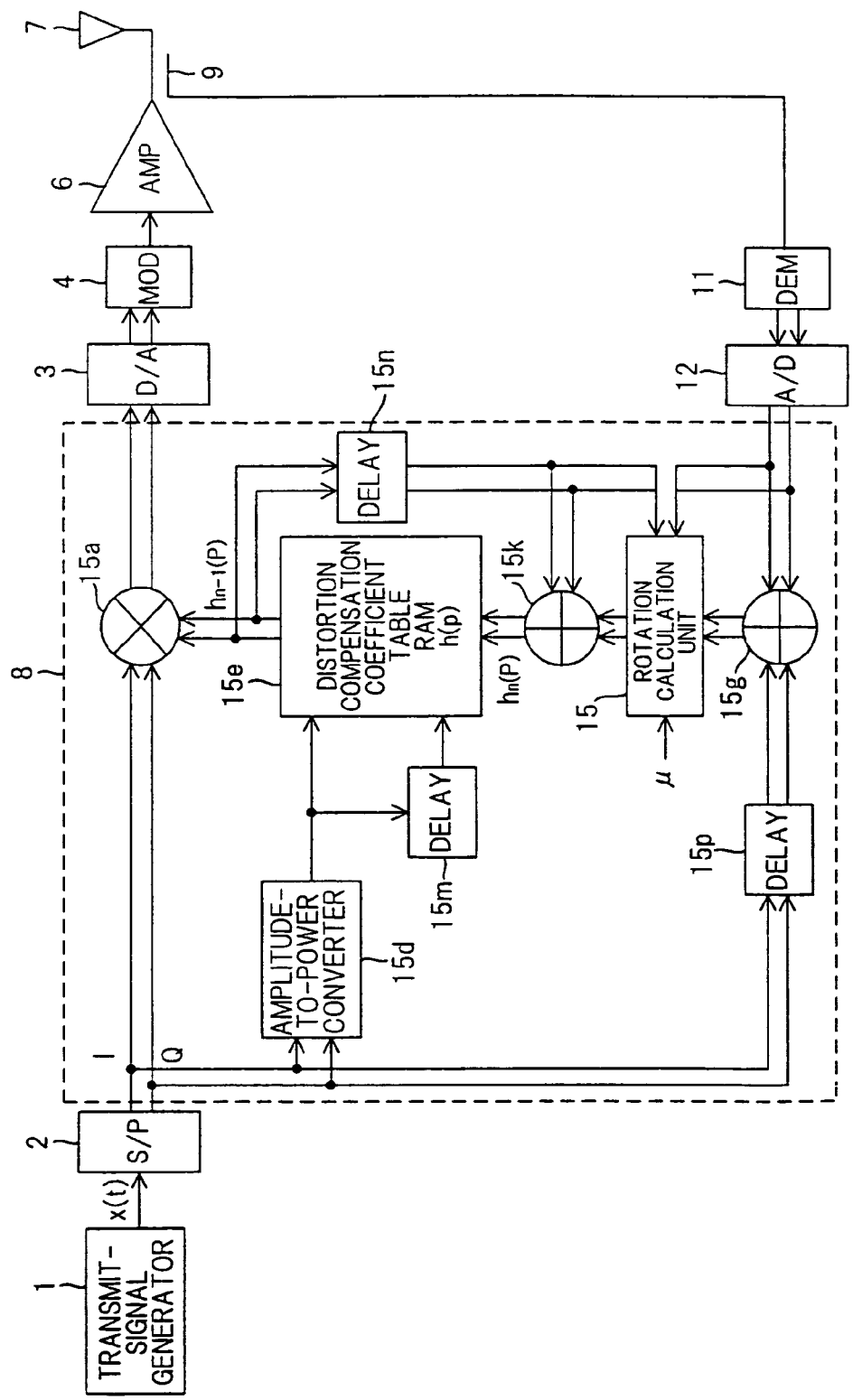
FIG. 51 is a diagram showing the overall construction of a transmitter expressed by $x(t)=I(t)+jQ(t)$ according to the prior art.
Figure 52:
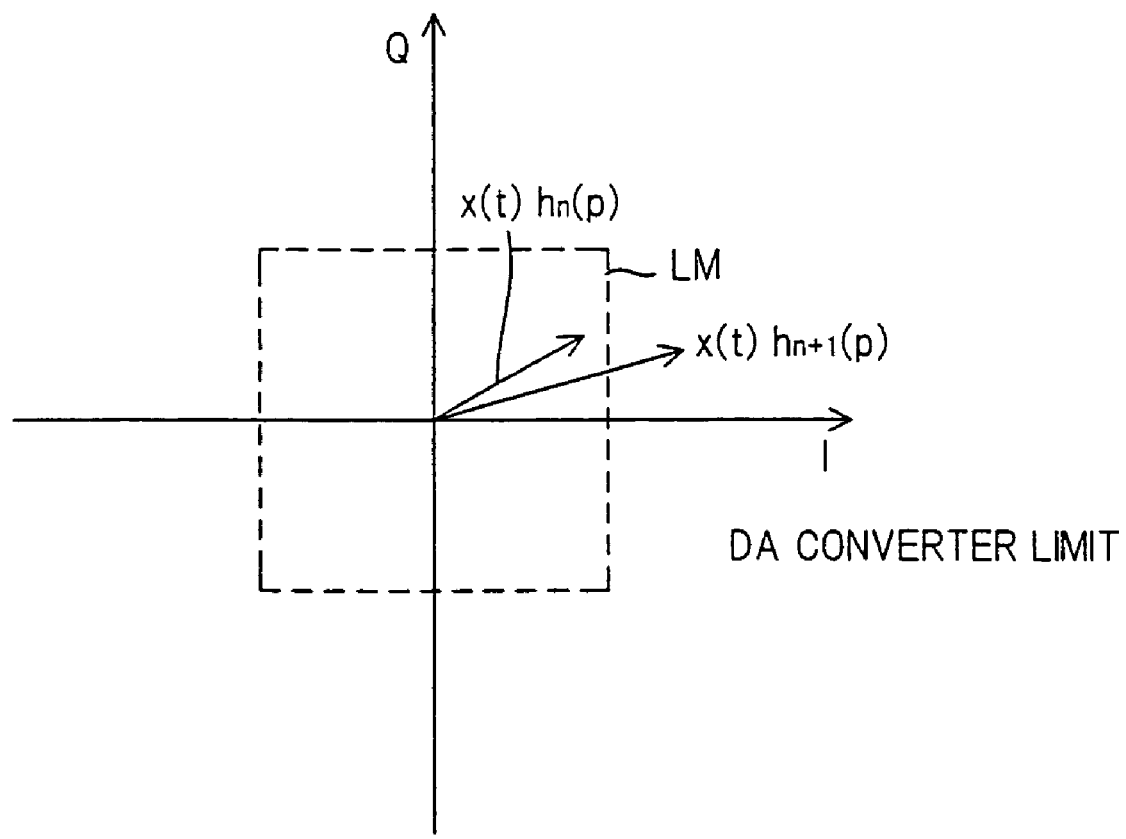
FIG. 52 is a diagram useful in describing the problems that arise with a distortion compensating apparatus according to the prior art.

The sixth embodiment is an example in which the invention is applied to a single-carrier transmitter. However, the invention can be applied to a multicarrier transmitter as well. FIG. 44 is a block diagram showing the construction of a transmitter in which a plurality of transmit signals are transmitted using a multicarrier signal. This is an example in which the multicarrier arrangement of FIG. 24 is applied to the sixth embodiment of FIG. 43. Components in FIG. 44 identical with those shown in FIG. 24 are designated by like reference characters.

As shown in FIG. 44, digital transmit signals $x_1(t) \sim x_4(t)$ are subjected to a digital frequency shift decided by the carrier spacing, and a first frequency multiplexer 96 multiplexes the frequency-shifted signals and outputs the frequency-multiplexed signal as a digital transmit signal $S_R$. The frequency-shifted signals are converted to analog signals by the DA converters $92_1 \sim 92_4$, and a second frequency multiplexer 93 multiplexes the analog signals and outputs the frequency-multiplexed signal as an analog transmit signal. The error signal generator 61 generates the error signal E based upon the frequency-multiplexed digital transmit signal $S_R$, the DA converter 62 converts the error signal to an analog signal, and the combiner 64 combines the output of the DA converter 62 and the analog transmit signal $S_M$ and inputs the resultant signal to the transmission power amplifier 21.

Though the present invention has been described on the basis of the foregoing embodiments, the present invention can be modified in various ways in accordance with the gist of the invention set forth in the claims and all such modifications are covered by the invention.

Thus, in accordance with the present invention, the size of a distortion compensation coefficient is corrected in advance, while the phase thereof is maintained as is, in such a manner that the input amplitude of a DA converter will not exceed the limit of the DA converter. This makes it possible to follow up phase even if amplitude is limited. As a result, the distortion characteristic will not be degraded beyond the distortion characteristic obtained when no distortion compensation is applied.

Further, in accordance with the present invention, the size of a distortion compensation coefficient is corrected in advance, while the phase thereof is maintained as is, in such a manner that the power of a transmit signal after the distortion compensation thereof will not exceed an allowed upper-limit power. This makes it possible to follow up phase even if amplitude is limited.

Further, in accordance with the present invention, processing for a comparison operation and for calculating corrected values can be dispensed with by putting corrected values of a distortion compensation coefficient into table form, thereby making it possible to simplify the arrangement and to obtain corrected values in simple fashion.

Further, in accordance with the present invention, the calculation necessary when calculating a corrected value can be simplified by a bit shift through approximation of a denominator by an exponent of 2.

Further, in accordance with the present invention, the correspondence between the amplitude (or power) of an uncompensated transmit signal and gain is put into the form of a table, a gain that conforms to an actual transmit-signal amplitude or power is found from the table and the amplitude of the feedback signal from a transmission power amplifier is controlled based upon the gain found. This makes it possible to arrange it so that the amplitude of the distortion-compensated signal will not exceed a limit value owing feed-forward of a signal. As a result, distortion compensation can be performed in stable fashion, without losing significant components (amplitude and phase) of the signal, through a simple arrangement.

Further, in accordance with the present invention, when the amplitude of a distortion-compensated signal (a transmit signal after the distortion compensation thereof) has exceeded a limit value, gain is enlarged so as to reduce the value of the difference between the transmit signal and a feedback signal from a transmission power amplifier, thereby controlling the amplitude of the feedback signal to prevent an increase in a distortion compensation coefficient. As a result, distortion compensation can be performed in stable fashion, without losing significant components (amplitude and phase) of the signal, through a simple arrangement. If gain G is fixed at a constant value greater than 1, amplitude can be controlled in a simple manner. Further, if gain G is put into table form beforehand and control is exercised in conformity with the transmit signal, control for preventing the occurrence of amplitude and phase distortion can be performed more finely.

Further, in accordance with the present invention, gain G is controlled based upon the level of the transmit signal only when the difference between the transmit signal before the distortion compensation thereof and the distortion-compensated signal has taken on a large value. As a consequence, gain is controlled upon making sure that such control is truly necessary, and gain is not controlled when control is unnecessary. This makes possible finer control to suppress amplitude and phase distortion.

Further, in accordance with the present invention, when the difference between the transmit signal before the distortion compensation thereof and the distortion-compensated signal has exceeded a threshold value, updating of the distortion compensation coefficient is halted. This makes it possible to prevent a distortion compensation coefficient from taking on a value of doubtful effectiveness.

Further, in accordance with the present invention, the size of a parameter $\mu$ for updating a distortion compensation coefficient is controlled based upon the difference between the transmit signal before the distortion compensation thereof and the distortion-compensated signal. This makes it possible to shorten convergence time while taking into consideration the stability of the convergence of a linearizer. For example, if a situation arises in which the above-mentioned difference exceeds a threshold value and divergence begins to develop in the distortion-compensation control loop, the value of p is increased to prevent such divergence immediately. If the difference decreases, $\mu$ is reduced accordingly to effect a return to a steady value. As a result, control can be carried out in such a manner that the amplitude of the distortion-compensated signal will not exceed a limit value while convergence and stability are maintained.

Further, the present invention is applicable to (1) a first distortion compensation method of multiplying a transmit signal by a distortion compensation coefficient and inputting the product to a distortion device, and (2) a second distortion compensation method of generating, as an error signal, the difference between a transmit signal and a signal obtained by multiplying a referential signal (the transmit signal) by a distortion compensation coefficient, DA-converting the error signal and a main signal (transmit signal) separately, combining the converted signals and inputting the result to a distortion device.

Further, in accordance with the present invention, the present invention is applicable to a single-carrier transmitter and to a multicarrier transmitter.

As many apparently widely different embodiments of the present invention can be made without departing from the spirit and scope thereof, it is to be understood that the invention is not limited to the specific embodiments thereof except as defined in the appended claims.

What is claimed is:

1. A distortion compensating apparatus for compensating for distortion of a transmission power amplifier, comprising:

a memory for storing distortion compensation coefficients, which are for compensating for distortion of the transmission power amplifier, in association with power p of a transmit signal;

a predistortion unit for subjecting the transmit signal to distortion compensation processing using a distortion compensation coefficient that conforms to the power p of the transmit signal;

a DA converter for converting a digital transmit signal, which has been subjected to distortion compensation processing, to an analog signal and inputting the analog signal to the transmission power amplifier;

a distortion compensation coefficient calculation unit for calculating a distortion compensation coefficient based upon the transmit signal before the distortion compensation thereof and a feedback signal fed back from an output side of the transmission power amplifier;

a comparison unit for judging whether the transmit signal, which is subjected to the distortion compensation processing using the distortion compensation coefficient calculated by said distortion compensation coefficient calculation unit, exceeds a dynamic range of said DA converter;

a distortion compensation coefficient correction unit for correcting the distortion compensation coefficient in such a manner that the transmit signal that has been subjected to the distortion compensation processing does not exceed the dynamic range of said DA converter; and a distortion compensation coefficient updating unit for updating a distortion compensation coefficient, which has been stored in said memory, by the distortion compensation coefficient that has been corrected.

2. A distortion compensating apparatus for compensating for distortion of a transmission power amplifier, comprising:

a memory for storing distortion compensation coefficients $h(p)$, which are for compensating for distortion of the transmission power amplifier, in association with power p of a transmit signal $x(t)$;

a predistortion unit for subjecting the transmit signal $x(t)$ to distortion compensation processing using a distortion compensation coefficient that conforms to the power p of the transmit signal $x(t)$;

a DA converter for converting a digital transmit signal, which has been subjected to distortion compensation processing, to an analog signal and inputting the analog signal to the transmission power amplifier;

a distortion compensation coefficient calculation unit for calculating a distortion compensation coefficient $h_{n+1}(p)$ based upon the transmit signal $x(t)$ before the distortion compensation thereof and a feedback signal fed back from an output side of the transmission power amplifier where $_{n+1}$ means a newly calculated value; and a table for storing, in advance in association with combinations of $|x(t)|^2$ and $h_{n+1}(p)$, distortion compensation coefficients $h_{n+1}(p)'$ obtained by correcting the distortion compensation coefficient $h_{n+1}(p)$ in such a manner that power Pa of a transmit signal, which has been obtained by subjecting the transmit signal $x(t)$ to distortion compensation processing using a distortion compensation coefficient $h_{n+1}(p)$ will become smaller than an upper-limit power Pmax, and for storing as is in advance, in association with combinations of $|x(t)|^2$ and $h_{n+1}(p)$ distortion compensation coefficients $h_{n+1}(p)$ when the power Pa of the transmit signal that has been subjected to distortion compensation is less than the upper-limit power Pmax; and a distortion compensation coefficient updating unit which, when a distortion compensation coefficient has been calculated by said distortion compensation coefficient calculation unit, is for obtaining, from said table, a distortion compensation coefficient $h_{n+1}(p)'$ that conforms to a combination of the calculated distortion compensation coefficient $h_{n+1}(p)$ and the power $|x(t)|^2$ of the transmit signal $x(t)$, and storing this distortion compensation coefficient $h_{n+1}(p)'$ in association with the power in said memory.

3. A distortion compensating apparatus for compensating for distortion of a transmission power amplifier, comprising:

a memory for storing distortion compensation coefficients $h_n(p)$ which are for compensating for distortion of the transmission power amplifier, in association with power where n means a current value of a transmit signal;

a predistortion unit for subjecting a transmit signal $x(t)$ to distortion compensation processing using a distortion compensation coefficient that conforms to the power p of the transmit signal;

a distortion compensation coefficient calculation unit for calculating a distortion compensation coefficient based upon the transmit signal $x(t)$ before the distortion compensation thereof and a feedback signal fed back from an output side of the transmission power amplifier;

a distortion compensation coefficient updating unit for updating a distortion compensation coefficient, which has been stored in said memory, by the distortion compensation coefficient that has been corrected; and a table for storing, in advance in association with combinations of $|x(t)|^2$ and $h_n(p)$ distortion compensation coefficients $h_n(p)'$ obtained by correcting the distortion compensation coefficient $h_n(p)$ in such a manner that power Pa of the transmit signal, which has been obtained by subjecting the transmit signal $x(t)$ to distortion compensation processing using a distortion compensation coefficient $h_n(p)$ will become smaller than an upper-limit power Pmax, and for storing as is in advance, in association with combinations of $|x(t)|^2$ and $h_n(p)$, distortion compensation coefficients $h_n(p)$ as $h_n(p)'$ when the power Pa of the transmit signal that has been subjected to distortion compensation is less than the upper-limit power Pmax;

wherein a distortion compensation coefficient $h_n(p)$ that conforms to power $|x(t)|^2$ of the transmit signal $x(t)$ is read out of said memory, a distortion compensation coefficient $h_n(p)'$ that conforms to a combination of $|x(t)|^2$ and $h_n(p)$ is read out of said table and this distortion compensation coefficient is input to said predistortion unit.

4. A distortion compensating apparatus for compensating for distortion of a transmission power amplifier, comprising:

a memory for storing distortion compensation coefficients, which are for compensating for distortion of the transmission power amplifier, in association with power p of a transmit signal;

an error signal generator for reading a distortion compensation coefficient that conforms to the power p of the transmit signal out of said memory, subjecting the transmit signal to distortion compensation processing using this distortion compensation coefficient and outputting an error signal, which is the difference between the transmit signal obtained by being subjected to distortion compensation processing and the transmit signal before the distortion compensation processing thereof;

a DA converter for converting the error signal to an analog signal and outputting the analog error signal;

a combiner for adding the output of said DA converter to an analog transmit signal and inputting the resultant signal to the transmission power amplifier;

a distortion compensation coefficient calculation unit for calculating a distortion compensation coefficient based upon the transmit signal before the distortion compensation thereof and an output signal of the transmission power amplifier;

a comparison unit for judging whether the transmit signal which is subjected to the distortion compensation processing using the distortion compensation coefficient calculated by said distortion compensation coefficient calculation unit, exceeds a dynamic range of said DA converter;

a distortion compensation coefficient correction unit for correcting a distortion compensation coefficient in such a manner that the error signal does not exceed the dynamic range of said DA converter; and a distortion compensation coefficient updating unit for updating a distortion compensation coefficient by storing the corrected distortion compensation coefficient in said memory in association with the power p of the transmit signal.

5. A distortion compensating apparatus for compensating for distortion of a transmission power amplifier, comprising:

a memory for storing distortion compensation coefficients $h(p)$, which are for compensating for distortion of the transmission power amplifier, in association with power p of a transmit signal;

an error signal generator for reading a distortion compensation coefficient that conforms to the power p of the transmit signal out of said memory, subjecting the transmit signal to distortion compensation processing using this distortion compensation coefficient and outputting an error signal, which is the difference between a further transmit signal obtained by being subjected to distortion compensation processing and the transmit signal before the distortion compensation processing thereof;

a DA converter for converting the error signal to an analog signal and outputting the analog error signal;

a combiner for adding the output of said DA converter to an analog transmit signal and inputting the resultant signal to the transmission power amplifier;

a distortion compensation coefficient calculation unit for calculating a distortion compensation coefficient based upon the transmit signal before the distortion compensation thereof and an output signal of the transmission power amplifier;

a table for storing, in association with a distortion compensation coefficient $h_{n+1}(p)$ that has been calculated by said distortion compensation coefficient unit where $_{n+1}$ means a newly calculated value, a distortion compensation coefficient $h_{n+1}(p)'$ that has been corrected beforehand in such a manner that the square of the distortion compensation coefficient $h_{n+1}(p)$ will become smaller than the square $|h(p)_{MAX}|^2$ of a set maximum distortion compensation coefficient; and a distortion compensation coefficient updating unit which, when a distortion compensation coefficient has been calculated by said distortion compensation coefficient calculation unit, is for obtaining, from said table, the corrected value $h_{n+1}(p)'$ of the distortion compensation coefficient that conforms to the calculated distortion compensation coefficient $h_{n+1}(p)$, and storing this distortion compensation coefficient $h_{n+1}(p)'$ in association with the power in said memory, thereby updating the distortion compensation coefficient.

6. A distortion compensating apparatus for compensating for distortion of a transmission power amplifier, comprising:
- a memory for storing distortion compensation coefficients $h_n(p)$, which are for compensating for distortion of the transmission power amplifier, in association with the power p of a transmit signal where n means a current value;
- an error signal generator for subjecting the transmit signal to distortion compensation processing using a distortion compensation coefficient that conforms to the power p of the transmit signal and outputting an error signal, which is the difference between the transmit signal obtained by being subjected to distortion compensation processing and the transmit signal before the distortion compensation processing thereof;
- a DA converter for converting the error signal to an analog signal and outputting the analog error signal;
- a combiner for adding the output of said DA converter to an analog transmit signal and inputting the resultant signal to the transmission power amplifier;
- a distortion compensation coefficient calculation unit for calculating a distortion compensation coefficient based upon the transmit signal before the distortion compensation thereof and an output signal of the transmission power amplifier;
- a distortion compensation coefficient updating unit for updating a distortion compensation coefficient by storing the calculated distortion compensation coefficient in said memory in association with the power p of the transmit signal; and
- a table for storing, in association with a distortion compensation coefficient $h_n(p)$ that has been calculated by said distortion compensation coefficient unit, a distortion compensation coefficient $h_{n+1}(p)'$ that has been corrected in such a manner that the square of the distortion compensation coefficient $h_n(p)$ will become smaller than the square $|h(p)_{MAX}|^2$ of a set maximum distortion compensation coefficient;
- wherein a distortion compensation coefficient $h_n(p)$ that conforms to power $|x(t)|^2$ of transmit signal $x(t)$ is read out of said memory, the distortion compensation coefficient $h_n(p)'$ that conforms to the distortion compensation coefficient $h_n(p)$ is read out of said table and this distortion compensation coefficient is input to said error signal generator.

7. A distortion compensating apparatus for compensating for distortion of a transmission power amplifier, comprising:
- a memory for storing distortion compensation coefficients, which are for compensating for distortion of the transmission power amplifier, in association with power p of a transmit signal;
- a predistortion unit for subjecting the transmit signal to distortion compensation processing using a distortion compensation coefficient that conforms to the power p of the transmit signal, and inputting the resultant signal to the transmission power amplifier;
- a distortion compensation coefficient calculation unit for calculating a distortion compensation coefficient based upon a difference between the transmit signal before the distortion compensation thereof and a feedback signal fed back from an output side of the transmission power amplifier, and updating a distortion compensation coefficient, which has been stored in said memory, by the distortion compensation coefficient that has been calculated; and
- an amplitude controller for controlling amplitude of the feedback signal by changing a gain based upon amplitude or the power p of the transmit signal before the distortion compensation thereof.

8. A distortion compensating apparatus for compensating for distortion of a transmission power amplifier, comprising:
- a predistortion unit for subjecting a transmit signal to distortion compensation processing using a distortion compensation coefficient that conforms to power p of the transmit signal;
- a DA converter for converting a digital transmit signal, which has been subjected to distortion compensation processing, to an analog signal and inputting the analog signal to the transmission power amplifier;
- a distortion compensation coefficient calculation unit for calculating a distortion compensation coefficient based upon the transmit signal before the distortion compensation thereof and a feedback signal fed back from an output side of the transmission power amplifier;
- a comparison unit for judging whether the transmit signal which is subjected to the distortion compensation processing using the distortion compensation coefficient calculated by said distortion compensation coefficient calculation unit, exceeds a dynamic range of said DA converter; and
- a distortion compensation coefficient correction unit for correcting the distortion compensation coefficient in such a manner that the transmit signal that has been subjected to the distortion compensation processing does not exceed the dynamic range of said DA converter.

9. A method for compensating for distortion of a transmission power amplifier, comprising steps of:
- subjecting a transmit signal to distortion compensation processing using a distortion compensation coefficient that conforms to power p of the transmit signal;
- converting a digital transmit signal, which has been subjected to distortion compensation processing, to an analog signal using a DA converter and inputting the analog signal to the transmission power amplifier;
- calculating a distortion compensation coefficient based upon the transmit signal before the distortion compensation thereof and a feedback signal fed back from an output side of the transmission power amplifier;
- judging whether the transmit signal which is subjected to the distortion compensation processing using the distortion compensation coefficient calculated by a distortion compensation coefficient calculation unit, exceeds a dynamic range of said DA converter; and
- correcting the distortion compensation coefficient, which has been calculated by said distortion compensation coefficient calculation unit, in such a manner that the transmit signal that has been subjected to the distortion compensation processing will not exceed a dynamic range of said DA converter.

* * * * *